(12) United States Patent
Mitsugi

(10) Patent No.: US 10,908,519 B2
(45) Date of Patent: Feb. 2, 2021

(54) ALIGNMENT MARK, IMPRINTING METHOD, MANUFACTURING METHOD OF SEMICONDUCTOR DEVICE, AND ALIGNMENT DEVICE

(71) Applicant: TOSHIBA MEMORY CORPORATION, Tokyo (JP)

(72) Inventor: Satoshi Mitsugi, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/567,184

(22) Filed: Sep. 11, 2019

(65) Prior Publication Data

US 2020/0301293 A1    Sep. 24, 2020

(30) Foreign Application Priority Data

Mar. 19, 2019    (JP) .................................. 2019-050733

(51) Int. Cl.
| | |
|---|---|
| *G03F 9/00* | (2006.01) |
| *G03F 7/00* | (2006.01) |
| *G03F 7/20* | (2006.01) |
| *H01L 23/544* | (2006.01) |
| *H01L 21/027* | (2006.01) |

(52) U.S. Cl.
CPC .......... *G03F 9/7042* (2013.01); *G03F 7/0002* (2013.01); *G03F 7/70141* (2013.01); *G03F 9/7015* (2013.01); *G03F 9/7088* (2013.01); *H01L 21/027* (2013.01); *H01L 23/544* (2013.01)

(58) Field of Classification Search
None
See application file for complete search history.

(56) References Cited

U.S. PATENT DOCUMENTS

| | | | |
|---|---|---|---|
| 9,123,649 B1 * | 9/2015 | Manassen | G03F 7/70633 |
| 2004/0233410 A1 * | 11/2004 | Shiraishi | G03F 7/70316 |
| | | | 355/67 |
| 2006/0126046 A1 * | 6/2006 | Hansen | G03F 7/705 |
| | | | 355/55 |

(Continued)

FOREIGN PATENT DOCUMENTS

| | | |
|---|---|---|
| JP | 2017-92294 A | 5/2017 |
| JP | 2018-18988 A | 2/2018 |

(Continued)

*Primary Examiner* — Angel Roman
(74) *Attorney, Agent, or Firm* — Finnegan, Henderson, Farabow, Garrett & Dunner, L.L.P.

(57) ABSTRACT

In an alignment mark of an embodiment, a first pattern includes a first portion and a second portion, a second pattern includes a third portion and a fourth portion, the first portion and the third portion partially overlap each other, the second portion and the fourth portion partially overlap each other, a pitch length of each structural periods of the first portion and the third portion are equal within 1.2 times, a pitch length of each structural periods of the second portion and the fourth portion are equal within 1.2 times, a duty ratio of each of the first and third portions is 1:1, and a duty ratio of the second portion is D:2, and D is an integer of two or more, the duty ratio being a ratio between a light-shielding portion and a light-transmitting portion.

20 Claims, 40 Drawing Sheets

(56) References Cited

U.S. PATENT DOCUMENTS

2011/0255064 A1* 10/2011 Conraux ............. G03F 7/70291
                                                          355/53

FOREIGN PATENT DOCUMENTS

| JP | 2018-98456 A  | 6/2018  |
| JP | 2018-152374 A | 9/2018  |
| JP | 2018-194738 A | 12/2018 |
| JP | 2018-206974 A | 12/2018 |

* cited by examiner

NO DEVIATION

DEVIATION 250 nm

DEVIATION 500 nm
(HALF PERIOD)

DEVIATION 1000 nm
(ONE PERIOD)

NO DEVIATION

DEVIATION 250 nm

DEVIATION 500 nm
(HALF PERIOD)

DEVIATION 1000 nm
(ONE PERIOD)

FIG.38

| DISPLACE AMOUNT (NORMALIZED WITH P) | OBSERVATION VALUE | | | CORRECTION VALUE (X∧) | SAME VALUE |
|---|---|---|---|---|---|
| | L | R | S | N∧ | |
| -1 | 1 | 1 | 0 | -2 | 1 |
| -1.0 TO -0.75 | 1 | 1 | 1 | -2 | |
| | 2 | 1 | 1 | -2 | |
| -0.75 | 2 | 1 | 2 | -2 | |
| | 2 | 1 | -2 | -1 | |
| -0.75 TO -0.5 | 2 | 1 | -1 | -1 | |
| | 2 | 0 | -1 | -1 | |
| -0.5 | 2 | 0 | 0 | -1 | |
| -0.5 TO 0.25 | 2 | 0 | 1 | -1 | |
| | 1 | 0 | 1 | -1 | |
| -0.25 | 1 | 0 | 2 | -1 | |
| | 1 | 0 | -2 | 0 | |
| -0.25 TO 0 | 1 | 0 | -1 | 0 | |
| | 0 | 0 | -1 | 0 | |
| 0 | 0 | 0 | 0 | 0 | |
| 0 TO +0.25 | 0 | 0 | 1 | 0 | |
| | 0 | 1 | 1 | 0 | |
| 0.25 | 0 | 1 | 2 | 0 | |
| | 0 | 1 | -2 | 1 | |
| +0.25 TO +0.5 | 0 | 1 | -1 | 1 | |
| | 0 | 2 | -1 | 1 | |
| 0.5 | 1 | 2 | 0 | 1 | |
| +0.5 TO +0.75 | 1 | 2 | 1 | 1 | |
| +0.75 | 1 | 2 | 2 | 1 | |
| | 1 | 2 | -2 | 2 | |
| +0.75 TO +1.0 | 1 | 2 | -1 | 2 | |
| | 1 | 1 | -1 | 2 | |
| 1 | 1 | 1 | 0 | 2 | -1 |

NO DEVIATION

DEVIATION 250 nm

DEVIATION 500 nm
(HALF PERIOD)

DEVIATION 1000 nm
(ONE PERIOD)

FIG.44

| DISPLACE AMOUNT (NORMALIZED WITH P) | OBSERVATION VALUE | | | | CORRECTION VALUE (xΛ) | | SAME DISPLACEMENT VALUE | |
|---|---|---|---|---|---|---|---|---|
| | LA | LB | RA | RB | $X_D$ | $N_\Lambda$ | | |
| -2 | 2 | 2 | 2 | 0 | 0 | -4 | 1 | |
| -2.0 TO -1.75 | 2 | 2 | 2 | 0 | 1 | -4 | +1.0 TO +1.25 | |
| -2.0 TO -1.75 | 2 | 1 | 2 | 0 | 1 | -4 | +1.0 TO +1.25 | (a) |
| -1.75 | 2 | 1 | 2 | 0 | 2 | -4 | 1.25 | |
| -1.75 | 2 | 1 | 2 | 0 | -2 | -3 | 1.25 | |
| -1.75 TO -1.5 | 2 | 1 | 2 | 0 | -1 | -3 | +1.25 TO +1.5 | |
| -1.75 TO -1.5 | 2 | 0 | 2 | 0 | -1 | -3 | +1.25 TO +1.5 | |
| -1.5 | 2 | 0 | 2 | 0 | 0 | -3 | 1.5 | ← (e) |
| -1.5 TO -1.25 | 2 | 0 | 2 | 0 | 1 | -3 | +1.5 TO +1.75 | |
| -1.5 TO -1.25 | 2 | 0 | 2 | 1 | 1 | -3 | +1.5 TO +1.75 | |
| -1.25 | 2 | 0 | 2 | 1 | 2 | -3 | 1.75 | |
| -1.25 | 2 | 0 | 2 | 1 | -2 | -2 | 1.75 | (b) |
| -1.25 TO -1.0 | 2 | 0 | 2 | 1 | -1 | -2 | +1.75 TO +2.0 | |
| -1.25 TO -1.0 | 2 | 0 | 2 | 2 | -1 | -2 | +1.75 TO +2.0 | |
| -1 | 2 | 0 | 2 | 2 | 0 | -2 | 2 | |
| -1.0 TO -0.75 | 2 | 0 | 2 | 2 | 1 | -2 | | |
| -1.0 TO -0.75 | 1 | 0 | 2 | 2 | 1 | -2 | | |
| -0.75 | 1 | 0 | 2 | 2 | 2 | -2 | | |
| -0.75 | 1 | 0 | 2 | 2 | -2 | -1 | | |
| -0.75 TO -0.5 | 1 | 0 | 2 | 2 | -1 | -1 | | |
| -0.75 TO -0.5 | 0 | 0 | 2 | 2 | -1 | -1 | | |
| -0.5 | 0 | 0 | 2 | 2 | 0 | -1 | | |
| -0.5 TO -0.25 | 0 | 0 | 2 | 2 | 1 | -1 | | |
| -0.5 TO -0.25 | 0 | 0 | 1 | 1 | 1 | -1 | | |
| -0.25 | 0 | 0 | 1 | 1 | 2 | -1 | | |
| -0.25 | 0 | 0 | 1 | 1 | -2 | 0 | | |
| -0.25 TO 0 | 0 | 0 | 1 | 1 | -1 | 0 | | |
| -0.25 TO 0 | 0 | 0 | 0 | 0 | -1 | 0 | | |
| 0 | 0 | 0 | 0 | 0 | 0 | 0 | | |
| 0 TO +0.25 | 0 | 0 | 0 | 0 | 1 | 0 | | |
| 0 TO +0.25 | 1 | 1 | 0 | 0 | 1 | 0 | | |
| 0.25 | 1 | 1 | 0 | 0 | 2 | 0 | | |
| 0.25 | 1 | 1 | 0 | 0 | -2 | 1 | | |
| +0.25 TO +0.5 | 1 | 1 | 0 | 0 | -1 | 1 | | |
| +0.25 TO +0.5 | 2 | 2 | 0 | 0 | -1 | 1 | | |
| 0.5 | 2 | 2 | 0 | 0 | 0 | 1 | | |
| +0.5 TO +0.75 | 2 | 2 | 0 | 0 | 1 | 1 | | |
| +0.5 TO +0.75 | 2 | 2 | 1 | 0 | 1 | 1 | | |
| 0.75 | 2 | 2 | 1 | 0 | 2 | 1 | | |
| 0.75 | 2 | 2 | 1 | 0 | -2 | 2 | | |
| +0.75 TO +1.0 | 2 | 2 | 1 | 0 | -1 | 2 | | |
| +0.75 TO +1.0 | 2 | 2 | 2 | 0 | -1 | 2 | | |
| 1 | 2 | 2 | 2 | 0 | 0 | 2 | -2 | |
| +1.0 TO +1.25 | 2 | 2 | 2 | 0 | 1 | 2 | -2.0 TO -1.75 | |
| +1.0 TO +1.25 | 2 | 1 | 2 | 0 | 1 | 2 | -2.0 TO -1.75 | |
| 1.25 | 2 | 1 | 2 | 0 | 2 | 2 | -1.75 | (c) |
| 1.25 | 2 | 1 | 2 | 0 | -2 | 3 | -1.75 | |
| +1.25 TO +1.5 | 2 | 1 | 2 | 0 | -1 | 3 | -1.75 TO -1.5 | |
| +1.25 TO +1.5 | 2 | 0 | 2 | 0 | -1 | 3 | -1.75 TO -1.5 | |
| 1.5 | 2 | 0 | 2 | 0 | 0 | 3 | -1.5 | |
| +1.5 TO +1.75 | 2 | 0 | 2 | 0 | 1 | 3 | -1.5 TO -1.25 | ← (f) |
| +1.5 TO +1.75 | 2 | 0 | 2 | 1 | 1 | 3 | -1.5 TO -1.25 | |
| 1.75 | 2 | 0 | 2 | 1 | 2 | 3 | -1.25 | |
| 1.75 | 2 | 0 | 2 | 1 | -2 | 4 | -1.25 | (d) |
| +1.75 TO +2.0 | 2 | 0 | 2 | 1 | -1 | 4 | -1.25 TO -1.0 | |
| +1.75 TO +2.0 | 2 | 0 | 2 | 2 | -1 | 4 | -1.25 TO -1.0 | |
| 2 | 2 | 0 | 2 | 2 | 0 | 4 | -1 | |

ALIGNMENT MARK, IMPRINTING METHOD, MANUFACTURING METHOD OF SEMICONDUCTOR DEVICE, AND ALIGNMENT DEVICE

CROSS-REFERENCE TO RELATED APPLICATIONS

This application is based upon and claims the benefit of priority from Japanese Patent Application No. 2019-050733, filed on Mar. 19, 2019; the entire contents of which are incorporated herein by reference.

FIELD

Embodiments described herein relate generally to an alignment mark, an imprinting method, a manufacturing method of a semiconductor device, and an alignment device.

BACKGROUND

Imprint processing, proximity exposure processing, near-field lithography processing, or the like is performed as a method of forming a fine pattern in a process of manufacturing a semiconductor device.

In such processing, an alignment process is performed between an original such as a template and a reticle and a workpiece. The alignment process is performed using, for example, alignment marks provided on the original and the workpiece, respectively.

When the alignment marks are provided on the original and the workpiece, the degree of freedom in arrangement of the alignment marks is low so that a useless area may be generated in a section where the alignment mark is arranged.

BRIEF DESCRIPTION OF THE DRAWINGS

FIGS. 19, 19A and 19B are schematic views illustrating an example of configurations of X marks of a template and a wafer constituting an overlay mark according to a first modification of the second embodiment;

FIG. 38 is a view illustrating an example of the table used in the position detection process by the table reference method using the X mark according to Example 2;

FIG. 44 is a view illustrating an example of a table used in the position detection process by a table reference method using the X mark according to Example 4.

DETAILED DESCRIPTION

An alignment mark of an embodiment is an alignment mark including a set of a first pattern and a second pattern, one of the patterns being provided on a surface of an original, the other of the patterns being provided on a surface of the substrate, the fine pattern being to be transferred to the surface of the substrate. When XY coordinates common to the surface of the original and the surface of the substrate are set and the original and the substrate face each other such that directions of the first pattern and the second pattern coincide with each other with respect to the XY coordinates, the first pattern includes a first portion and a second portion, the second pattern includes a third portion and a fourth portion, the first portion and the third portion partially overlap each other, the second portion and the fourth portion partially overlap each other, a pitch length of each structural periods of the first portion and the third portion are equal within 1.2 times, a pitch length of each structural periods of the second portion and the fourth portion are equal within 1.2 times, a duty ratio of each of the first portion and the third portion is 1:1, and a duty ratio of the second portion is D:2, and D is an integer of two or more, the duty ration being a ratio between a light-shielding portion and a light-transmitting portion.

Hereinafter, the present invention will be described in detail with reference to the drawings. Incidentally, the present invention is not limited to the following embodiments. In addition, constituent elements in the following embodiments include those that can be easily assumed by those skilled in the art or those that are substantially the same.

First Embodiment

An embodiment will be described with reference to FIGS. 1 to 17. An alignment mark of the embodiment is used, for example, during imprint processing. First, an imprinting apparatus that performs the imprint processing and an operation of the imprinting apparatus will be described hereinafter.

(Configuration Example of Imprinting Apparatus)

Figure 1:
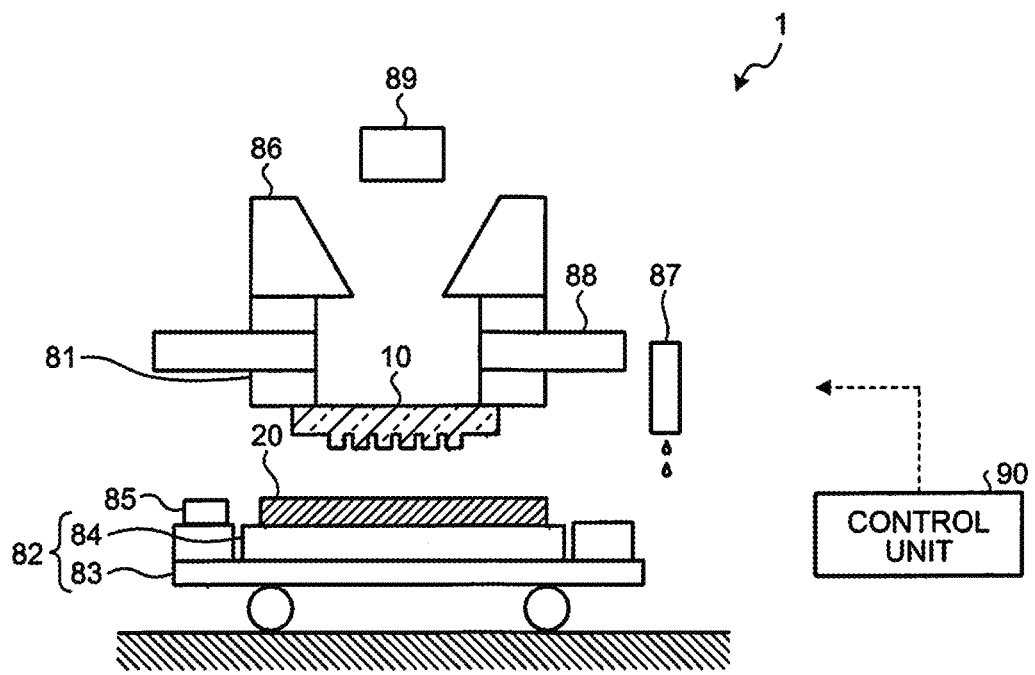
FIG. 1 is a diagram illustrating a configuration example of an imprinting apparatus according to a first embodiment.

FIG. 1 is a diagram illustrating a configuration example of an imprinting apparatus 1 according to the embodiment. As illustrated in FIG. 1, the imprinting apparatus 1 includes a template stage 81, a placement table 82, a reference mark 85, an alignment sensor 86, a liquid dripping device 87, a stage base 88, a light source 89, and a control unit 90. In the imprinting apparatus 1, a template 10 to transfer a fine pattern onto a resist as a transfer film on a wafer 20 is installed.

The placement table 82 includes a wafer chuck 84 and a main body 83. The wafer chuck 84 fixes the wafer 20 served as a semiconductor substrate, at a predetermined position on the main body 83. The reference mark 85 is provided on the placement table 82. The reference mark 85 is used for alignment at the time of loading the wafer 20 onto the placement table 82.

The wafer 20 is placed on the placement table 82 and the placement table 82 moves within a plane (within a horizontal plane) parallel to the placed wafer 20. The placement table 82 moves the wafer 20 to a lower side of the liquid dripping device 87 when dripping a resist onto the wafer 20, and moves the wafer 20 to a lower side of the template 10 when performing transfer processing to the wafer 20.

The stage base 88 supports the template 10 by the template stage 81, and moves in the up-down direction (vertical direction) to press a fine pattern of the template 10 against the resist on the wafer 20.

An alignment sensor 86 is provided on the stage base 88. The alignment sensor 86 is a sensor that detects a position of the wafer 20 and detects a position of the template 10 based on alignment marks provided on the wafer 20 and the template 10.

The liquid dripping device 87 served as a dispenser is a device that drips a resist onto the wafer 20 by an inkjet method. An inkjet head provided in the liquid dripping device 87 has a plurality of fine holes ejecting droplets of the resist, and drips the resist droplets onto the wafer 20. Incidentally, the imprinting apparatus 1 of the embodiment is configured to drip the resist, but the resist may be applied to the entire surface of the wafer 20 by a spin coating method.

The light source 89 is, for example, a device that emits ultraviolet rays, and is provided above the stage base 88. The light source 89 emits light from an upper side of the template 10 in a state where the template 10 is pressed against the resist.

The control unit 90 controls the template stage 81, the placement table 82, the reference mark 85, the alignment sensor 86, the liquid dripping device 87, the stage base 88, and the light source 89.

Incidentally, an alignment device of a first embodiment is constituted by at least a template stage 81, a placement table 82, an alignment sensor 86, and a control unit 90.

(Process of Manufacturing Semiconductor Device)

Next, an example of a process of manufacturing a semiconductor device including imprint processing using the imprinting apparatus 1 of the embodiment will be described with reference to FIGS. 2A to 2E. FIGS. 2A to 2E are flow diagrams illustrating an example of a procedure of the process of manufacturing the semiconductor device according to the embodiment.

Figure 2A:
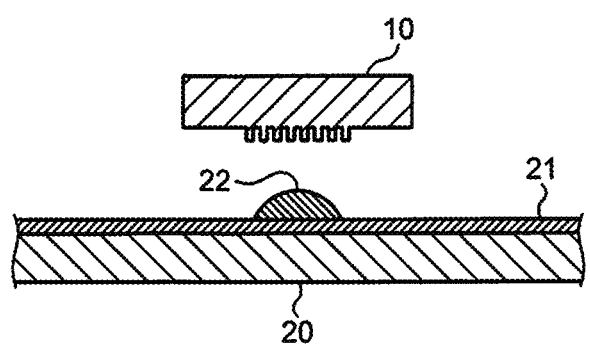
FIGS. 2A to 2E are flow diagrams illustrating an example of a procedure of the process of manufacturing the semiconductor device according to the first embodiment.

As illustrated in FIG. 2A, a to-be-processed film 21 is formed on the wafer 20, and a resist 22 is dripped onto the to-be-processed film 21.

Specifically, the wafer 20 on which the to-be-processed film 21 has been formed is placed on the placement table 82. Then, the placement table 82 is moved to the lower side of the liquid dripping device 87, and droplets of the resist 22 are dripped from the liquid dripping device 87 onto the to-be-processed film 21. As described above, the resist 22 may be applied to the entire surface of the wafer 20 by the spin coating method. Thereafter, the placement table 82 is moved to the lower side of the template 10.

Figure 2B:
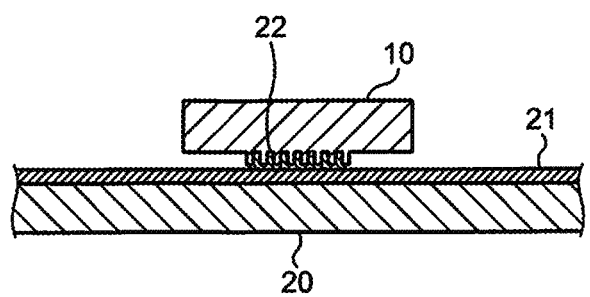

Next, as illustrated in FIG. 2B, the template stage 81 is moved downward, and the fine pattern of the template 10 is pressed against the resist 22 while performing alignment with the alignment sensor 86. Subsequently, the resist 22 is irradiated with light from the light source 89 of the imprinting apparatus 1 in a state where the template 10 is pressed, thereby curing the resist 22.

Here, the alignment using the alignment sensor 86 is performed in two stages of, for example, a rough inspection, which is rough alignment, and precise alignment. On the template 10 and the wafer 20, rough inspection marks used for the rough inspection and alignment marks used for precise alignment are formed in advance. The rough inspection is performed nondestructively at high speed by adjusting positions of the rough inspection marks between the template 10 and the wafer 20 before the template 10 and the wafer 20 come into contact with each other. However, the positional accuracy is rough since a distance between the rough inspection marks is far. The precise alignment is performed using the alignment marks of the template 10 and the wafer 20 in a state where the template 10 and the wafer 20 are brought into proximity or in contact with each other.

Figure 2C:
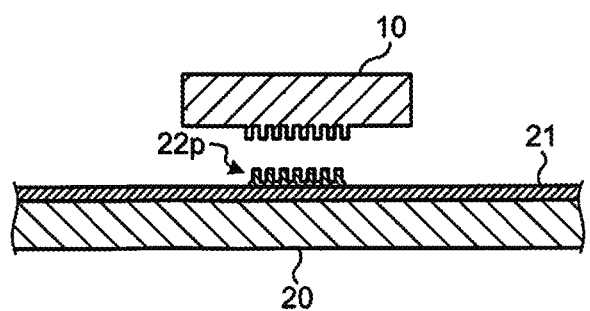

Next, as illustrated in FIG. 2C, the template 10 is released. As a result, a resist pattern 22p to which the fine pattern has been transferred is formed on the to-be-processed film 21 of the wafer 20.

Figure 2D:
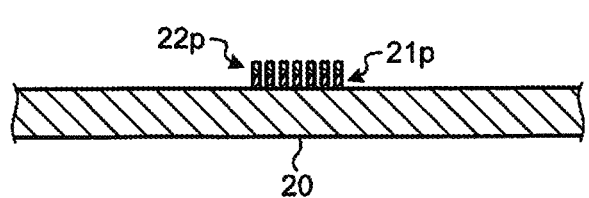

Next, as illustrated in FIG. 2D, the to-be-processed film 21 is processed using the resist pattern 22p to which the fine pattern has been transferred as a mask. As a result, a to-be-processed film pattern 21p is formed.

Figure 2E:
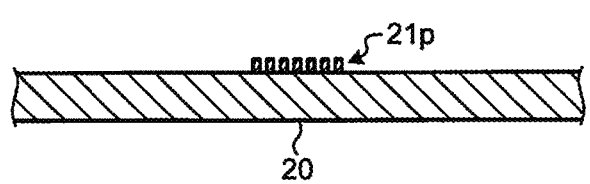

Next, as illustrated in FIG. 2E, the resist pattern 22p is peeled off by ashing or the like to obtain the to-be-processed film pattern 21p formed on the wafer 20.

Thereafter, the above-described process is repeated to form a plurality of to-be-processed film patterns on the wafer 20, whereby a semiconductor device is manufactured.

(Configuration Examples of Template and Wafer)

Next, configuration examples of the template 10 and the wafer 20 of the embodiment will be described with reference to FIGS. 3A, 3B, and 4.

Figure 3A:
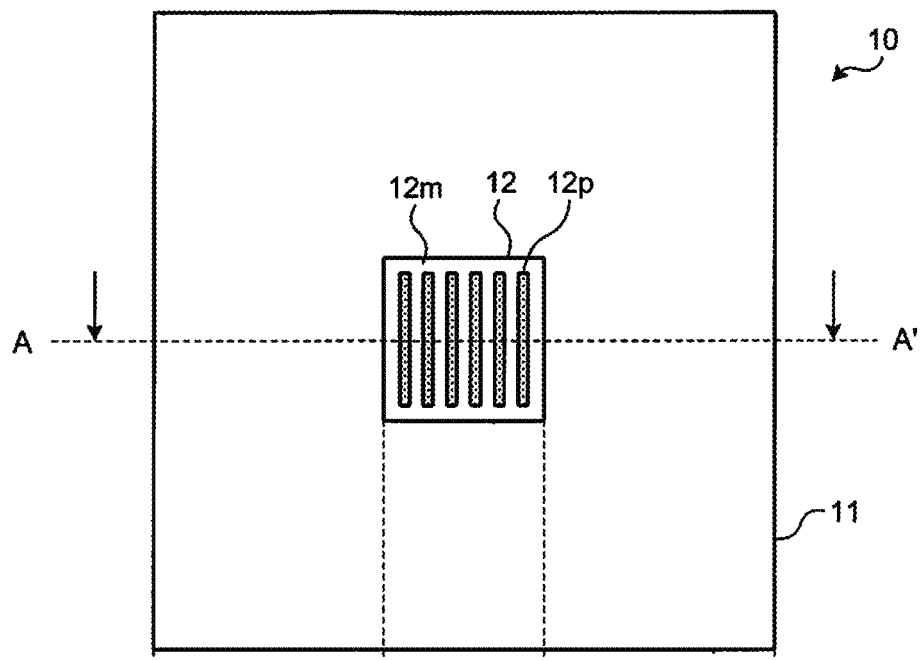
FIG. 3A is a plan view illustrating an example of a structure of a template according to the first embodiment.
Figure 3B:
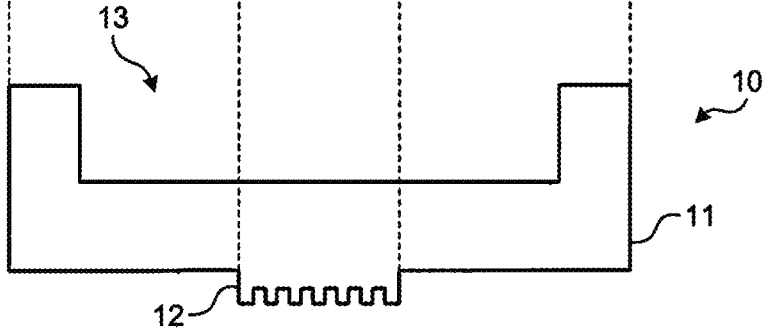
FIG. 3B is a cross-sectional view taken along line A-A' of FIG. 3A.

FIG. 3A is a plan view illustrating an example of a structure of the template 10 according to the embodiment, and FIG. 3B is a cross-sectional view taken along line A-A' of FIG. 3A. The template 10 of the embodiment is configured using a transparent member such as quartz and glass.

As illustrated in FIGS. 3A and 3B, the template 10 includes, for example, a rectangular template substrate 11. A mesa portion 12 is provided on a front surface of the template substrate 11, and a recess 13 is provided on a back surface of the template substrate 11.

The mesa portion 12 is arranged at the center portion of the template substrate 11 and has, for example, a rectangular shape. The mesa portion 12 has a pattern area 12p in which a fine pattern of a nano-order size is formed, for example. The fine pattern may be a pattern in which a plurality of dots is arranged, or another fine pattern in addition to a pattern in which a plurality of grooves is arranged as illustrated in FIGS. 2A to 2E. An outer peripheral portion of the pattern area 12p is a mark area 12m in which a rough inspection mark, an alignment mark, and the like are formed.

Figure 4:
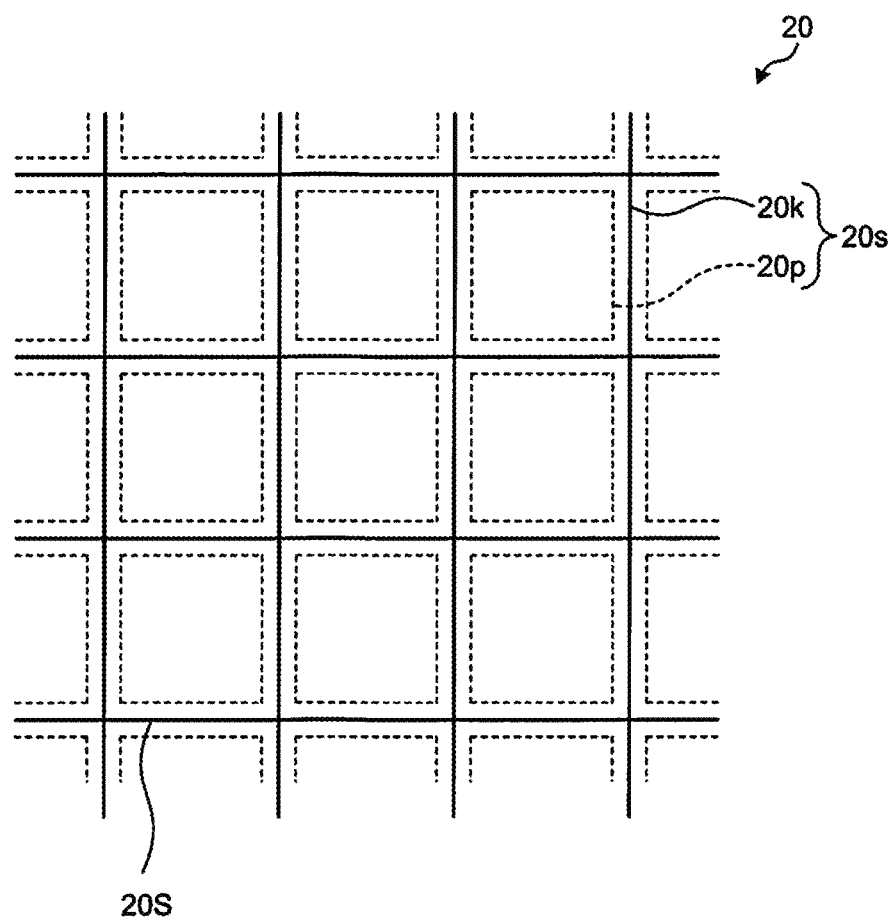
FIG. 4 is a partial plan view illustrating an example of a configuration of a shot area of a wafer according to the first embodiment.

FIG. 4 is a partial plan view illustrating an example of a configuration of a shot area 20s of the wafer 20 according to the embodiment. The shot area 20s is an area to be patterned by one-time imprinting (imprinting of the template 10). When the imprint processing with respect to the wafer 20 is completed, a plurality of the shot areas 20s is formed on the wafer 20.

The shot area 20s includes a pattern area 20p and a kerf area 20k. The pattern area 20p is an area where the fine pattern of the pattern area 12p on the template 10 is transferred to the resist as the template 10 is imprinted onto the resist on the wafer 20. The kerf area 20k is positioned at an outer peripheral portion of the pattern area 20p and corresponds to an area overlapping the mark area 12m of the template 10. In the kerf area 20k, a rough inspection mark, an alignment mark, and the like are formed in advance at positions overlapping the rough inspection mark and the alignment mark on the template 10.

(Outline of Alignment Mark)

Next, configuration examples of alignment marks of the template 10 and the wafer 20 of the embodiment will be described with reference to FIGS. 5 and 6.

There is a limitation on simple alignment using an optical system with a wavelength of several hundred nanometers although the positional accuracy required for imprint processing is the nano-order. Therefore, a highly precise alignment technique using a magnification effect by a moiré image is used in the alignment mark of the embodiment. That is, positional deviation can be projected in a magnified manner by using the moiré image, and it is possible to perform the highly precise alignment. Such a moiré image can be generated, for example, by forming a periodic structure in each of the alignment marks of the template 10 and the wafer 20 and slightly varying periodic intervals.

Figure 5:
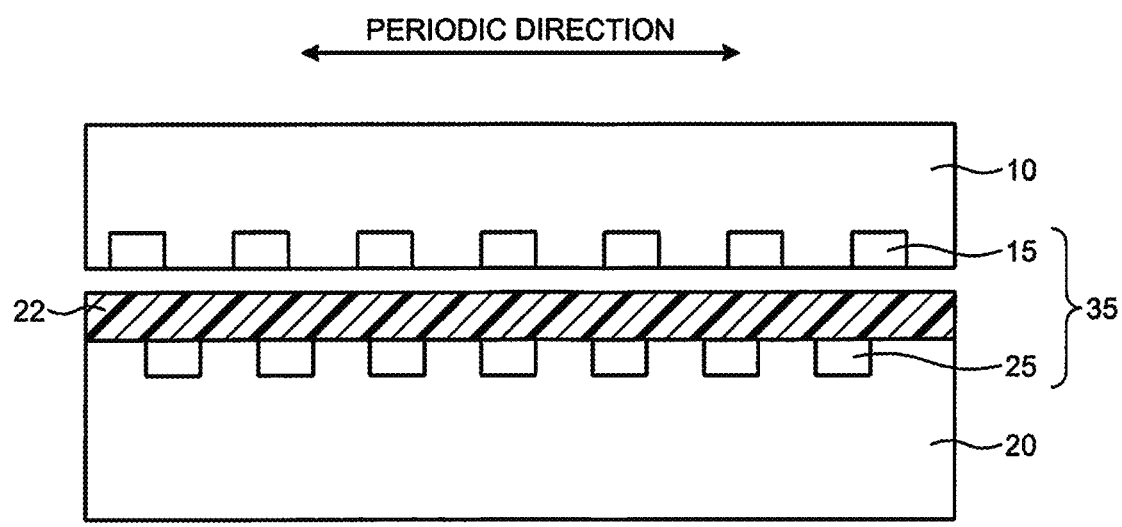
FIG. 5 is a schematic view illustrating a configuration example of alignment marks of the template and the wafer according to the first embodiment.

FIG. 5 is a schematic view illustrating a configuration example of alignment marks 15 and 25 of the template 10 and the wafer 20 according to the embodiment. FIG. 5 does not illustrate the to-be-processed film 21.

As illustrated in FIG. 5, for example, the alignment mark 15 provided on the template 10 and the alignment mark 25 provided on the wafer 20 have different periods in a common periodic direction. As these alignment marks 15 and 25 overlap each other, a moiré mark 35 which generates a moiré image is formed.

In particular, the overlapping alignment marks of the template 10 and the wafer 20 are observed as the moiré mark 35 by causing an oblique incident light to be incident in a dark-field system, whereby the moiré image is observed as a microscopic image. The moiré mark 35 preferably has a high magnification ratio, a high contrast, and a high S/N ratio. The high contrast can be obtained by observation in the dark-field system, and further, the high S/N ratio can be obtained by reducing the influence of background light.

A periodic direction of the moiré image generated by the moiré mark 35 is equal to, for example, the periodic direction of the alignment marks 15 and 25. As the moiré image is observed along the periodic direction of the moiré image, it is possible to detect a positional deviation amount (displacement amount) in a predetermined direction between the template 10 and the wafer 20. The moiré mark 35 is preferably provided in each of a plurality of directions (for example, the X direction and the Y direction) such that the displacement amount can be detected in the plurality of directions.

Figure 6:
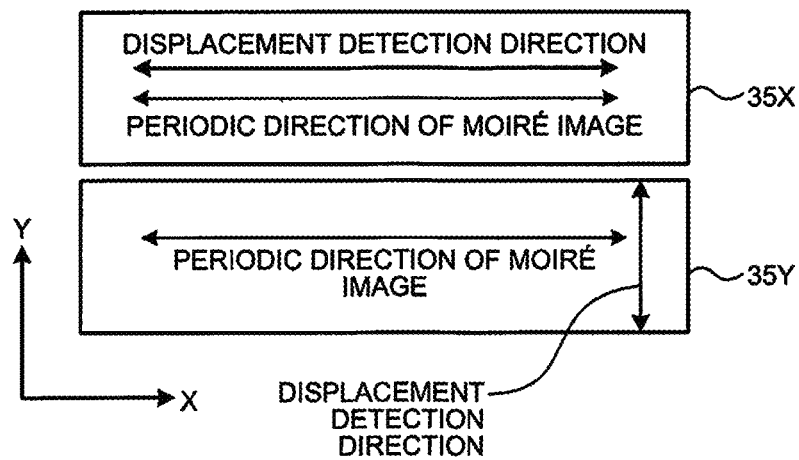
FIG. 6 is a schematic view illustrating an example of arrangement of moiré marks according to the first embodiment.

FIG. 6 is a schematic view illustrating an example of arrangement of moiré marks 35X and 35Y according to the embodiment; For example, the respective moiré marks 35X and 35Y have a substantially rectangular shape and are arranged in concurrent to each other.

In the moiré mark 35X, a periodic direction of a moiré image is the X direction, and a direction in which displacement can be detected is the X direction. That is, the moiré mark 35X is configured to be capable of detecting a displacement amount in the X direction between the template 10 and the wafer 20.

In the moiré mark 35Y, a periodic direction of a moiré image is the X direction, and a direction in which displacement can be detected is the Y direction. That is, the moiré mark 35Y is configured to be capable of detecting a displacement amount in the Y direction between the template 10 and the wafer 20.

Incidentally, in the present embodiment, any of X marks 15X and 25X, and Y marks 15Y and 25Y, which are individual components of alignment marks, a moiré mark 35X in which the X marks 15X and 25X are combined, a moiré mark 35Y in which the Y marks 15Y and 25Y are combined, a combination of the X mark 15X and the Y mark 15Y, a combination of the X mark 25X and the Y mark 25Y, and the like may be sometimes referred to as an alignment mark. In addition, any of the above-described marks and combinations including a rough inspection mark may be sometimes referred to as an alignment mark.

Here, a virtual plane S used for the following description will be described with reference to FIG. 7.

Figure 7:
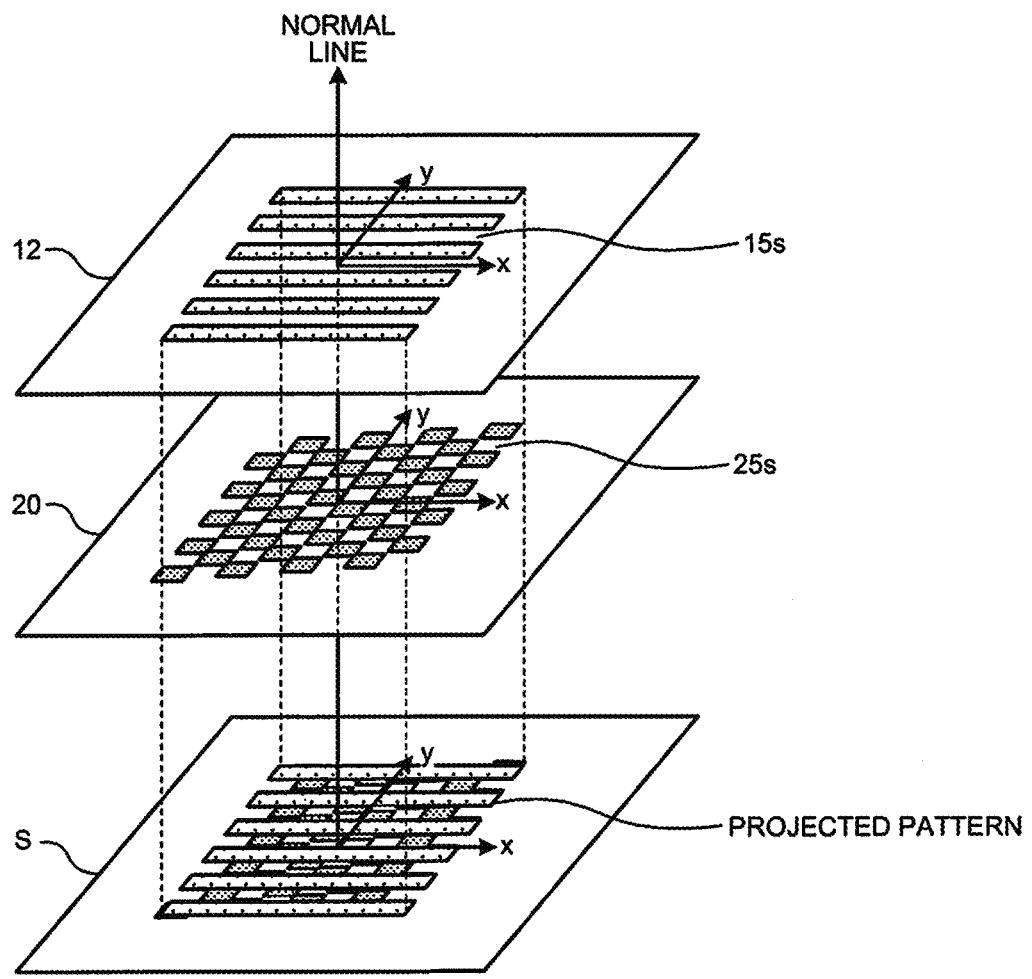
FIG. 7 is a view for describing a virtual plane used for describing the alignment mark according to the first embodiment.

It is assumed that the template 10 and the wafer 20 are arranged to face each other so as to be parallel to each other as illustrated in FIG. 7. In addition, for example, XY coordinates using the pattern area 12p as a reference are set on a surface 15s of the mesa portion 12 of the template 10 provided with the alignment mark 15. In addition, for example, XY coordinates using the pattern area 20p as a reference are set on a surface 25s of the wafer 20 provided with the alignment mark 25. At this time, it is assumed that the X direction and Y direction of the template 10 are made to coincide with the X direction and Y direction of the wafer 20, the template 10 and the wafer 20 facing each other. That is, orientations of the alignment marks 15 and 25 of the template 10 and the wafer 20 coincide with each other with respect to the XY coordinates.

When the template 10 and the wafer 20 are arranged as described above, the surface 15s of the mesa portion 12 of the template 10 and the surface 25s of the wafer 20 have a common normal line. The virtual plane S parallel to the surfaces 15s and 25s is set in the common normal direction. Hereinafter, the X marks 15X and 25X, the Y marks 15Y and 25Y of the template 10 and the wafer 20, and the moiré marks 35X and 35Y where the X mark and the Y mark are combined will be described based on figures (patterns) in which the marks are projected on the virtual plane S.

(Configuration Example of X Mark)

Next, a configuration example of the X marks 15X and 25X of the embodiment will be described with reference to FIGS. 8A, 8B, 9A, and 9B.

Figure 8A:
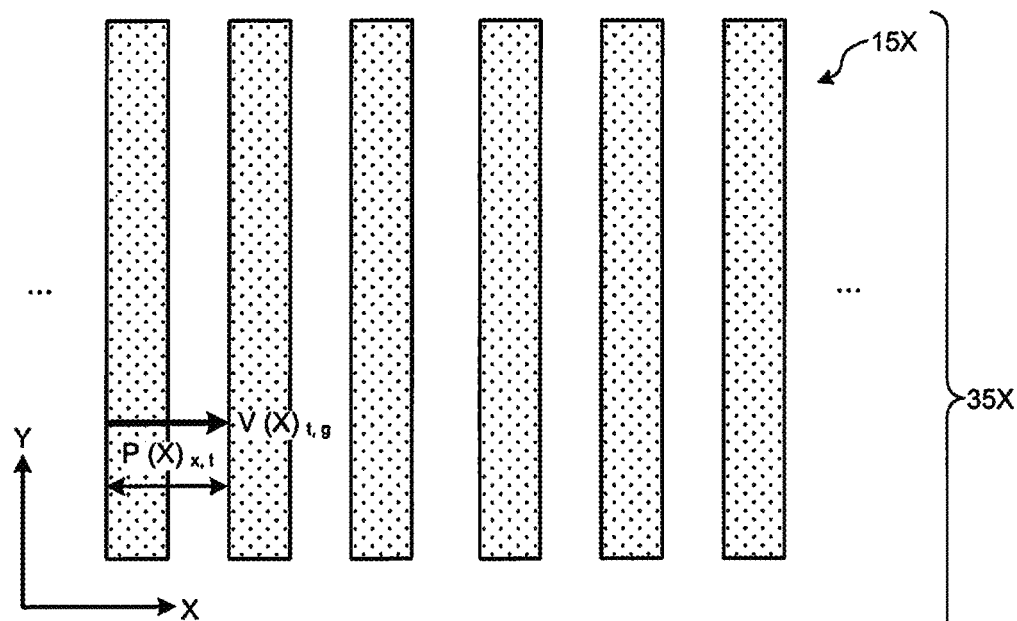
FIGS. 8A and 8B are schematic views illustrating an example of configurations of X marks of the template and the wafer constituting a moiré mark according to the first embodiment.
Figure 8B:
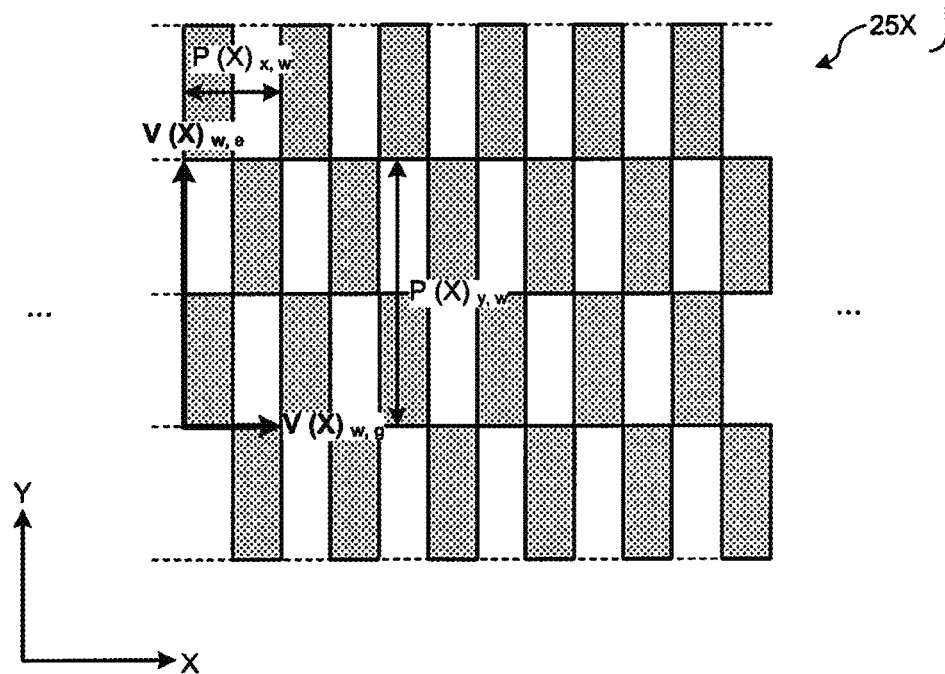

FIGS. 8A and 8B are schematic views illustrating examples of the configurations of the X marks 15X and 25X of the template 10 and the wafer 20 forming the moiré mark 35X according to the embodiment. FIG. 8A illustrates the X mark 15X provided on the template 10, and FIG. 8B illustrates the X mark 25X provided on the wafer 20.

In FIGS. 8A and 8B, P(X)x,t is a periodic interval in the X direction of the X mark 15X, P(X)x,w is a periodic interval in the X direction of the X mark 25X, and P(X)y,w is a periodic interval in the Y direction of the X mark 25X. In addition, a vector V(X)t,g indicates a periodic interval and a periodic direction in the X direction of the X mark 15X. In addition, a vector V(X)w,g indicates a periodic interval and a periodic direction in the X direction of the X mark 25X, and a vector V(X)w,e indicates a periodic interval and an extending direction in the Y direction of the X mark 25X.

As illustrated in FIGS. 8A and 8B, the X mark 15X has, for example, a one-dimensional periodic structure in a stripe shape. Such a one-dimensional periodic structure is a diffraction grating pattern in which a large number of parallel slits are arranged at equal intervals in the X direction. That is, the X mark 15X has the periodic structure in the X direction. In addition, the X mark 15X extends in the Y direction. However, the longitudinal direction of the X mark 15X is the X direction orthogonal to the extending direction.

The X mark 25X has, for example, a two-dimensional periodic structure in a checkered grating (check pattern) shape. Such a two-dimensional periodic structure is a grating pattern in which a large number of parallel slits are arranged at equal intervals in the X direction and the Y direction. That is, the X mark 25X has the periodic structure in the X direction and the Y direction. In addition, the X mark 25X extends in the Y direction. However, the longitudinal direction of the X mark 25X is the X direction orthogonal to the extending direction.

The periods of the X marks 15X and 25X in the X direction are slightly different. Thus, the two X marks 15X and 25X are overlayed on each other to form the above-described moiré mark 35X.

Figure 9A:
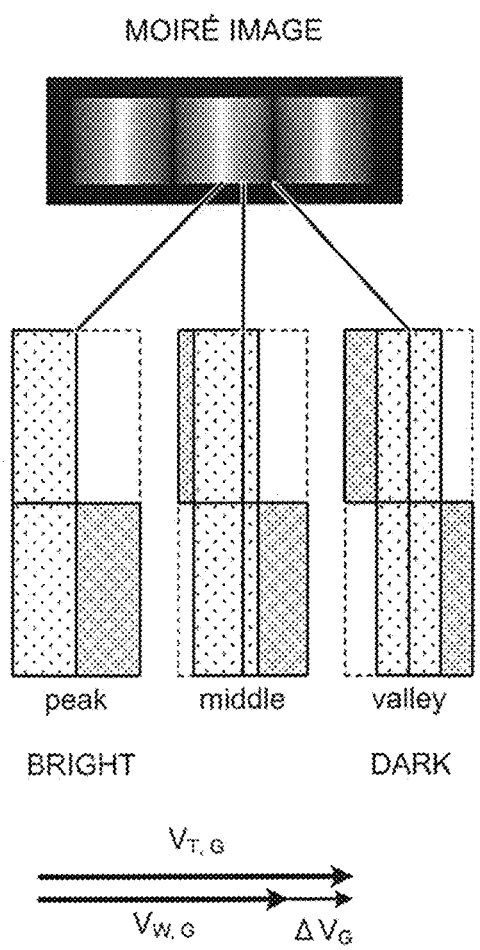
FIGS. 9A and 9B are schematic views illustrating examples of a moiré image generated by the moiré mark according to the first embodiment.
Figure 9B:
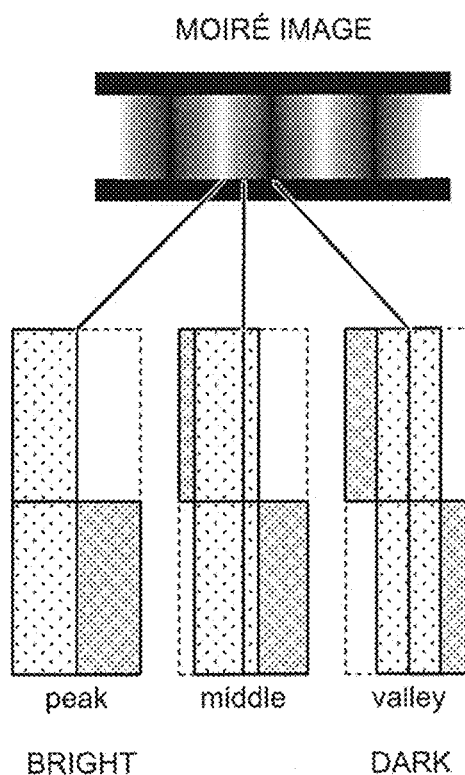

FIGS. 9A and 9B are schematic views illustrating examples of a moiré image generated by the moiré mark 35X according to the embodiment. Since the two X marks 15X and 25X have different periods in the X direction, a pattern deviates in the X direction by a difference |ΔVg| between the vectors V(X)t,g and V(X)w,g each time the X coordinate changes by twice an average periodic interval P(X)x,ave.

Average Periodic Interval $P(X)x,ave=(P(X)x,t+P(X)x,w)/2$

Vector Difference $\Delta Vg = V(X)t,g - V(X)w,g$

That is, a portion where patterns overlap each other and a portion where the patterns do not overlap each other in the X direction occur in the two X marks 15X and 25X.

In the portion where the patterns overlap each other, high-order diffracted beams of light of almost all the orders are generated in the X direction and the Y direction, and these beams of light enter an observation field of view to form a bright portion. In other words, the periodic interval $P(X)x,t$ and the periodic interval $P(X)x,w$ are set such that first-order diffracted light or higher-order diffracted light of illumination light in a microscope enters an observation aperture.

On the other hand, in the portion where the patterns do not overlap each other, diffracted light in which a sum of a diffraction order in the X direction and a diffraction order in the Y direction becomes an even number is greatly suppressed, and the diffracted light hardly enters the observation field of view to form a dark portion.

In this manner, deviation in the patterns in the X direction occurs so that the moiré image in which the bright portion and the dark portion periodically appear in the X direction is obtained as illustrated in FIG. 9A. Here, when one of the X marks 15X and 25X is slightly shifted in the X direction, positions of the bright portion and the dark portion are shifted in the X direction as illustrated in FIG. 9B. At this time, a phase is displaced with a period larger than a displacement amount between actual relative positions of the X marks 15X and 25X. That is, the displacement amount in the X direction is detected in a magnified manner using the moiré image having periodicity in the X direction (see FIG. 6). The actual displacement amount between the X marks 15X and 25X can be grasped in a magnified manner due to such a magnification effect of the displacement amount using the moiré image, so that it is possible to accurately perform the alignment using the X marks 15X and 25X.

(Configuration Example of Y Mark)

Figure 10A:
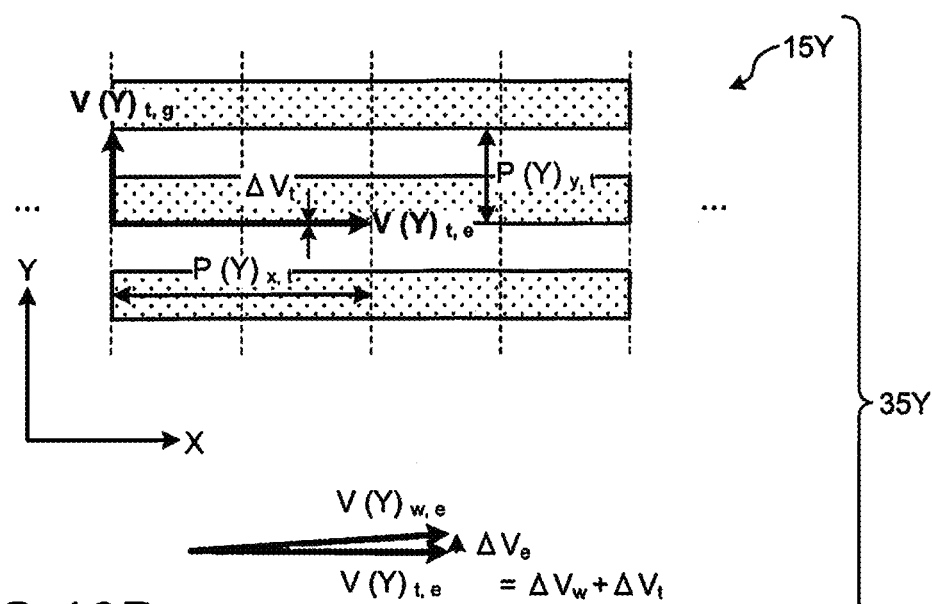
FIGS. 10A and 10B are schematic views illustrating an example of configurations of Y marks of the template and the wafer constituting a moiré mark according to the first embodiment.
Figure 10B:
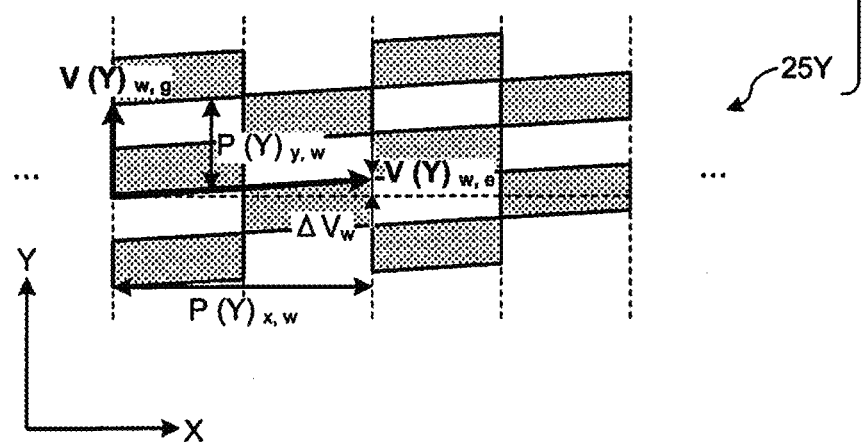

Next, configuration examples of the Y marks 15Y and 25Y according to the embodiment will be described with reference to FIGS. 10A and 10B. FIGS. 10A and 10B are schematic views illustrating examples of configurations of the Y marks 15Y and 25Y of the template 10 and the wafer 20 forming the moiré mark 35Y according to the embodiment. FIG. 10A illustrates the Y mark 15Y provided on the template 10, and FIG. 10B illustrates the Y mark 25Y provided on the wafer 20.

In FIG. 10A and FIG. 10B, $P(Y)x,w$ is a periodic interval in the X direction of the Y mark 25Y, and $P(Y)y,w$ is a periodic interval in the Y direction of the Y mark 25Y. In addition, a vector $V(Y)w,g$ indicates a periodic interval and a periodic direction in the Y direction of the Y mark 25Y, and a vector $V(Y)w,e$ indicates a periodic interval and an extending direction in the X direction of the Y mark 25Y.

In addition, since the Y mark 15Y does not have periodicity in the X direction, a periodic interval $P(Y)x,t$ in the X direction of the Y mark 15Y is defined to be the same periodic interval as the periodic interval $P(Y)x,w$ of the Y mark 25Y. $P(Y)y,t$ is a periodic interval in the Y direction of the Y mark 15Y. In addition, a vector $V(Y)t,g$ indicates a periodic interval ($P(Y)x, t$) and a periodic direction in the Y direction of the Y mark 15Y, and a vector $V(Y)t,e$ indicates a periodic interval and an extending direction in the X direction of the Y mark 15Y.

As illustrated in FIGS. 10A and 10B, the Y mark 15Y has, for example, a one-dimensional periodic structure in a stripe shape or the like. Such a one-dimensional periodic structure is a diffraction grating pattern in which a large number of parallel slits are arranged at equal intervals in the Y direction. That is, the Y mark 15Y has the periodic structure in the Y direction. In addition, the Y mark 15Y extends in the X direction. In addition, the longitudinal direction of the Y mark 15Y is the X direction, which is similar to the extending direction.

The Y mark 25Y has, for example, a two-dimensional periodic structure in a checkered grating shape. Such a two-dimensional periodic structure is a grating pattern in which a large number of parallel slits are arranged at equal intervals in the X direction and the Y direction. That is, the Y mark 25Y has the periodic structure in the X direction and the Y direction. In addition, the Y mark 25Y extends substantially in the X direction, but the extending direction does not completely coincide with the X direction and is slightly oblique. That is, the Y mark 25Y has a slightly extended component also in the Y direction. Incidentally, the longitudinal direction of the Y mark 25Y is the X direction.

In short, it is possible to say that $V(Y)t,g \perp V(Y)t,e$ is established, but $V(Y)w,g \perp V(Y)w,e$ is not established.

Further, the vector $V(Y)t,g$ of the Y mark 15Y and the vector $V(Y)w,g$ of the Y mark 25Y are equal in direction and magnitude. That is, the periodic interval $P(Y)y,t$ in the Y direction of the Y mark 15Y is equal to the periodic interval $P(Y)y,w$ in the Y direction of the Y mark 25Y. In addition, regarding the vector $V(Y)t,e$ of the Y mark 15Y and the vector $V(Y)w,e$ of the Y mark 25Y, it is defined such that the periodic interval $P(Y)x,t$ of the Y mark 15Y is equal to the periodic interval $P(Y)x,w$ in the X direction of the Y mark 25Y since the Y mark 15Y does not have periodicity in the X direction.

Periodic Interval $P(Y)x,t = P(Y)x,w = P(Y)x$

Periodic Interval $P(Y)y,t = P(Y)y,w = P(Y)y$

In addition, the vector $V(Y)t,e$ of the Y mark 15Y and the vector $V(Y)w,e$ of the Y mark 25Y intersect each other, that is, an outer product is not zero, and a vector difference between the vector $V(Y)t,e$ and the vector $V(Y)w,e$ is surely parallel to the Y direction in terms of the definition.

Vector Difference $\Delta Ve = V(Y)t,e - V(Y)w,e$ $= \Delta Vt + \Delta Vw$

Since each of the Y marks 15Y and 25Y is configured as above, the pattern is shifted by $|\Delta Ve|$ in the Y direction each time the X coordinate changes by the periodic interval $P(Y)x$ in the moiré mark 35Y in which the Y marks 15Y and 25Y are combined. That is, a portion where patterns overlap each other and a portion where the patterns do not overlap each other in the Y direction occur.

In the portion where the patterns overlap each other, high-order diffracted beams of light of almost all the orders are generated in the X direction and the Y direction, and these beams of light enter an observation field of view to form a bright portion. In other words, the periodic interval $P(Y)x$ is set such that first-order diffracted light or higher-order diffracted light of illumination light in a microscope enters an observation aperture.

On the other hand, in the portion where the patterns do not overlap each other, diffracted light in which a sum of a diffraction order in the X direction and a diffraction order in the Y direction becomes an even number is greatly suppressed, and the diffracted light hardly enters the observation field of view to form a dark portion.

In this manner, deviation in the patterns in the Y direction occurs so that the moiré image in which the bright portion and the dark portion periodically appear in the X direction is obtained. That is, the displacement amount in the Y direction is detected using the moiré image having periodicity in the X direction (see FIG. 6).

(Example of Alignment Process)

Figure 11:
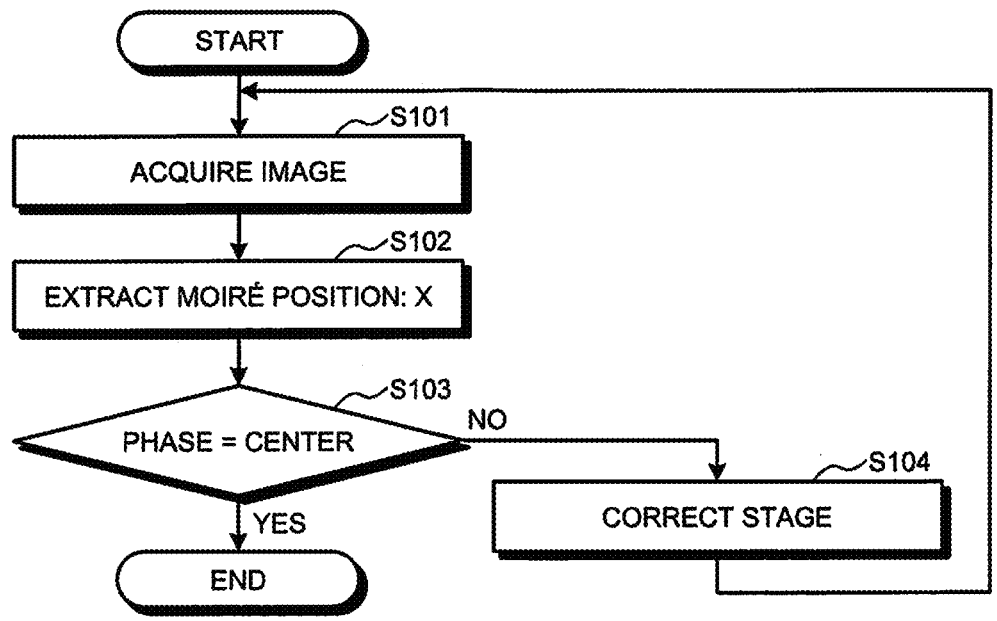
FIG. 11 is a flowchart illustrating an example of a procedure of a position detection process using the X mark according to the first embodiment.

Next, an example of an alignment process using X marks 15X and 25X and Y marks 15Y and 25Y according to the first embodiment will be described with reference to FIG. 11. FIG. 11 is a flowchart illustrating an example of a procedure of the alignment process using the X marks 15X and 25X according to the first embodiment. Hereinafter, the alignment process using the X marks 15X and 25X will be described, but the alignment process can be performed in the same procedure even in the case of using the Y marks 15Y and 25Y.

As illustrated in FIG. 11, images of the X marks 15X and 25X are acquired (Step S101), and a moiré signal is extracted (Step S102). A displacement amount X of a moiré fringe is calculated from the extracted moiré signal, and a displacement amount between a wafer and a template is calculated from the displacement amount X to determine whether the displacement amount satisfies a target value (Step S103).

When the target value is not satisfied (Step S103: No), feedback is applied to a wafer stage (the placement table 82 of FIG. 1) to correct a wafer stage position (Step S104), and the processing from Step S101 is repeated.

If the target value is satisfied (Step S103: Yes), the process is ended.

The alignment process using the X marks 15X and 25X of the first embodiment ends as above.

Comparative Example

Next, an alignment mark of Comparative Example 1 will be described with reference to FIG. 12. The alignment mark of Comparative Example 1 is formed of, for example, an X mark and a Y mark provided on a template, and an X mark and a Y mark provided on a wafer.

The X mark of the template has a one-dimensional periodic structure in a stripe shape having periodicity in the X direction. The X mark of the wafer has a two-dimensional periodic structure in a checkered grating shape having periodicity in the X direction and the Y direction. The X marks of the template and the wafer are configured to have slightly different periodic intervals in the X direction.

Figure 12:
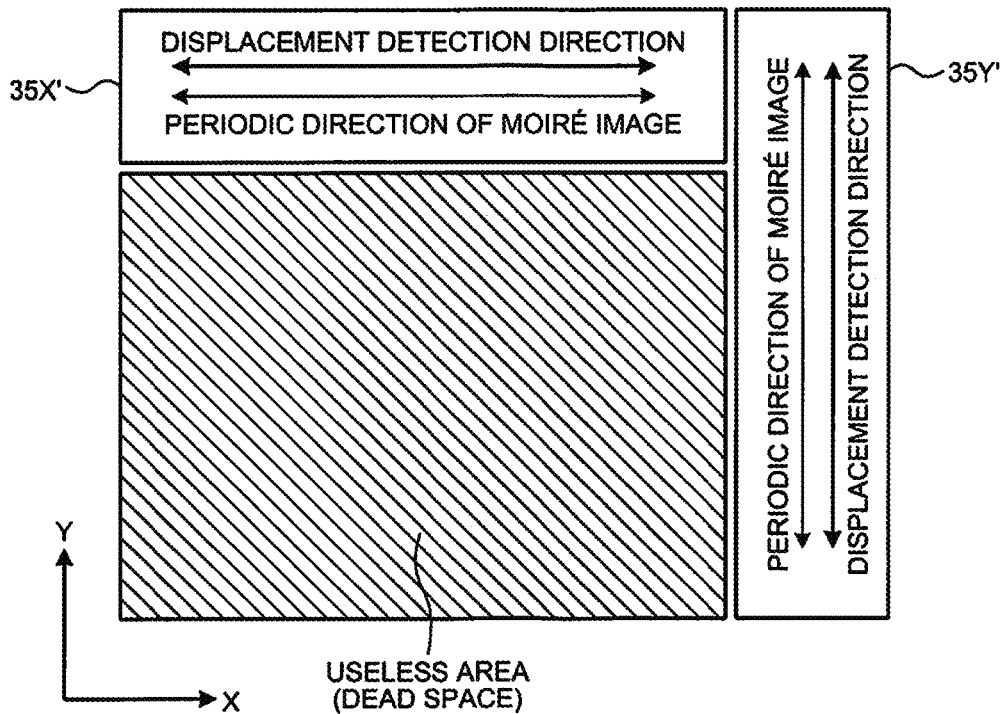
FIG. 12 is a schematic view illustrating an example of arrangement of moiré marks according to Comparative Example 1.

As illustrated in FIG. 12, a moiré mark 35X' capable of detecting a displacement amount in the X direction can be obtained by combining the above X marks of the template and the wafer. In the moiré mark 35X', a periodic direction of a moiré image is the X direction, and a direction in which displacement can be detected is the X direction.

The Y marks of the template and the wafer are obtained by rotating the X marks of the template and the wafer, respectively, by 90°. That is, the Y mark of the template has a one-dimensional periodic structure in a stripe shape having periodicity in the Y direction. The Y mark of the wafer has a two-dimensional periodic structure in a checkered grating shape having periodicity in the X direction and the Y direction. The Y marks of the template and the wafer are configured to have slightly different periodic intervals in the Y direction.

As illustrated in FIG. 12, a moiré mark 35Y' capable of detecting a displacement amount in the Y direction can be obtained by combining the above Y marks of the template and the wafer. In the moiré mark 35Y', a periodic direction of a moiré image is the Y direction, and a direction in which displacement can be detected is the Y direction.

The above moiré marks 35X' and 35Y' need to be arranged in directions orthogonal to each other, which causes a useless area (dead space). However, mixing other configurations in a vacant wasted area is not preferable because it is difficult to distinguish the moiré marks 35X' and 35Y'.

In the moiré marks 35X and 35Y according to the first embodiment, it is possible to detect either the displacement amount in the X direction or the displacement amount in the Y direction with the moiré image having periodicity in the X direction. Therefore, the moiré marks 35X and 35Y can be arranged in parallel to each other, and the useless area can be reduced as much as possible.

As a result, the block area of the alignment mark can be made smaller than the block area of Comparative Example 1. Therefore, it is possible to effectively use a die as arrangement becomes possible in an excess space of which area is insufficient to arrange the alignment mark of Comparative Example 1.

In addition, it is possible to enhance the degree of freedom in arrangement of the alignment mark since the moiré marks 35X and 35Y can be arranged in parallel, for example.

(Modification)

Although the moiré marks 35X, 35Y and the like are applied to the template and the wafer during the imprint processing in the above-described first embodiment, the invention is not limited thereto. The moiré marks of the first embodiment may be applied to proximity exposure processing, near-field optical lithography processing, or the like, for example. As an example, a proximity exposure apparatus 2 in the case of applying the moiré marks of the first embodiment will be described with reference to FIG. 13.

Figure 13:
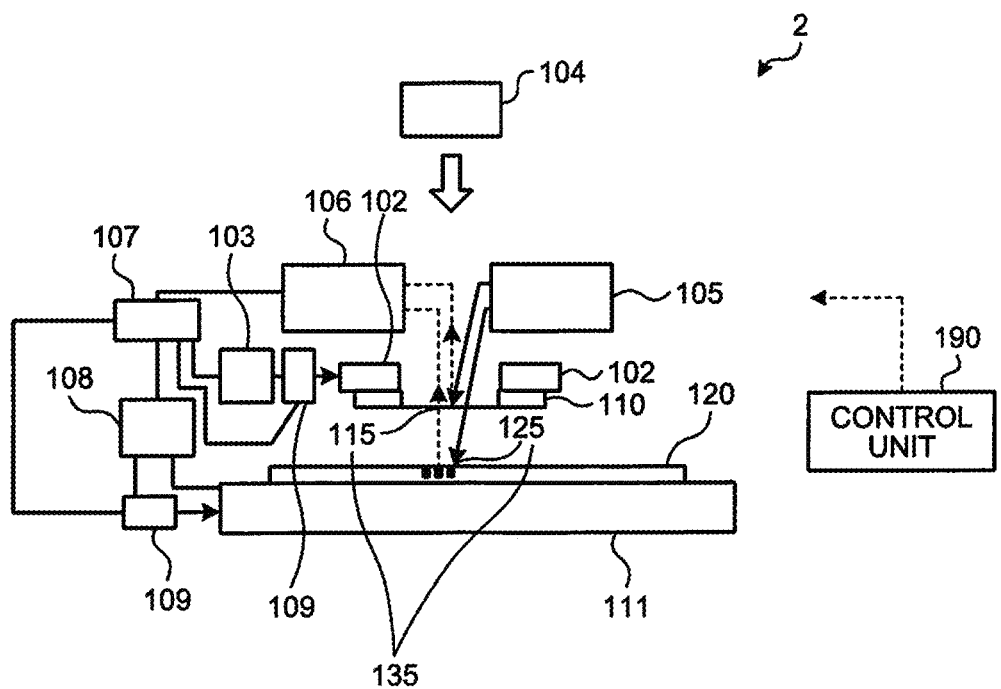
FIG. 13 is a diagram illustrating a configuration example of a proximity exposure apparatus according to a modification of the first embodiment.

As illustrated in FIG. 13, the proximity exposure apparatus 2 includes a reticle stage 102, a reticle stage drive control device 103, an exposure light generation device 104, a position detection illumination optical system 105, a position detection light receiving optical system 106, a signal calculation processing system 107, a wafer stage drive control device 108, a detection light measuring device 109, and a wafer stage 111. The respective units are controlled by a control unit 190. In the proximity exposure apparatus 2, a reticle (or a mask, which will be described as the reticle hereinafter) 110 as an original to transfer a fine pattern onto a resist on a wafer 120 is installed.

The reticle 110 is installed at a predetermined position by the reticle stage 102. The wafer 120 is held by the wafer stage 111. The reticle 110 and the wafer 120 are held such that a gap and the degree of parallelism therebetween become desired values.

The reticle 110 is provided with the fine pattern and an alignment mark 115. The wafer 120 is provided with an alignment mark 125. The configuration of the above-described first embodiment is applied to the alignment marks 115 and 125.

The alignment mark 115 of the reticle 110 and the alignment mark 125 of the wafer 120 are illuminated with detection light generated by the position detection illumination optical system 105. When the alignment marks 115 and 125 of the reticle 110 and the wafer 120 are adjusted to positions overlapping each other vertically, a moiré mark 135 is formed. Then, the detection light from a moiré image of the moiré mark 135 is guided to the position detection light receiving optical system 106.

The detection light guided to the position detection light receiving optical system 106 is sent to the signal calculation processing system 107, and positions of the alignment marks 115 and 125 are calculated. The signal calculation processing system 107 performs arithmetic processing configured to determine proper positions of the alignment marks 115 and 125, and has a function of comparing and processing relative positional deviation between the detected positions of the alignment marks 115 and 125, a phase, a signal intensity, and an S/N ratio of the moiré image.

In addition, the signal calculation processing system 107 transmits signals to the reticle stage drive control device 103 and the wafer stage drive control device 108, and issues commands for driving control of the respective stages 102 and 111. In addition, the signal calculation processing system 107 shares stage position coordinate information detected by the detection light measuring device 109. As a result, the positions of the reticle 110 and the wafer 120 are aligned, and the fine pattern on the reticle 110 is exposed to the wafer 120 with a predetermined positional accuracy. The wafer 120 is irradiated with exposure light from the exposure light generation device 104 through the reticle 110.

Incidentally, an alignment unit is constituted by at least the position detection illumination optical system 105, the position detection light receiving optical system 106, and the signal calculation processing system 107, and an alignment device of the modification is constituted by at least the reticle stage 102, the reticle stage drive control device 103, the position detection illumination optical system 105, the position detection light receiving optical system 106, the signal calculation processing system 107, the wafer stage drive control device 108, the detection light measuring device 109, the wafer stage 111, and the control unit 190.

(Other Modifications)

Although the description has been given in the above embodiment and modifications regarding, for example, the alignment mark in which at least one of the Y marks of the template and the wafer is made oblique and both the X mark and the X mark have the displacement appearing in the X direction, the embodiment is not limited thereto. As the X mark, marks obtained by rotating the Y marks 15Y and 25Y of the embodiment by 90°, marks obtained by rotating the Y marks 16Y and 26Y of the first modification of the embodiment by 90°, or marks obtained by rotating the Y marks 17Y and 27Y of the second modification of the embodiment by 90° may be used. In this case, marks obtained by rotating the X marks 15X and 25X of the embodiment by 90° can be used as the Y mark. Accordingly, it is possible to form the alignment mark with displacement appearing in the Y direction for both the X mark and the Y mark.

For example, the X mark and the Y mark of the template are formed in a stripe shape and the X mark and the Y mark of the wafer are formed in a checkered grating shape in the above embodiment and modifications, but the embodiment is not limited thereto. For example, the X mark and the Y mark of the template may be formed in a checkered grating shape and the X mark and the Y mark of the wafer may be formed in a stripe shape. Alternatively, both the X mark and the Y mark of the template and the wafer may be in a checkered grating pattern. However, it is preferable that a light source side of a microscope have a stripe shape, and a side opposite to the light source have a checkered grating shape. This is because noise, such as scattered light, is more likely to occur in one of the template and the wafer positioned on the light source side. As the alignment mark is formed in a simpler pattern, such noise can be reduced.

Second Embodiment

A second embodiment will be described with reference to FIGS. 14 to 23. The case of being used during imprint processing will be also exemplified regarding an alignment mark of the second embodiment.

In the above-described first embodiment, the description has been given regarding the alignment mark greatly extended in the X direction and compressed in the Y direction. As a result, it is possible to improve the degree of freedom of arrangement of the alignment mark and to suppress the area of arrangement.

On the other hand, it is difficult for the above-described alignment mark using the moiré image generated by the periodic structure to correctly detect a certain displacement amount or more as a problem caused by the periodic structure.

For example, it is assumed that a characteristic period of a periodic structure of a moiré mark, that is, a length of a pitch structural period is P, a magnification ratio of a displacement amount in a moiré image is M, the number of moiré fringes required for position detection is N, and the displacement amount, that is, a positional deviation amount is σx. Here, the structural period is used as the alternative expression for the wave number vector indicating the periodicity of the periodic structure that the alignment mark has. Therefore, the structural period represents the length, dimension, or size of the pitch of the period, and the direction in which the period is repeated. In the moiré mark, a bright portion and a dark portion are replaced every deviation of ¼P. Assuming that a state where no displacement occurs between a wafer and a template appears as the bright portion in the moiré mark, the dark portion in the moiré mark means that any displacement amount of ±¼P occurs. In addition, the case where the displacement amount is ±½P appears as the bright portion, which is hardly distinguished from the state where no displacement occurs. Such a state is referred to as a periodic deviation in the present specification.

If the periodic deviation occurs, it is difficult to detect a correct displacement amount. Therefore, assuming that a range in which the detection is reliably possible is a detectable range, a range of the displacement amount of δx<±¼P becomes the detectable range. In order to perform alignment using the moiré mark, it is necessary to perform alignment (rough inspection) in advance with predetermined accuracy such that the displacement amount falls within the above range. When an alignment tolerance by a rough inspection mark performed as the previous step of the alignment using the moiré mark is σ, there is a high possibility that the alignment is hindered unless the moiré mark is designed such that ¼P>3σ, that is, P>12σ.

In addition, assuming that a size of the moiré mark in a moiré fringe direction at this time is L, L>½N·M·P. Therefore, L>6N·M·σ becomes a lower limit of miniaturization of the moiré mark. Assuming that 3σ is 500 nm, P>2 μm need to be established. In addition, assuming that the number N of moiré fringes=3 and a magnification ratio M=20 are required to obtain sufficient accuracy, L>60 μm. This is a size that is not ignorable in mass production of semiconductor devices, and a problem is how to reduce the size while maintaining the accuracy of the alignment mark.

In the second embodiment, a description will be given regarding the alignment mark that mitigates a lower limit of the pitch length of the structural period to P>6σ or less by adding a configuration to detect a direction of a periodic deviation to a moiré mark and enables further miniaturization.

(Outline of Alignment Mark)

Figure 14:
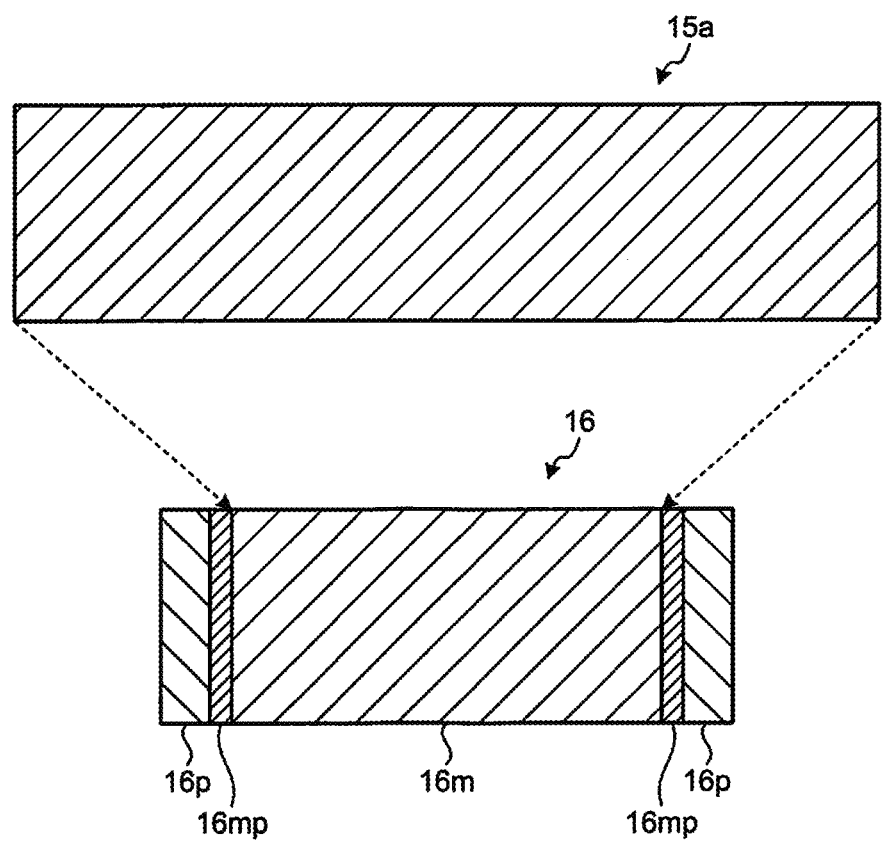
FIG. 14 is a schematic view illustrating a configuration example of an alignment mark according to a second embodiment.

An alignment mark 16 of the second embodiment will be described with reference to FIG. 14. FIG. 14 is a schematic view illustrating a configuration example of the alignment mark 16 according to the second embodiment.

As illustrated in FIG. 14, the alignment mark 16 includes a moiré portion 16m and a detection portion 16p. The moiré portion 16m has a configuration of an alignment mark 15a that follows the method of the above-described first embodiment, and is a portion that causes a moiré image. The detection portion 16p is a portion that can detect a periodic deviation that occurs in the moiré portion 16m. A boundary portion 16mp is arranged between the moiré portion 16m and the detection portion 16p.

As the two detection portions 16p are arranged with respect to one moiré portion 16m so as to sandwich the moiré portion 16m from both sides in the X direction, for example, it is easy to perform signal processing in a periodic deviation direction while suppressing an increase in the size of the entire alignment mark 16. In addition, the direction of the detection portion 16p is desirably not a displacement direction detected by the detection portion 16p but a direction in which a moiré fringe generated by the moiré portion 16m moves according to the displacement. As a result, it is possible to further suppress the increase in the size of the entire alignment mark 16.

The alignment mark 16 can be configured to be even smaller than the alignment mark 15a by providing the detection portion 16p attached to the moiré portion 16m. While a width L' of the alignment mark 15a can be expressed, for example, as $L'=W'_M$, a width L of the alignment mark 16 can be expressed as $L=W_M+2W_P$ assuming that a width of the moiré portion 16m of the alignment mark 16 (size in the direction in which the moiré fringe moves) is $W_M$ and a width of the detection portion 16p is $W_P$.

(Configuration Example of X Mark)

Figure 15:
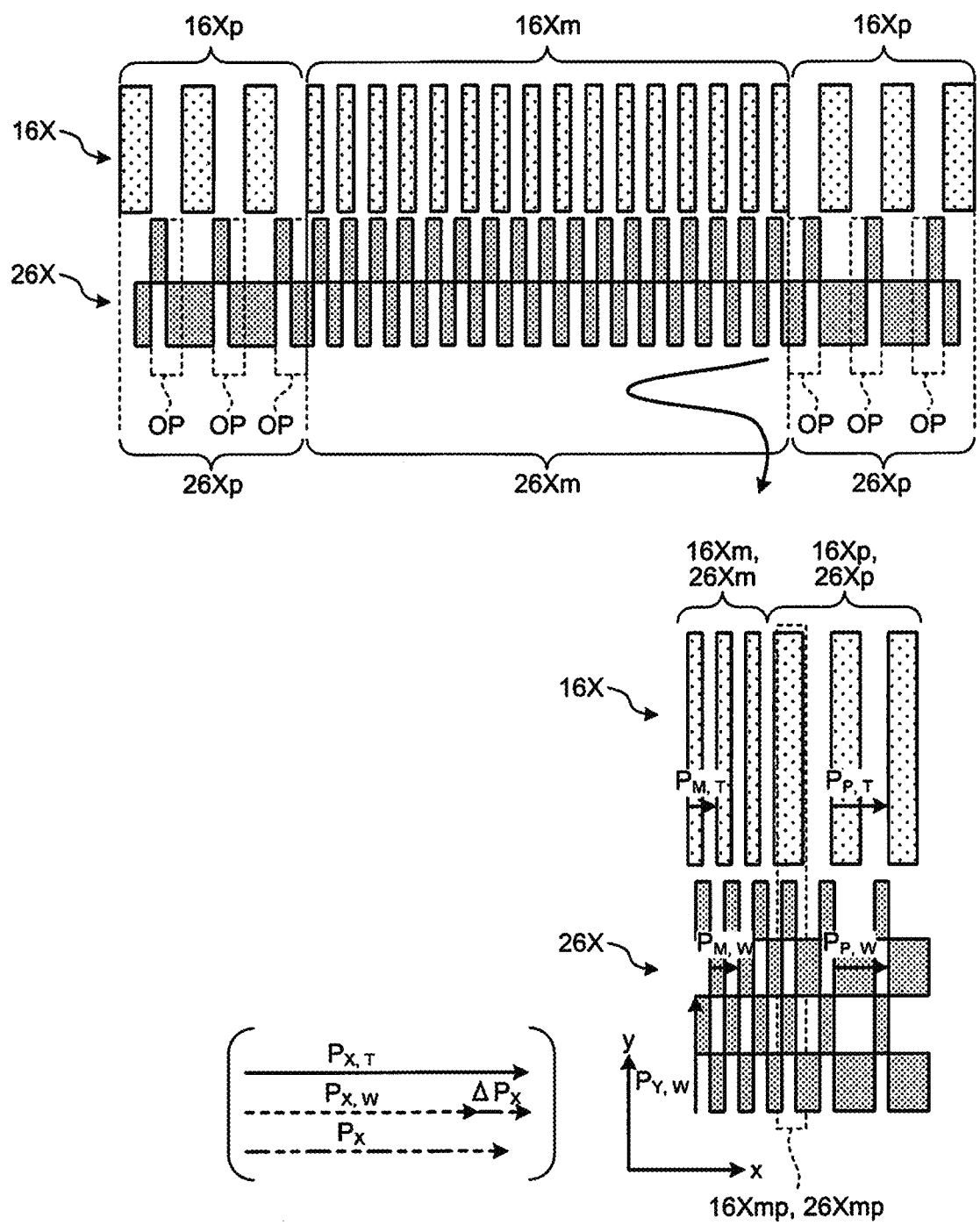
FIG. 15 is a schematic view illustrating an example of configurations of X marks of a template and a wafer constituting an overlay mark according to the second embodiment.

Next, configurations of X marks 16X and 26X will be described with reference to FIGS. 15 and 16A to 16C. FIG. 15 is a schematic view illustrating an example of the configurations of the X marks 16X and 26X of a template and a wafer constituting an overlay mark according to the second embodiment.

As illustrated in FIG. 15, the X mark 16X of the template and the X mark 26X of the wafer are respectively provided with moiré portions 16Xm and 26Xm that follow the method of the above-described first embodiment. That is, in the X mark 16X of the template, the moiré portion 16Xm is formed of a stripe pattern having a pitch length of a structural period of $P_{M,T}$ and a duty ratio of about 1:1. In the X mark 26X of the wafer, the moiré portion 26Xm is formed of a check (checkered grating) pattern having a pitch length of a structural period of $P_{M,W}$ and a duty ratio of about 1:1. Here, the duty ratio is a ratio between a light-transmitting portion which transmits observation light and a light-shielding portion which does not transmit the observation light in each pattern of the X marks 16X, 26X, and the like. Therefore, it is possible to say that the duty ratio is a ratio (aperture ratio) of an opening (window) where the pattern transmits the observation light. In addition, the case where the duty ratio is about 1:1 includes a case where both the portions are the same with the duty ratio of 1:1 and a case where any one portion thereof is equal within 1.2 times the other portion. Further, in this time, the periodic structures $P_{M,T}$ and $P_{M,W}$ have the same periodic direction, and the sizes of pitches that are equal within 1.2 times. Further, in this time, the periodic structures $P_{P,T}$ and $P_{P,W}$ have the same periodic direction, and the sizes of pitches that are equal within 1.2 times.

Here, when a coordinate system in which a direction of displacement to be detected is X→(vector X) and a direction orthogonal to the direction is Y→(vector Y) is set, the pitch length of the structural period $P_{M,T}$ of the X mark 16X and the pitch length of the structural period $P_{M,W}$ of the X mark 26X are values whose absolute values are not equal but close to each other with mutually the same direction. If expressed by mathematical formulas, the following formula is obtained.

$$\vec{P}_{M,T} \| \vec{P}_{M,W} \| \vec{X}$$

$$P_{M,T} \neq P_{M,W}$$

$$0.8 \leq P_{M,T}/P_{M,W} \leq 1.25 \text{ (about 4:5 to 5:4, or } \pm 20\%) \quad (1)$$

An average value $P_M=(P_{M,T}+P_{M,W})/2$ of the pitch length of each structural periods of the moiré portions 16Xm and 26Xm will be referred to as a representative period. The moiré fringe moves in the ±X→direction according to the displacement amount.

Detection portions 16Xp and 26Xp of the X marks 16X and 26X are juxtaposed in the ±X→direction of the moiré portions 16Xm and 26Xm described above. That is, the detection portions 16Xp and 26Xp exist on the extension of $P_{M,T}$→. The detection portion 16Xp of the X mark 16X is formed of a stripe pattern having a pitch length of a structural period of $P_{P,T}$ and a duty ratio of about D:2 (D≥2). The detection portion 26Xp of the X mark 26X is formed of a check pattern having a pitch length of a structural period of $P_{P,W}$ and a duty ratio of about (D+1):1.

The case of D=2 will be described hereinafter. That is, the duty ratio of the detection portion 16Xp is 2:2, and the duty ratio of the detection portion 26Xp is 3:1 in the following description.

The pitch length of each structural periods of the detection portions 16Xp and 26Xp are different from those of the moiré portions 16Xm and 26Xm, are equal to each other, and are approximately twice the pitch length of the structural period of the moiré portions 16Xm and 26Xm.

[Formula 2]

$$P_{P,T}=P_{P,W}=P_P$$

$$\vec{P}_P \approx 2\vec{P}_M \quad (2)$$

In order to simplify the design, $P_P=2P_{M,T}$ or $P_P=2P_{M,W}$ may be set.

The detection portion 26Xp has a portion OP overlapping an opening of the detection portion 16Xp when no displacement occurs in the template and the wafer. The portion OP of the detection portion 26Xp has an important meaning in the overlay mark formed by overlapping between the moiré portions 16Xm and 26Xm and overlapping between of the detection portions 16Xp and 26Xp.

In addition, a boundary portion 16Xmp exists between the detection portion 16Xp and the moiré portion 16Xm, and a boundary portion 26Xmp exists between the detection portion 26Xp and the moiré portion 26Xm. As will be described later, a variety of variations can be considered regarding the configuration of the boundary portions 16Xmp and 26Xmp, and a pattern formed by overlapping of the boundary portions 16Xmp and 26Xmp may be included in the above-described overlay mark.

Figure 16A:
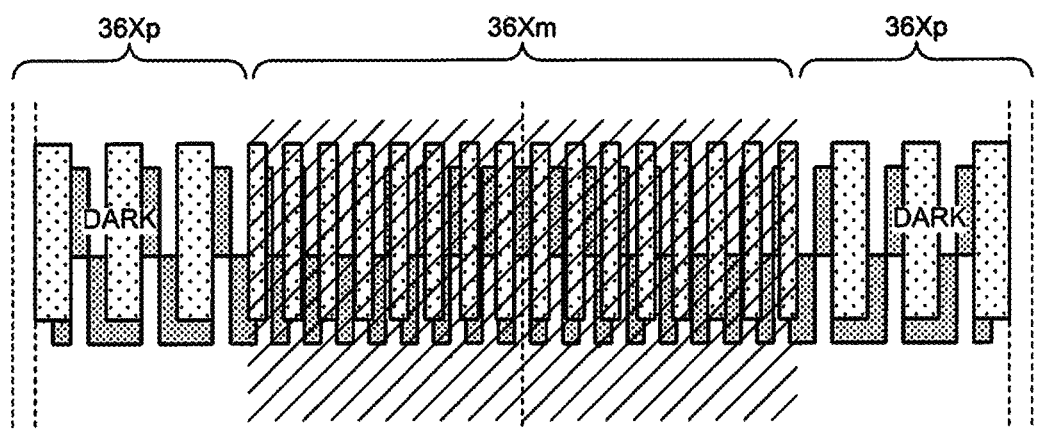
FIGS. 16A to 16C are schematic views for describing a method of detecting a periodic deviation using the overlay mark according to the second embodiment.
Figure 16B:
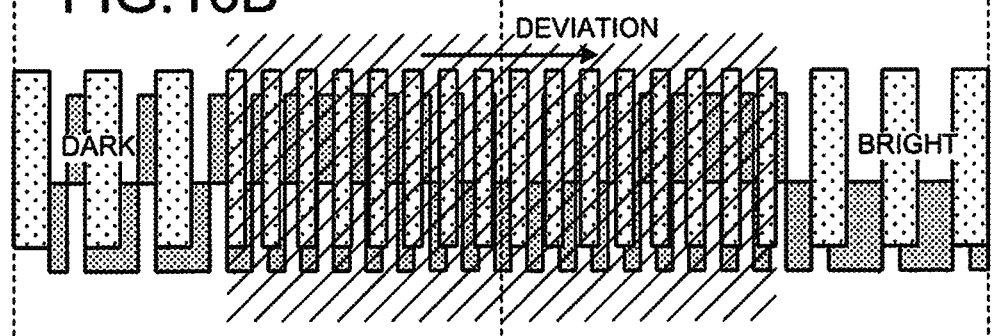
Figure 16C:
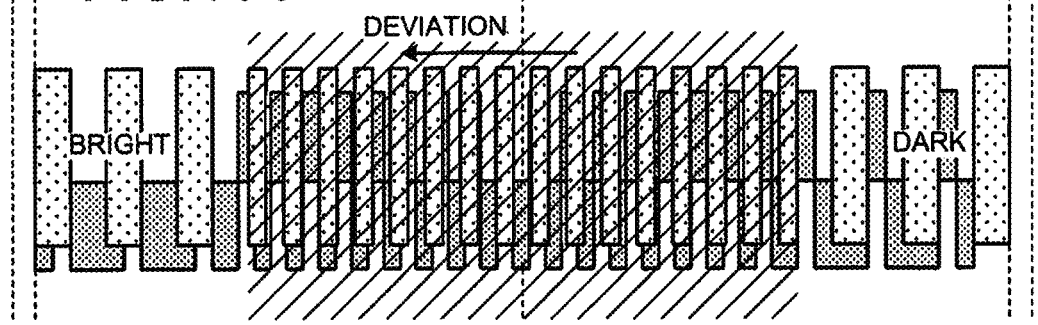

FIGS. 16A to 16C are schematic views for describing a method of detecting a periodic deviation using an overlay mark 36X according to the second embodiment.

As illustrated in FIGS. 16A to 16C, an overlay moiré portion 36Xm is formed as the moiré portions 16Xm and 26Xm overlap each other. An overlay detection portion 35Xp is formed as the detection portions 16Xp and 26Xp overlap each other. The overlay mark 36X is constituted by the overlay moiré portion 36Xm and the overlay detection portion 35Xp, and corresponds to the moiré mark 35X or the like in the above-described first embodiment. The overlay mark 36X may include the overlay pattern of the boundary portions 16Xmp and 26Xmp.

Here, when the overlay mark 36X between the X marks 16X and 26X is observed, the X mark 26X on the wafer is observed through the X mark 16X on the template. An appearance of the detection portion 26Xp of the X mark 26X on the wafer, which is observed through the opening of the detection portion 16Xp of the X mark 16X when the wafer has been shifted in the X direction with respect to the template, will be considered.

When the detection portion 26Xp observed through the opening of the detection portion 16Xp looks like a check shape, such observation is performed using a dark-field optical system, and thus, the opening of the detection portion 16Xp looks dark. This means that the overlay detection portion 36Xp is observed as a dark portion. In addition, when the detection portion 26Xp observed through the opening of the detection portion 16Xp looks like a stripe shape, the opening of the detection portion 16Xp looks bright. This means that the overlay detection portion 36Xp is observed as a bright portion.

A narrow side of the detection portion 26Xp, that is, the side of "1" in a duty ratio of 3:1 is about half a width of the opening of the detection portion 16Xp. Thus, when the narrow side of the detection portion 26Xp overlaps the opening of the detection portion 16Xp, the detection portion 26X observed through the opening of the detection portion 16Xp has a check shape, the opening of the detection portion 16Xp looks dark, and thus, the overlay detection portion 36Xp is observed as the dark portion. When the narrow side of the detection portion 26Xp is out of the opening of the detection portion 16Xp, the detection portion 26X observed through the opening of the detection portion 16Xp has a stripe shape, the opening of the detection portion 16Xp looks bright, and thus, the overlay detection portion 36Xp is observed as the bright portion.

FIG. 16A illustrates a positional relationship between the X marks 16X and 26X when there is no displacement between the template and the wafer. The detection portion 26Xp is configured such that the above-described narrow side of the detection portion 26Xp appears to be adjacent to the left side of the light-shielding portion of the detection portion 16Xp of the template in the detection portion 26Xp on the right side of the moiré portion 26Xm, and the above-described narrow side of the detection portion 26Xp appears to be adjacent to the right side of the light-shielding portion of the detection portion 16Xp of the template in the detection portion 26Xp on the left side of the moiré portion 26Xm. That is, it is configured such that the overlay detection portion 36Xp is observed as the dark portion on both the right side and the left side at this time.

FIG. 16B illustrates a case where the wafer is displaced to the right by $\frac{1}{2}P_M$ with respect to the template. In this case, in the detection portion 26Xp on the right side of the moiré portion 26Xm, the above-described narrow side of the detection portion 26Xp is hidden by the light-shielding portion of the detection portion 16Xp of the template, and the overlay detection portion 36Xp on the right side is observed as the bright portion. At this time, in the detection portion 26Xp on the left side, the above-described narrow side of the detection portion 26Xp just moves to the right side of the opening of the detection portion 16Xp of the template, and thus, the overlay detection portion 36Xp on the left side remains dark.

FIG. 16C illustrates a case where the wafer is displaced to the left by $\frac{1}{2}P_M$ with respect to the template. In this case, in the detection portion 26Xp on the left side of the moiré portion 26Xm, the above-described narrow side of the detection portion 26Xp is hidden by the light-shielding portion of the detection portion 16Xp of the template, and the overlay detection portion 36Xp on the left side is observed as the bright portion. At this time, in the detection portion 26Xp on the right side, the above-described narrow side of the detection portion 26Xp just moves to the left side of the opening of the detection portion 16Xp of the template, and thus, the overlay detection portion 36Xp on the right side remains dark.

(Configuration Example of Y Mark)

Figure 17:
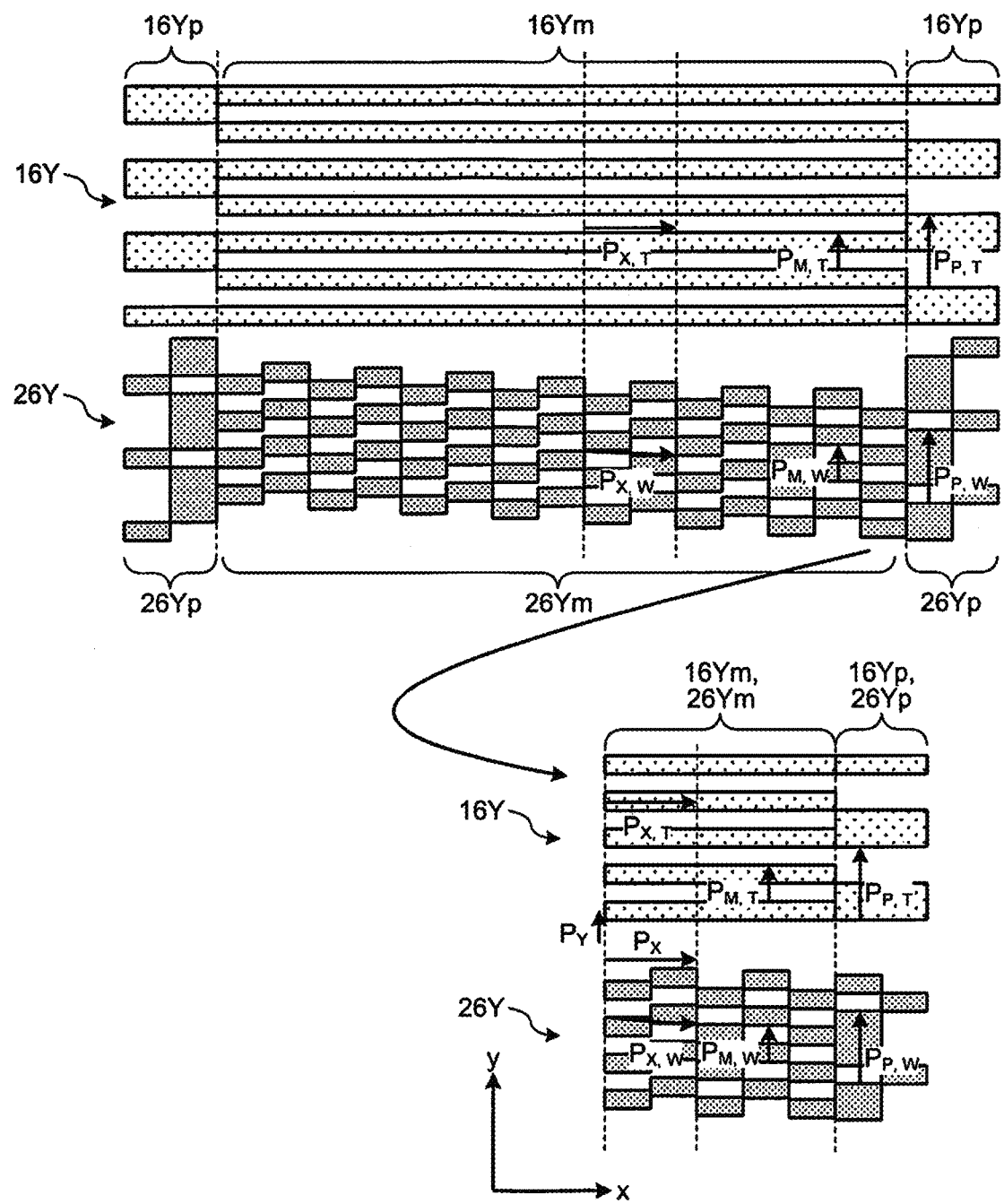
FIG. 17 is a schematic view illustrating an example of configurations of Y marks of the template and the wafer constituting the overlay mark according to the second embodiment.

Next, configurations of the Y marks 16Y and 26Y will be described with reference to FIG. 17. FIG. 17 is a schematic view illustrating an example of the configurations of the Y marks 16Y and 26Y of the template and the wafer constituting the overlay mark according to the second embodiment.

As illustrated in FIG. 17, the Y mark 16Y of the template and the Y mark 26Y of the wafer are respectively provided with moiré portions 16Ym and 26Ym that follow the method of the above-described first embodiment. That is, in the Y mark 16Y of the template, the moiré portion 16Ym is formed of a stripe pattern having a pitch length of a structural period of $P_{M,T}$ and a duty ratio of about 1:1. In the X mark 26X of the wafer, the moiré portion 26Xm is formed of a check (checkered grating) pattern having a pitch length of a structural period of $P_{M,W}$ and a duty ratio of about 1:1. The case where the duty ratio is about 1:1 includes a case where both the portions are the same with the duty ratio of 1:1 and a case where any one portion thereof is equal within 1.2 times the other portion. Further, in this time, the periodic structures $P_{M,T}$ and $P_{M,W}$ have the same periodic direction, and the sizes of pitches that are equal within 1.2 times. Further, in this time, the periodic structures $P_{P,T}$ and $P_{P,W}$ have the same periodic direction, and the sizes of pitches that are equal within 1.2 times.

Here, when a coordinate system in which a direction of displacement to be detected is Y. (vector Y) and a direction orthogonal to the direction is X. (vector X) is set, the pitch length of the structural period $P_{M,T}$ of the Y mark 16Y and the pitch length of the structural period $P_{M,W}$ of the Y mark 26Y are expressed by the following mathematical formulas different from those of the X marks 16X, 26X.

$$\vec{P}_{M,T} = \vec{P}_{M,W} = \vec{P}_M, \vec{P}_M \perp \underline{X}$$

$$\vec{P}_{X,T} \vec{P}_{X,W} \text{ where } \vec{P}_{X,T} \cdot \vec{X} = \vec{P}_{X,W} \cdot \vec{X} \qquad (3)$$

Detection portions 16Yp and 26Yp of the Y marks 16Y and 26Y are arranged in the $\pm X \rightarrow$ direction of the moiré portions 16Ym and 26Ym described above. That is, the detection portions 16Yp and 26Yp do not exist on the extension of $P_{M,T} \rightarrow$. The detection portion 16Yp of the Y mark 16Y is formed of a stripe pattern having a pitch length of a structural period of $P_{P,T}$ and a duty ratio of about 2:2. The detection portion 26Yp of the Y mark 26Y is formed of a check pattern having a pitch length of a structural period of $P_{P,W}$ and a duty ratio of about 3:1.

The pitch length of each structural periods of the detection portions 16Yp and 26Yp are different from those of the moiré portions 16Ym and 26Ym, are equal to each other, and are approximately twice the pitch length of the structural period of the moiré portions 16Ym and 26Ym.

$$P_{P,T} = P_{P,W} = P_P$$

$$\vec{P}_P \approx 2\vec{P}_M \qquad (4)$$

An overlay moiré portion is formed as the moiré portions 16Ym and 26Ym overlap each other. An overlay detection portion is formed as the detection portions 16Yp and 26Yp overlap each other. An overlay mark is constituted by the overlay moiré portion and the overlay detection portion, and corresponds to the moiré mark 35Y or the like in the above-described first embodiment. The detection principle of the Y marks 16Y and 26Y is the same as the detection principle of the X marks 16X and 26X described above.

(Example of Alignment Process)

In the configuration of the second embodiment, problems caused by the periodicity of the moiré image are compensated by the detection portions 16Xp, 26Xp, 16Yp, and 26Yp. Therefore, a process added to the alignment process of the above-described first embodiment is necessary in an alignment process using the configuration of the second embodiment.

Figure 18:
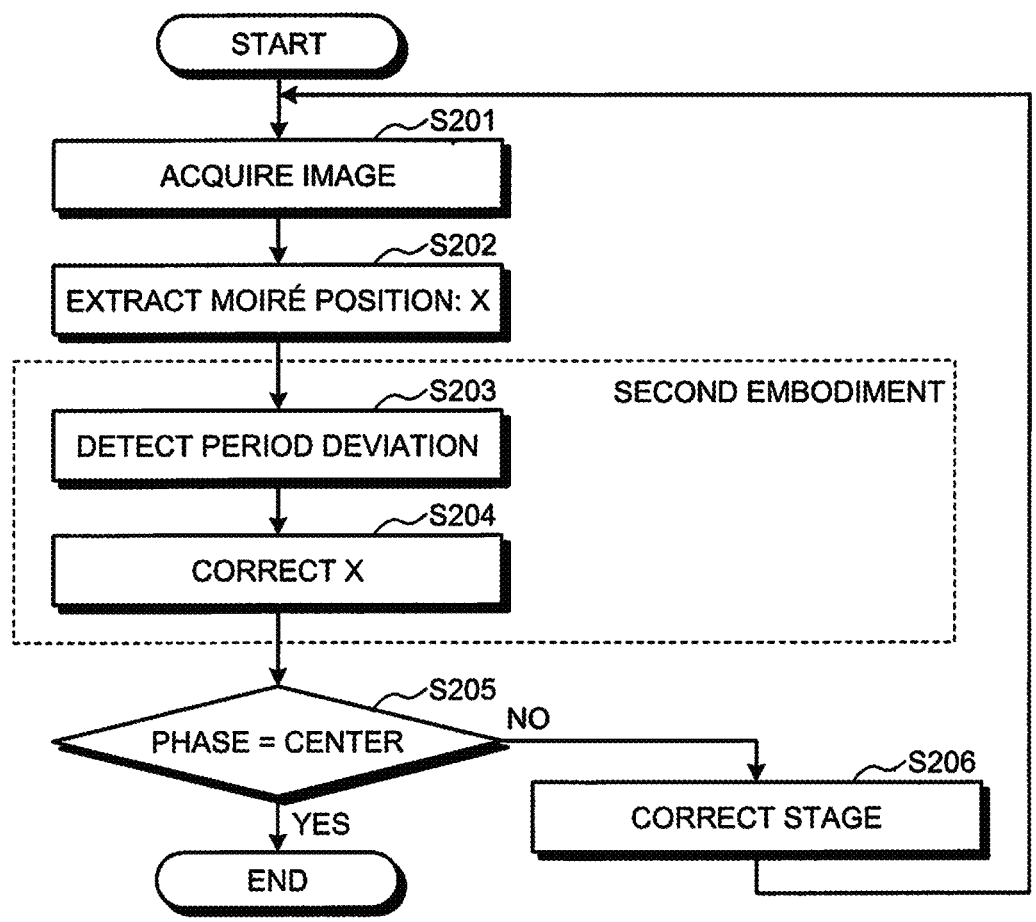
FIG. 18 is a flowchart illustrating an example of a procedure of a position detection process using the X mark according to the second embodiment.

FIG. 18 is a flowchart illustrating an example of a procedure of a position detection process using the X marks 16X and 26X according to the second embodiment. Hereinafter, the alignment process using the X marks 16X and 26X will be described, but the alignment process can be performed in the same procedure even in the case of using the Y marks 16Y and 26Y.

As illustrated in FIG. 18, the processing of Steps S201 and S202 is the same as the processing of Steps S101 and S102 of the above-described first embodiment.

After calculating the displacement amount X of the moiré fringe, a periodic deviation is detected by the detection portions 16Xp and 26Xp of the X marks 16X and 26X (Step S203), and the displacement amount X of the moiré fringe is corrected in accordance with the presence or absence of the periodic deviation (Step S204).

The subsequent processing of Steps S205 and S206 is similar to the processing of Steps S103 and S104 of the above-described first embodiment.

A method of detecting the periodic deviation and correcting the displacement of the moiré fringe differs depending on design of a range of displacement amount to be detected and the detection portions 16Xp and 26Xp, a purpose, and the accuracy of an imprinting apparatus, or the like. For example, there is a method of simply determining approximate positions of the detection portions 16Xp and 26Xp in an alignment scope and detecting brightness and darkness of the detection portions 16Xp and 26Xp.

The X marks 16X and 26X and the Y marks 16Y and 27Y according to the second embodiment are provided with the detection portions 16Xp, 26Xp, 16Yp, and 26Yp, which are juxtaposed with the moiré portions 16Xm, 26Xm, 16Ym, and 26Ym. As a result, it is possible to detect up to the case where the displacement amount between the template and the wafer deviates by at least $\pm \frac{1}{2}P_M$. Accordingly, the lower limit of the pitch length of the structural period of the X marks 16X and 26X and the Y marks 16Y and 27Y can be set to at least P>6σ.

(First Modification)

Figure 19:
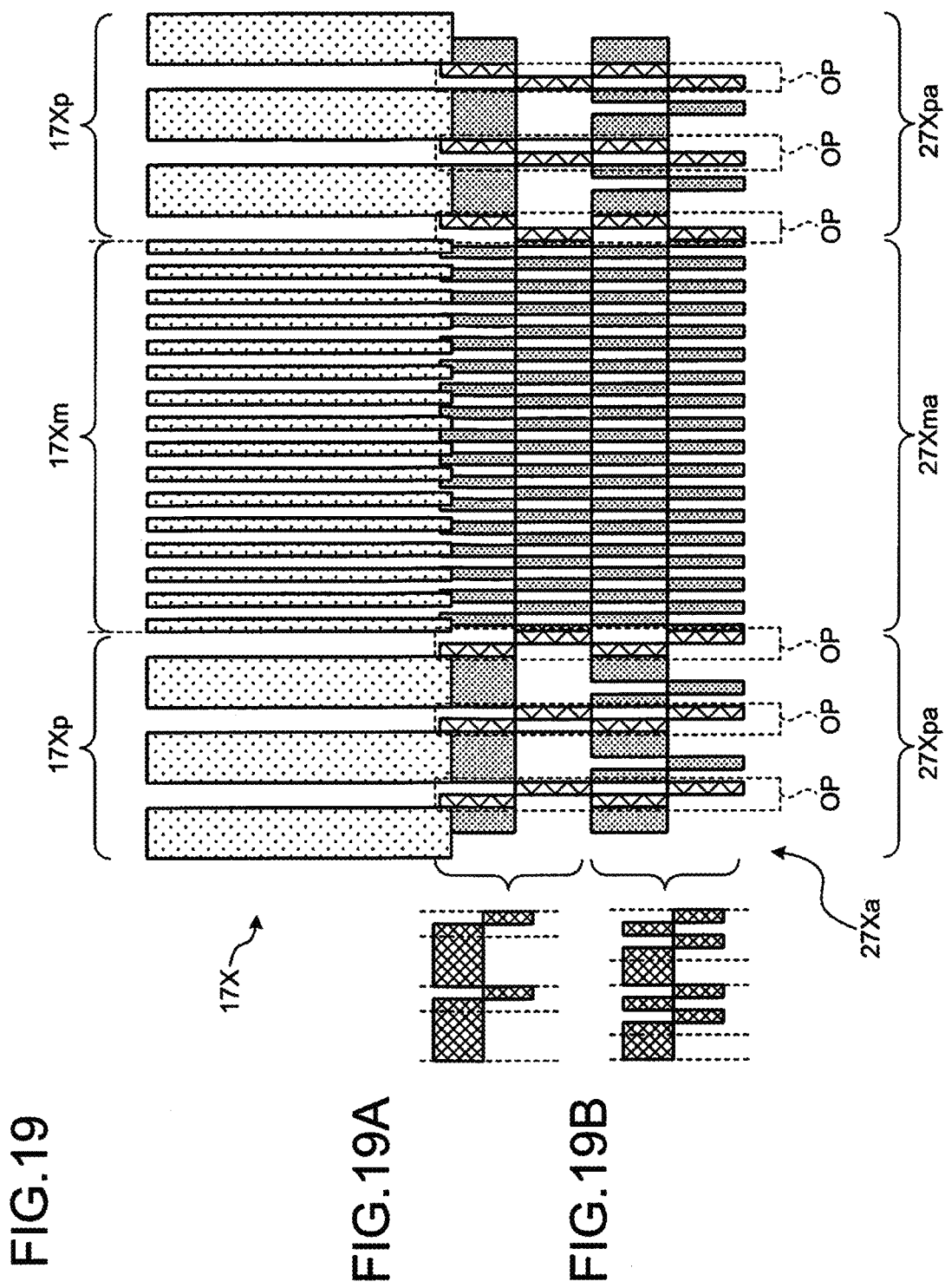
Figure 20:
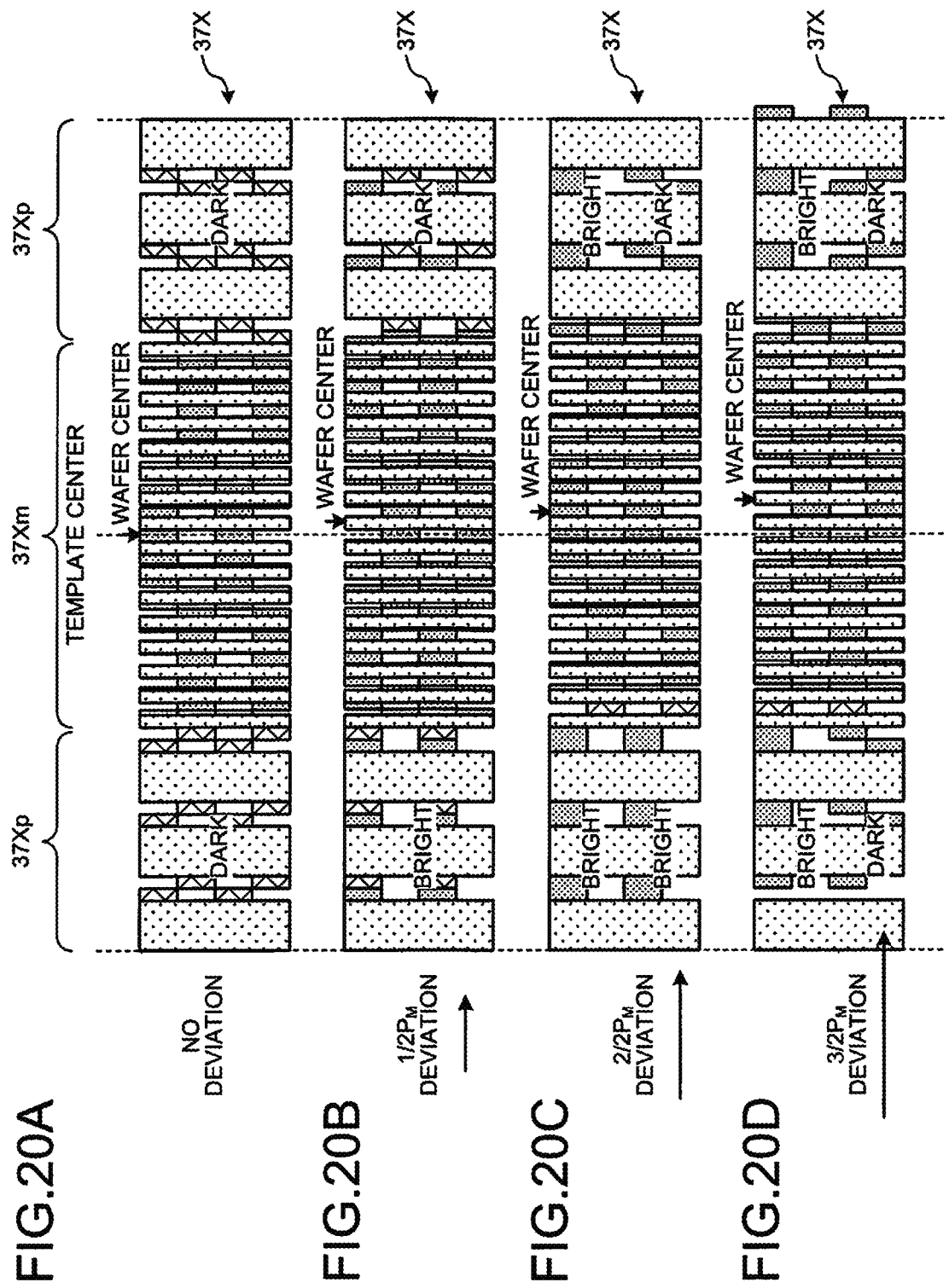
FIGS. 20A to 20D are schematic views for describing a method of detecting a periodic deviation using the overlay mark according to the first modification of the second embodiment.

Although the duty ratio of the detection portions 16Xp and 16Yp in the X mark 16X and the Y mark 16Y is, for example, 2:2 in the above-described second embodiment, when the duty ratio is D:2 (D>2), pattern configurations of X marks and Y marks on a wafer can be made more complex, and more advanced functions can be added. FIG. 19 illustrates a configuration example of X marks 17X and 27Xa in the case of D=4.

FIG. 19 is a schematic view illustrating the configuration example of the X marks 17X and 27Xa of a template and a wafer constituting an overlay mark according to a first modification of the second embodiment. As illustrated in FIG. 19, moiré portions 17Xm and 27Xma in the X marks 17X and 27Xa are configured to have a duty ratio of 1:1, as in the example of the above-described second embodiment.

A detection portion 17Xp in the X mark 17X of the template has a duty ratio of 4:2, a portion corresponding to "4" is a light-shielding portion, and a portion corresponding to "2" is a light-transmitting portion (opening).

A plurality of configurations are conceivable for a detection portion 27Xpa in the X mark 27Xa of the wafer, and it is difficult to represent such configurations with a simple duty ratio. Therefore, it is assumed herein that the detection portion 27Xpa is a mixed pattern of a stripe and a check.

As illustrated in FIG. 19A, the detection portion 27Xpa has a configuration of stripe:check=4:2 in an upper part.

As illustrated in FIG. 19B, the detection portion 27Xpa has a configuration of stripe:check=2:4 in a lower part.

Both the upper and lower parts of the detection portion 27Xpa have a portion OP overlapping an opening of the detection portion 17Xp when no displacement occurs in the template and the wafer.

FIGS. 20A to 20D are schematic views for describing a method of detecting a periodic deviation using an overlay mark 37X according to the first modification of the second embodiment;

FIG. 20A illustrates a positional relationship between the X marks 17X and 27Xa constituting the overlay mark 37X in a state where there is no displacement between the template and the wafer. An overlay detection portion 37Xp at this time is observed as a dark portion on both the left and right side.

FIG. 20B illustrates a case where the wafer is displaced to the right by $\frac{1}{2}P_M$ with respect to the template. In this case, the overlay detection portion 37Xp on the left side is observed as a bright portion while maintaining a state where the overlay detection portion 37Xp on the right side is the dark portion. The configuration described so far is the same as the case of D=2 described above.

FIG. 20C illustrates a case where the wafer is displaced to the right by $P_M$ with respect to the template. In this case, the overlay detection portion 37Xp on the left side is observed as the bright portion. On the other hand, the overlay detection portion 37Xp on the right side is observed as the bright portion only at the upper part, and the lower part maintains the state of the dark portion.

FIG. 20D illustrates a case where the wafer is displaced to the right by $\frac{3}{2}P_M$ with respect to the template. In this case, the overlay detection portion 37Xp on the right side maintains the state where the upper part is the bright portion and the lower portion as the dark portion, and the lower part turns to the dark portion while the upper part maintains the bright portion state in the overlay detection portion 37Xp on the left side.

As described above, the different combinations of bright and dark states are detected in the left and right overlay detection portions 37Xp in all the cases where there is no displacement between the template and the wafer and where the wafer is displaced to the right by ½$P_M$, $P_M$, or ³⁄₂$P_M$ with respect to the template. That is, it is possible to distinguish between the state where there is no displacement between the template and the wafer, the state where the wafer is displaced to the right by ½$P_M$ with respect to the template, the case where the wafer is displaced to the right by $P_M$, and the state where the wafer is displaced to the right by ³⁄₂$P_M$.

Therefore, it is possible to detect the displacement amount of at least one representative period of the moiré portions 17Xp and 27Xpa together with a direction of the displacement by using the configuration of the detection portions 17Xp and 27Xpa as described above. In addition, as described later, the displacement of ±1.5 periods can be sensed by taking into account a slight difference in brightness between the left and right overlay detection portions 37Xp in a state where an S/N ratio is sufficiently small. As a result, the lower limit of the pitch length of the structural period of the moiré portions 17Xp and 27Xpa can be made finer up to at least $P_M$>3σ.

However, assuming that a wavelength of an illumination light source for alignment is λ, the illumination light itself hardly pass through the pattern on the template if $P_M$>λ so that there is a risk that the S/N ratio of the moiré signal significantly decreases. Therefore, it is desirable to form the X marks 17X and 27Xa such that $P_M$>max(3σ, λ) in practice.

(Second Modification)

Figure 21:
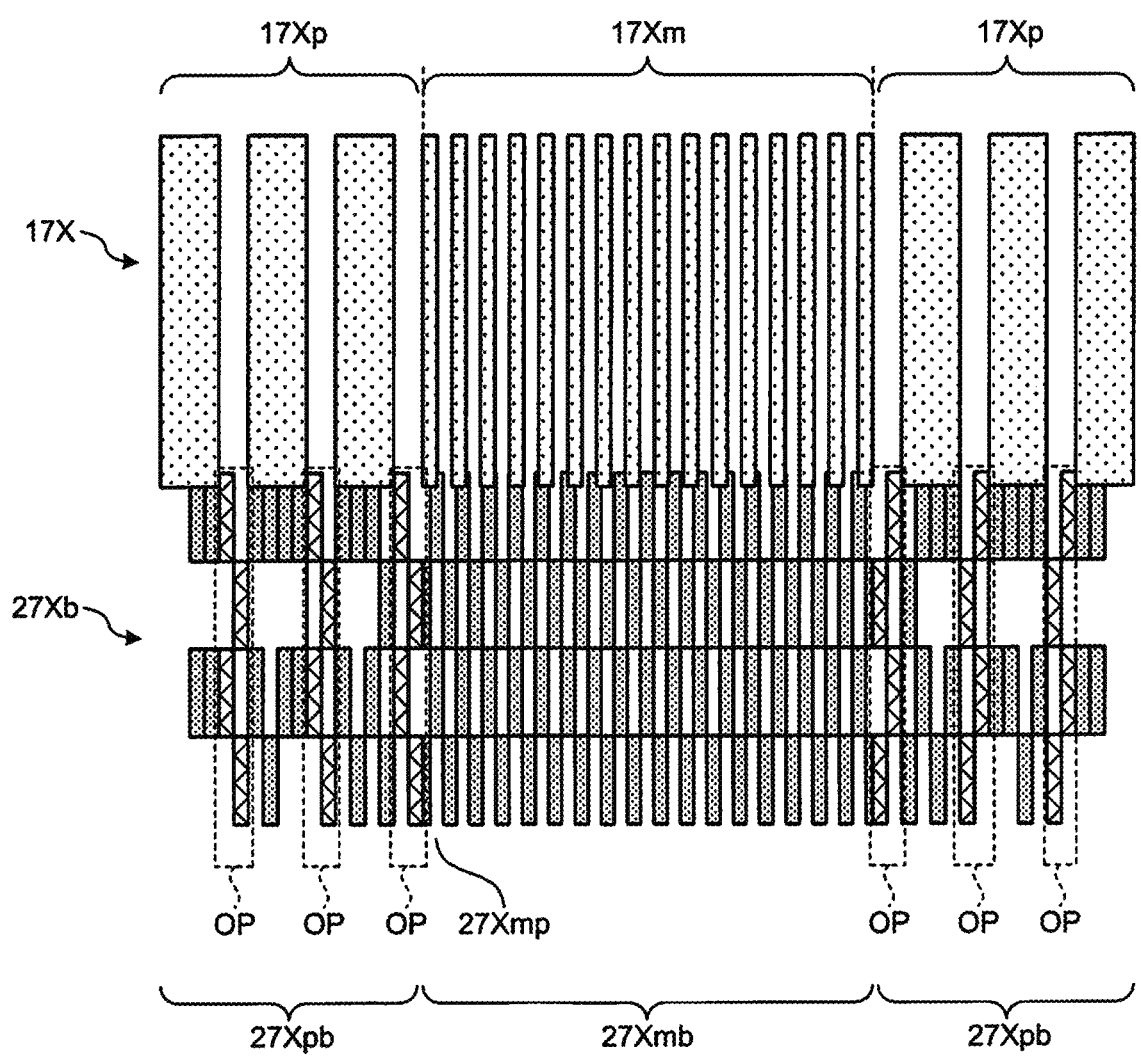
FIG. 21 is a schematic view illustrating an example of configurations of X marks of a template and a wafer constituting an overlay mark according to a second modification of the second embodiment.

Next, X marks 17X and 27Xb of a second modification of the second embodiment will be described with reference to FIG. 21. FIG. 21 is a schematic view illustrating the configuration example of the X marks 17X and 27Xb of a template and a wafer constituting an overlay mark according to the second modification of the second embodiment. In the X mark 27Xb of the second modification, a configuration of a boundary portion 27Xmp is different from that of the above-described first modification.

Even in the second modification, the X mark 17X on the template is configured in the same manner as the first modification as illustrated in FIG. 21.

When a displacement amount between the template and the wafer is zero, in the boundary portion 27Xmp between a moiré portion 27Xm and a detection portion 27Xp of the X mark 27Xb, a portion overlapping a light-shielding portion of the detection portion 17Xp of the X mark 17X in the detection portion 27Xp close to the moiré portion 27Xm is different from that of the above-described first modification.

More specifically, the boundary portion 27Xmp between the moiré portion 27Xm and the detection portion 27Xp of the X mark 27Xb is configured to be constantly observed as a dark portion regardless of the displacement amount between the template and the wafer in an overlay mark formed by overlapping the X mark 17X. Since signals of an overlay moiré portion and an overlay detection portion are separated regardless of the displacement amount between the template and the wafer, an error is less likely to occur during image processing.

(Third Modification)

Figure 22:
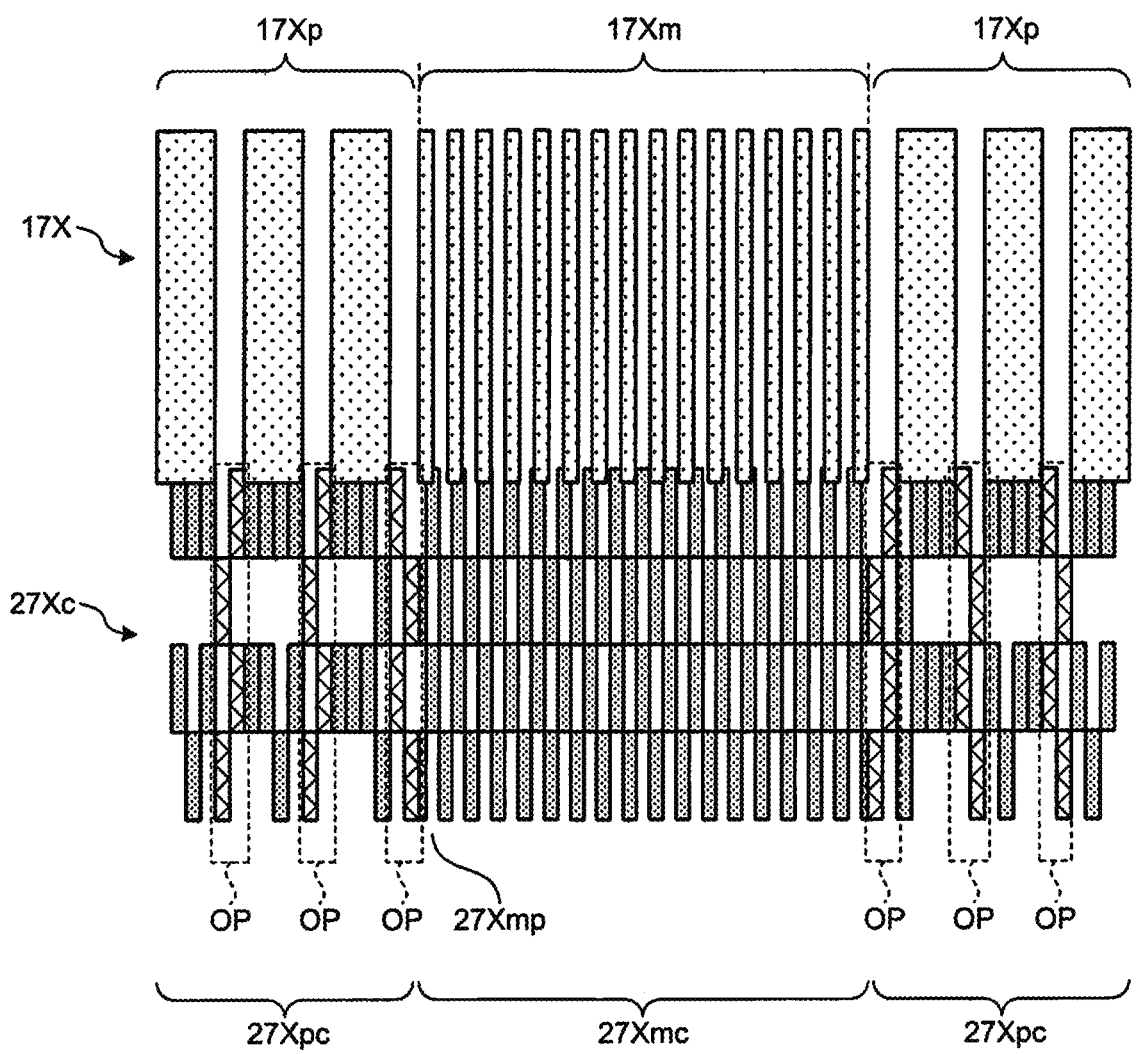
FIG. 22 is a schematic view illustrating an example of configurations of X marks of a template and a wafer constituting an overlay mark according to a third modification of the second embodiment.

Next, X marks 17X and 27Xc of a third modification of the second embodiment will be described with reference to FIG. 22. FIG. 22 is a schematic view illustrating the configuration example of the X marks 17X and 27Xc of a template and a wafer constituting an overlay mark according to the third modification of the second embodiment. In the X mark 27Xc of the third modification, not only the configuration of the boundary portion 27Xmp but also a configuration of a detection portion 27Xpc is different from those of the above-described first modification.

Even in the third modification, the X mark 17X on the template is configured in the same manner as the first modification as illustrated in FIG. 22.

In the third modification, the boundary portion 27Xmp of the X mark 27Xc on the wafer is configured in the same manner as the second modification.

The detection portion 27Xpc of the X mark 27Xc has a configuration in which the detection portion 27Xpa of the X mark 27Xa of the above-described first modification is mirror-inverted in the X direction with reference to the opening of the X mark 17X. That is, the X mark 27Xc differs from the X mark 27Xb of the second modification only in terms of the detection portion 27Xpc.

As a result, brightness and darkness of the detection portion 27Xpc of the X mark 27Xc is observed to be laterally inversed from that of the first and second modifications with respect to the direction of displacement between the template and the wafer in an overlay detection portion configured by overlapping the detection portion 17Xp of the X mark 17X. That is, when the wafer is displaced to the right by ½$P_M$ with respect to the template, the overlay detection portion on the right side is observed as a bright portion.

(Fourth Modification)

Figure 23:
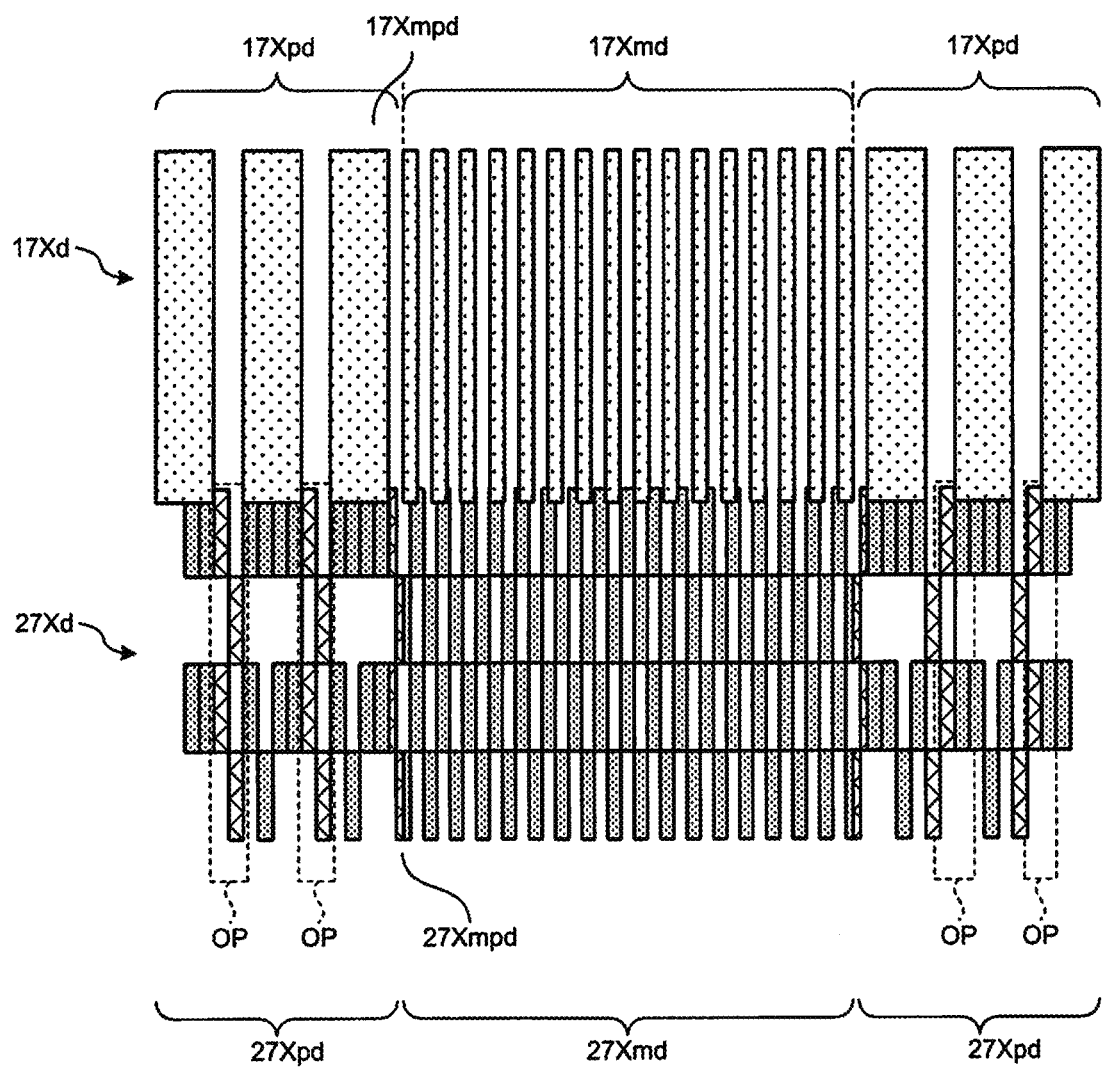
FIG. 23 is a schematic view illustrating an example of configurations of X marks of a template and a wafer constituting an overlay mark according to a fourth modification of the second embodiment.

Next, X marks 17Xd and 27Xd according to a fourth modification of the second embodiment will be described with reference to FIG. 23. FIG. 23 is a schematic view illustrating the configuration example of the X marks 17Xd and 27Xd of a template and a wafer constituting an overlay mark according to the fourth modification of the second embodiment. In the X mark 27Xd of the fourth modification, a configuration of boundary portions 17Xmpd and 27Xmpd is different from that of the above-described first modification.

As illustrated in FIG. 23, the boundary portion 17Xmpd between a moiré portion 17Xmd and a detection portion 17Xpd is configured in the X mark 17Xd such that the detection portion 17Xpd starts from a light-shielding portion of a stripe pattern. As a result, for example, in the case of D≥4, a width of the stripe-shaped light-shielding portion is equal to or more than twice a pitch length of a structural period of the moiré portion 17Xmd, and a pattern of the boundary portion 27Xmpd in the X mark 27Xd on the wafer is shielded. Accordingly, it is easy to identify an overlay mark and the like even if the pitch length of each structural periods of the moiré portion 27Xmd and the detection portion 27Xpd are different in the X mark 27Xd on the wafer. Therefore, a ratio between the pitch length of each structural periods of the moiré portion 27Xmd and the detection portion 27Xpd is not necessarily close to an integer ratio, and can be set to, for example, 1:1.5 in the X mark 27Xd.

EXAMPLES

Next, a case where the alignment mark according to the second embodiment is applied to examples will be described with reference to FIGS. 24 to 44. There are restrictions on the application of the alignment mark to the examples mainly in terms of pattern formation and from the viewpoint of suppressing scattered light.

The restriction in terms of the pattern formation will be described in detail. When a pattern such as an alignment mark is formed on a template, for example, a master template is used to perform imprint processing on the template. When a pattern such as an alignment mark is formed on a wafer, for example, a reticle is used to perform exposure processing on the wafer. When a pattern is formed on the master template and the reticle, for example, high-definition and low-throughput drawing using electron beam is performed. At this time, a drawing pattern is formed in a rectangle in some cases in order to increase the throughput of the drawing as much as possible. Thus, the alignment marks of the template and the wafer are also formed of a combination of fine rectangles.

The restriction of the scattered light will be described in detail. Since the dark-field optical system is used for observation of an alignment mark, scattered light (noise) larger than scattered light (detection light) from the overlay image such as the moiré image may occur at an interruption portion (an end portion of the alignment mark) of a periodic structure. Such noise may occur even when the alignment mark or the like is adjacent to another pattern. Therefore, it is preferable to arrange a blank band having a width of a degree of optical resolution as a noise-canceling pattern (NCP) so as to surround the alignment mark.

Figure 24:
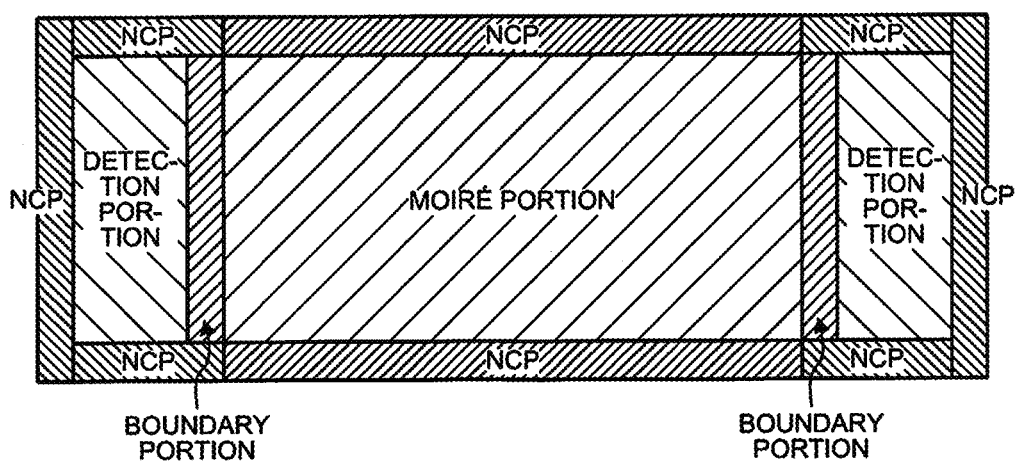
FIG. 24 is a schematic view illustrating an example of a configuration of an alignment mark according to an example.

As illustrated in FIG. 24, when an actual alignment mark is formed, the noise-canceling pattern NCP is arranged around the alignment mark of the above-described second embodiment, for example, as a base, and form a stripe pattern or a check pattern as a pattern having a finer line, block, or dot if necessary.

Example 1

Figure 25:
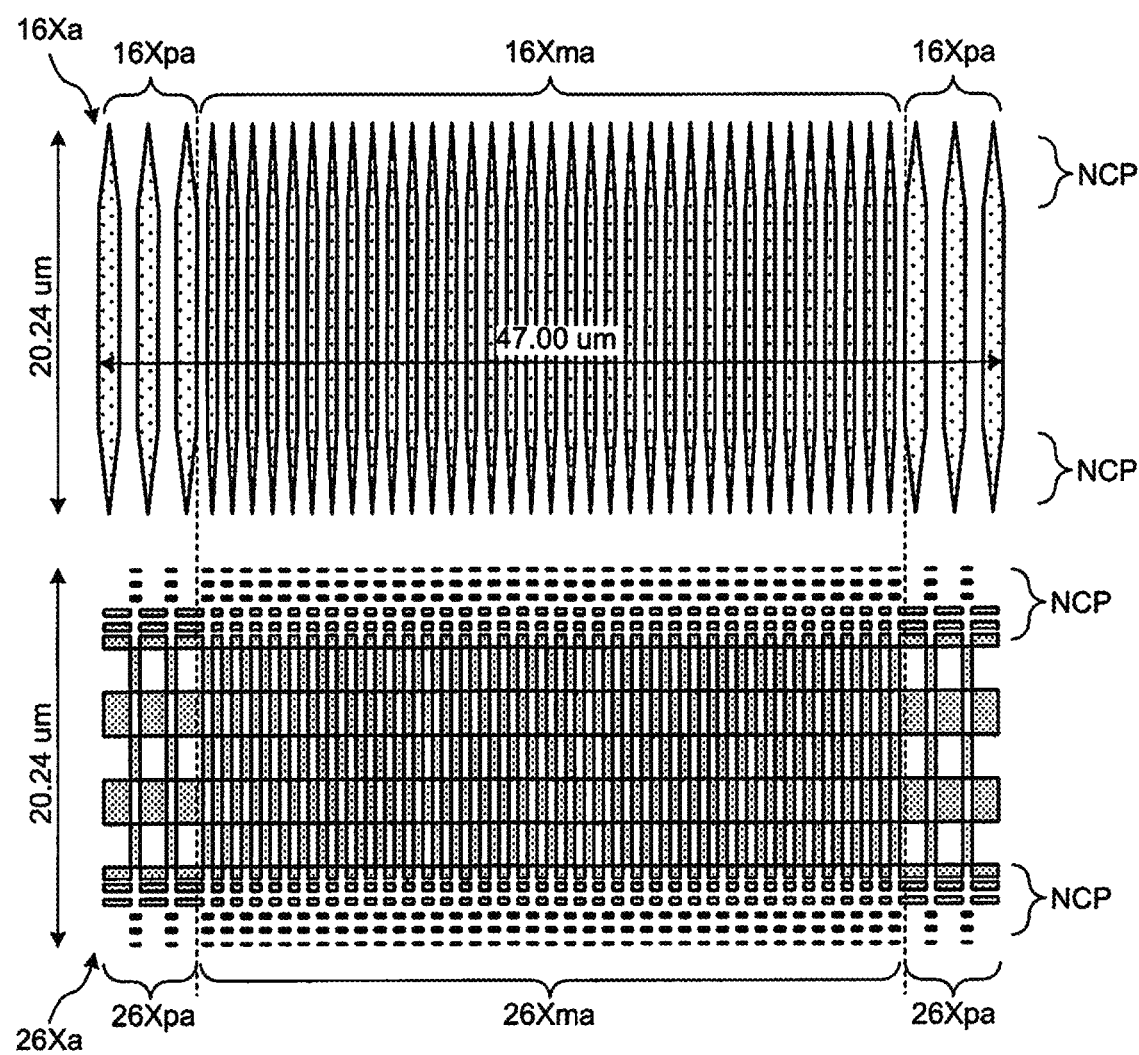
FIG. 25 is a schematic view illustrating an example of configurations of X marks of a template and a wafer according to Example 1.

FIG. 25 illustrates an example in which the X marks 16X and 26X according to the second embodiment are applied to an example. FIG. 25 is a schematic view illustrating examples of configurations of X marks 16Xa and 26Xa of a template and a wafer according to Example 1.

As illustrated in FIG. 25, the X mark 16Xa on the template is configured to have a width of, for example, 47.00 µm in the X direction and a width of, for example, 20.24 µm in the Y direction.

The X mark 16Xa has a stripe pattern having a pitch length of a structural period $P_{M,T}$ of 1050 nm, a period number of 35.24, more specifically, 35 in a light-shielding portion and 36.24 in a light-transmitting portion, in a moiré portion 16Xma. Detection portions 16Xpa on both sides of the moiré portion 16Xma have stripe patterns with a pitch length of a structural period $P_{P,T}$ of 2000 nm. The period number of the moiré portion 16Xma is not an integer since the consistency between the moiré portion 16Xma and the detection portion 16Xpa is obtained in a boundary portion between the moiré portion 16Xma and the detection portion 16Xpa.

In addition, the noise-canceling pattern NCP is added for one period of the pitch length of the structural period in the Y direction of the X mark 26Xa, which will be described later, at both end portions in the Y direction. More specifically, a pattern width is gradually decreased to form a wedge shape at an outer edge portion in the Y direction, thereby reducing an equivalent scattering area.

The X mark 26Xa on the wafer is configured to have a width of, for example, 47.00 µm in the X direction and a width of, for example, 20.24 µm in the Y direction.

The X mark 26Xa has a check pattern having a pitch length of a structural period $P_{M,W}$ in the X direction of 1000 nm and a period number of 37, in a moiré portion 26Xma. Detection portions 26Xpa on both sides of the moiré portion 26Xma have check patterns with a pitch length of each structural periods $P_{P,W}$ in the X direction of 2000 nm.

In addition, a pitch length of a structural period $P_Y$ in the Y direction is 4.5 µm in both of the moiré portion 26Xma and the detection portion 26Xpa, and the noise-canceling patterns NCP are added to both sides in the Y direction for one period of this structural period. More specifically, a width of each rectangle in the Y direction at the outer edge portion in the Y direction is narrowed to reduce an equivalent scattering area.

Figure 26:
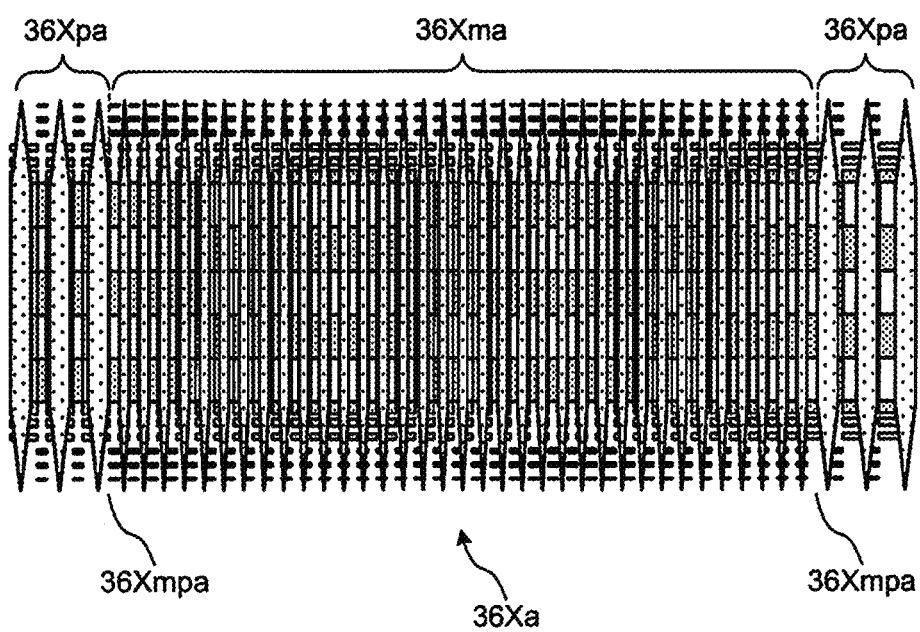
FIG. 26 is a schematic view illustrating an example of a configuration of an overlay mark constituted by the X marks of the template and the wafer according to Example 1.
Figure 27A:
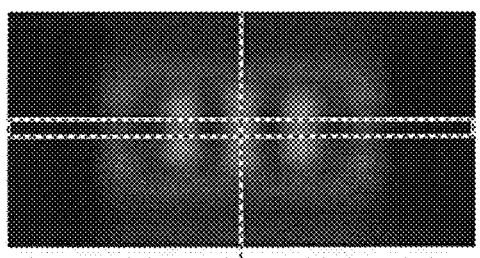
FIGS. 27A to 27D are views illustrating examples of simulation of an image obtained when the overlay mark according to Example 1 is observed.
Figure 27B:
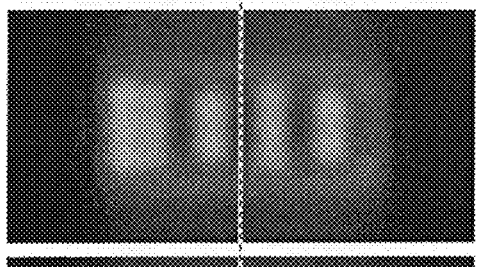
Figure 27C:
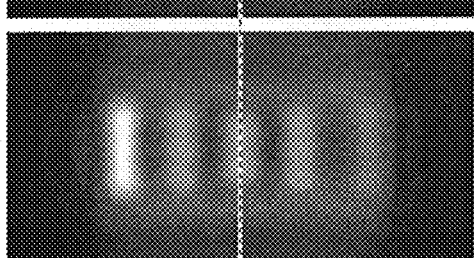
Figure 27D:
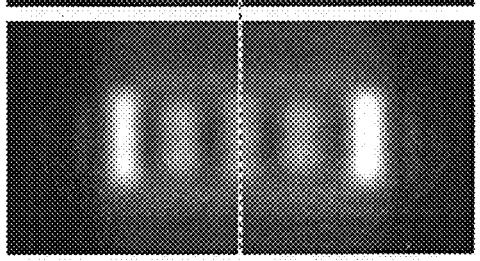

FIG. 26 is a schematic view illustrating an example of a configuration of an overlay mark 36Xa constituted by the X marks 16Xa and 26Xa of the template and the wafer according to Example 1.

FIG. 26 illustrates a state where the X mark 26Xa of the wafer is observed from above the template through the X mark 16Xa of the template with no displacement between the template and the wafer.

In the overlay mark 36Xa configured as the X marks 16Xa and 26Xa overlap each other, a pitch length of a structural period $P_M$ of an overlay moiré portion 36Xma is 1025 nm, and a projection magnification of a displacement amount based on the moiré image is 20.5 times.

It is designed such that the opposite side of the displacement direction of the wafer is observed as a bright portion in an overlay detection portion 36Xpa constituted by the detection portions 16Xpa and 26Xpa.

An overlay boundary portion 36Xmpa is formed at a boundary between the overlay moiré portion 36Xma and the overlay detection portion 36Xpa.

FIGS. 27A to 27D are views illustrating examples of simulation of an image obtained when the overlay mark 36Xa according to Example 1 is observed. FIGS. 27A to 27D illustrate simulation of images obtained when the wafer is displaced by 0 nm, +250 nm, +500 nm, +1000 nm in the X direction with respect to the template.

Figure 28:
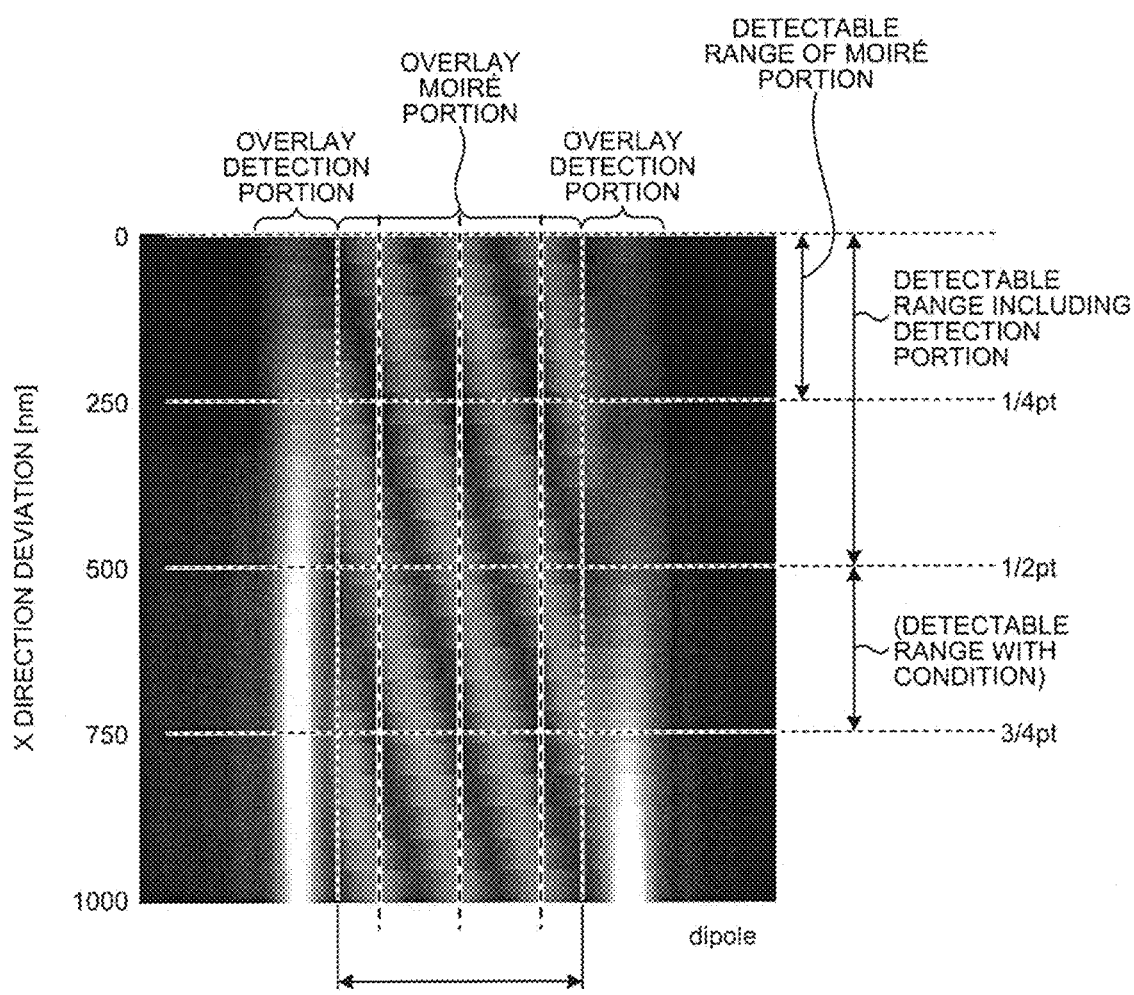
FIG. 28 is a view in which an observation image in an X direction of the overlay mark according to Example 1 is simulated and visualized for each displacement amount.

FIG. 28 is a view in which an observation image in the X direction of the overlay mark 36Xa according to Example 1 is simulated and visualized for each displacement amount.

In the examples of FIGS. 27A to 27D, and 28, a dipole illumination in the ±Y direction is used as a light source. The noise-canceling pattern NCP is arranged at both the end portions in the Y direction of the X marks 16Xa and 26Xa, and can correspond to the dipole illumination in the ±Y direction.

In the moiré portions 16Xma and 26Xma of the X marks 16Xa and 26Xa, it is difficult to distinguish the displacement by +250 nm and the displacement by −250 nm from the overlay moiré portion 36Xa. Therefore, the displacement that can be detected falls within the range of −250 nm to +250 nm, that is, −¼P to +¼P.

As illustrated in FIGS. 27A to 27D, and 28, a signal from the overlay detection portion 36Xpa on the opposite side of the displacement direction of the wafer changes due to the detection portions 16Xpa and 26Xpa attached to the moiré portions 16Xma and 26Xma, whereby it is understood that the displacement amount can be detected clearly and distinguishably at least in the range of −500 nm to +500 nm, that is, −½P to +½P.

In addition, a signal from the overlay detection portion 36Xpa on the same side in the displacement direction of the wafer also starts to change in the displacement amount out of the range of −½P to +½P. At this time, there is a difference in brightness between the left and right detection portions within the range of −750 nm to +750 nm, that is, −¾P to +¾P. Thus, if an image can be acquired in a state where the S/N ratio is sufficiently high, it is possible to distinguish the displacement direction.

Accordingly, these X marks 16Xa and 26Xa can project displacement in the X direction as a moiré fringe moving in the X direction, and can detect the displacement between the template and the wafer at least in the range of −500 nm to +500 nm, that is, −½P to +½P, and further in the range of −750 nm to +750 nm, that is, −¾P to +¾P under a predetermined condition.

Example 2

Figure 29:
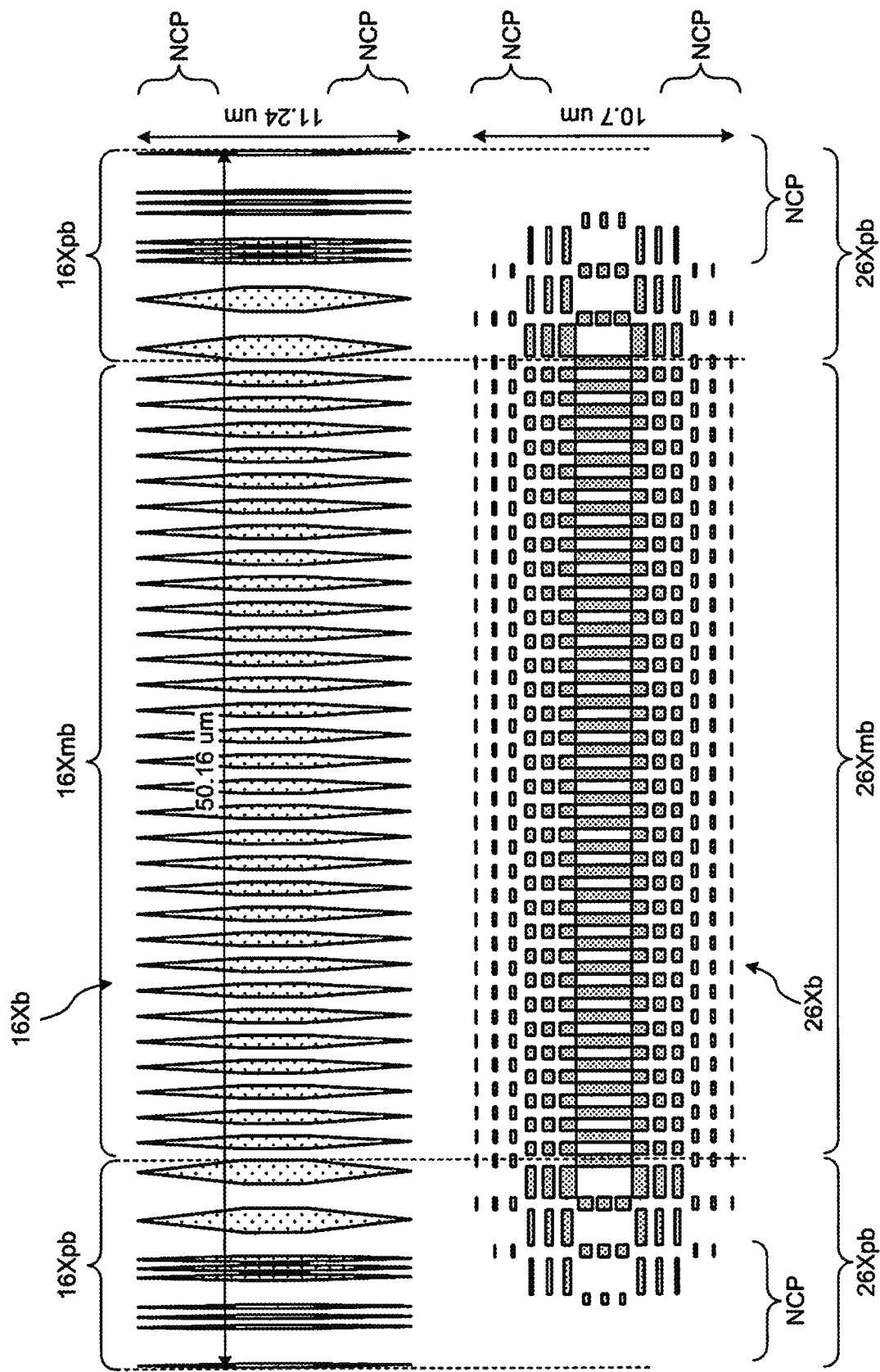
FIG. 29 is a schematic view illustrating an example of configurations of X marks of a template and a wafer according to Example 2.

FIG. 29 illustrates another example in which the X marks 16X and 26X according to the second embodiment are applied to an example. FIG. 29 is a schematic view illustrating examples of configurations of X marks 16Xb and 26Xb of a template and a wafer according to Example 2.

As illustrated in FIG. 29, the X mark 16Xb on the template is configured to have a width of, for example, 50.16 μm in the X direction and a width of, for example, 11.24 μm in the Y direction.

The X mark 16Xb has a stripe pattern having a pitch length of a structural period $P_{M,T}$ of 1050 nm in a moiré portion 16Xmb. Detection portions 16Xpb on both sides of the moiré portion 16Xmb have stripe patterns with a pitch length of a structural period $P_{P,T}$ of 2000 nm.

In addition, the noise-canceling pattern NCP is added at both end portions in the X direction and both end portions in the Y direction. More specifically, a pattern width at an outer edge portion in the X direction is narrowed, and further, a pattern width is gradually decreased to form a wedge shape at an outer edge portion in the Y direction, thereby reducing the equivalent scattering area.

The X mark 26Xb on the wafer is configured to have a width of, for example, 10.7 μm in the Y direction. In this manner, the X mark 16Xb on the template side is configured to be slightly larger than the X mark 26Xb on the wafer side since the effect of light scattering is greater on the template side than on the wafer side.

The X mark 26Xb has a check pattern having a pitch length of a structural period $P_{M,W}$ in the X direction of 1000 nm in a moiré portion 26Xmb. Detection portions 26Xpb on both sides of the moiré portion 26Xmb have check patterns with a pitch length of each structural periods $P_{P,W}$ in the X direction of 2000 nm.

In addition, the noise-canceling pattern NCP is added at both end portions in the X direction and both end portions in the Y direction. More specifically, a rectangle forming the check pattern is divided in the Y direction, and a width of each rectangle in the Y direction at outer edge portions in the X direction and the Y direction is narrowed, thereby reducing the equivalent scattering area.

Figure 30:
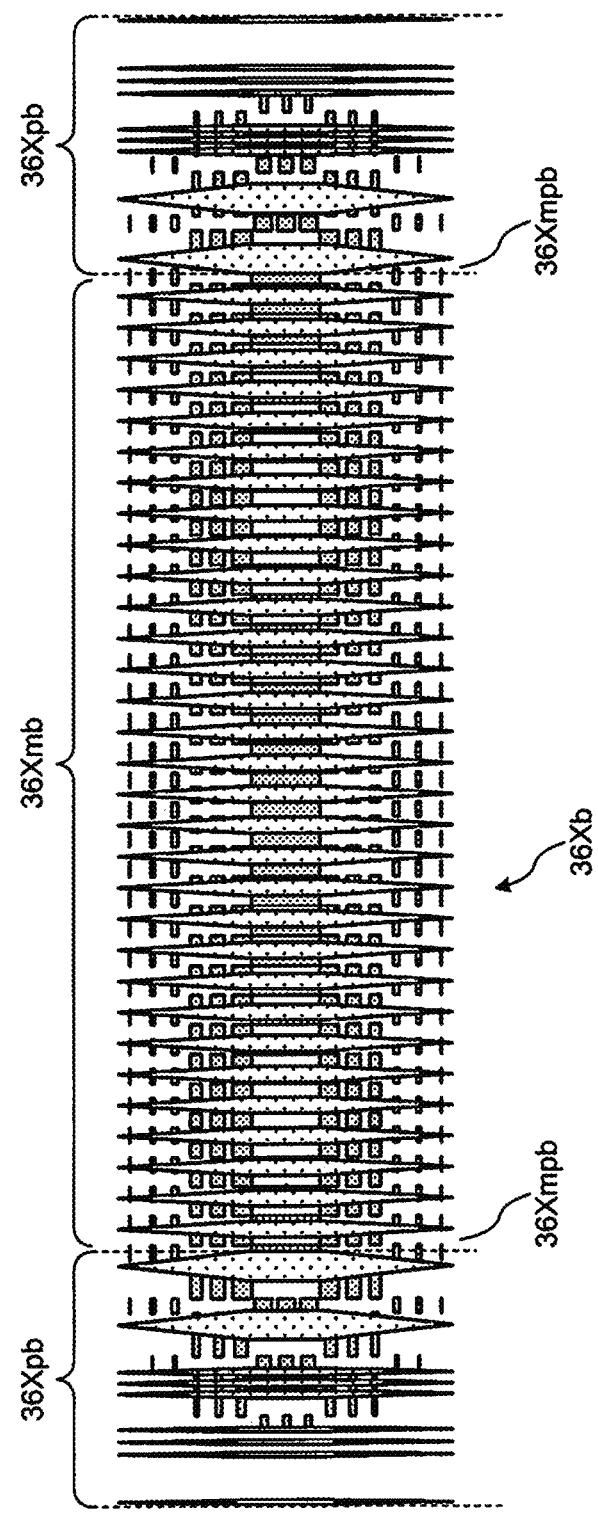
FIG. 30 is a schematic view illustrating an example of a configuration of an overlay mark constituted by the X marks of the template and the wafer according to Example 2.
Figure 31A:
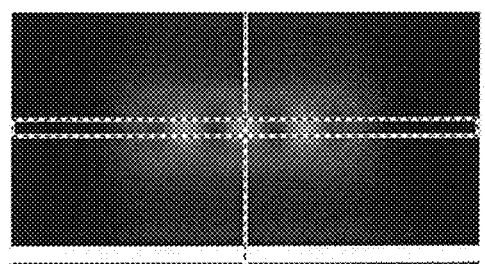
FIGS. 31A to 31D are views illustrating examples of simulation of an image obtained when the overlay mark according to Example 2 is observed.
Figure 31B:
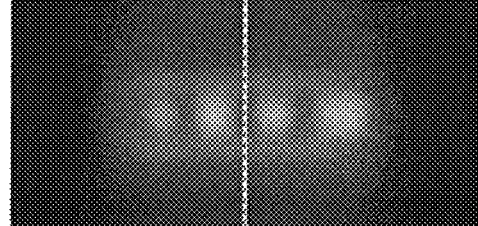
Figure 31C:
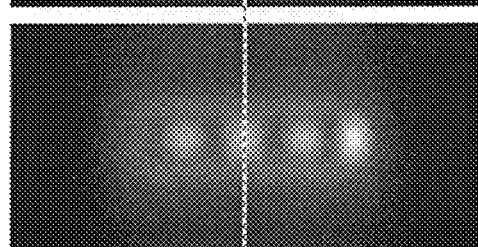
Figure 31D:
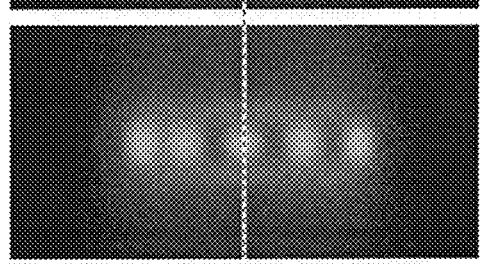

FIG. 30 is a schematic view illustrating an example of a configuration of an overlay mark 36Xb constituted by the X mark 16Xb and 26Xb of the template and the wafer according to Example 2.

FIG. 30 illustrates a state where the X mark 26Xb of the wafer is observed from above the template through the X mark 16Xb of the template with no displacement between the template and the wafer.

In the overlay mark 36Xb configured as the X marks 16Xb and 26Xb overlap each other, a pitch length of a structural period $P_M$ of an overlay moiré portion 36Xmb is 1025 nm, and a projection magnification of a displacement amount based on the moiré image is 20.5 times.

It is designed such that the same side in the displacement direction of the wafer is observed as a bright portion in an overlay detection portion 36Xpb constituted by the detection portions 16Xpb and 26Xpb.

An overlay boundary portion 36Xmpb is formed at a boundary between the overlay moiré portion 36Xmb and the overlay detection portion 36Xpb.

FIGS. 31A to 31D are views illustrating examples of simulation of an image obtained when the overlay mark 36Xb according to Example 2 is observed. FIGS. 31A to 31D illustrate simulation of images obtained when the wafer is displaced by 0 nm, +250 nm, +500 nm, +1000 nm in the X direction with respect to the template.

Figure 32:
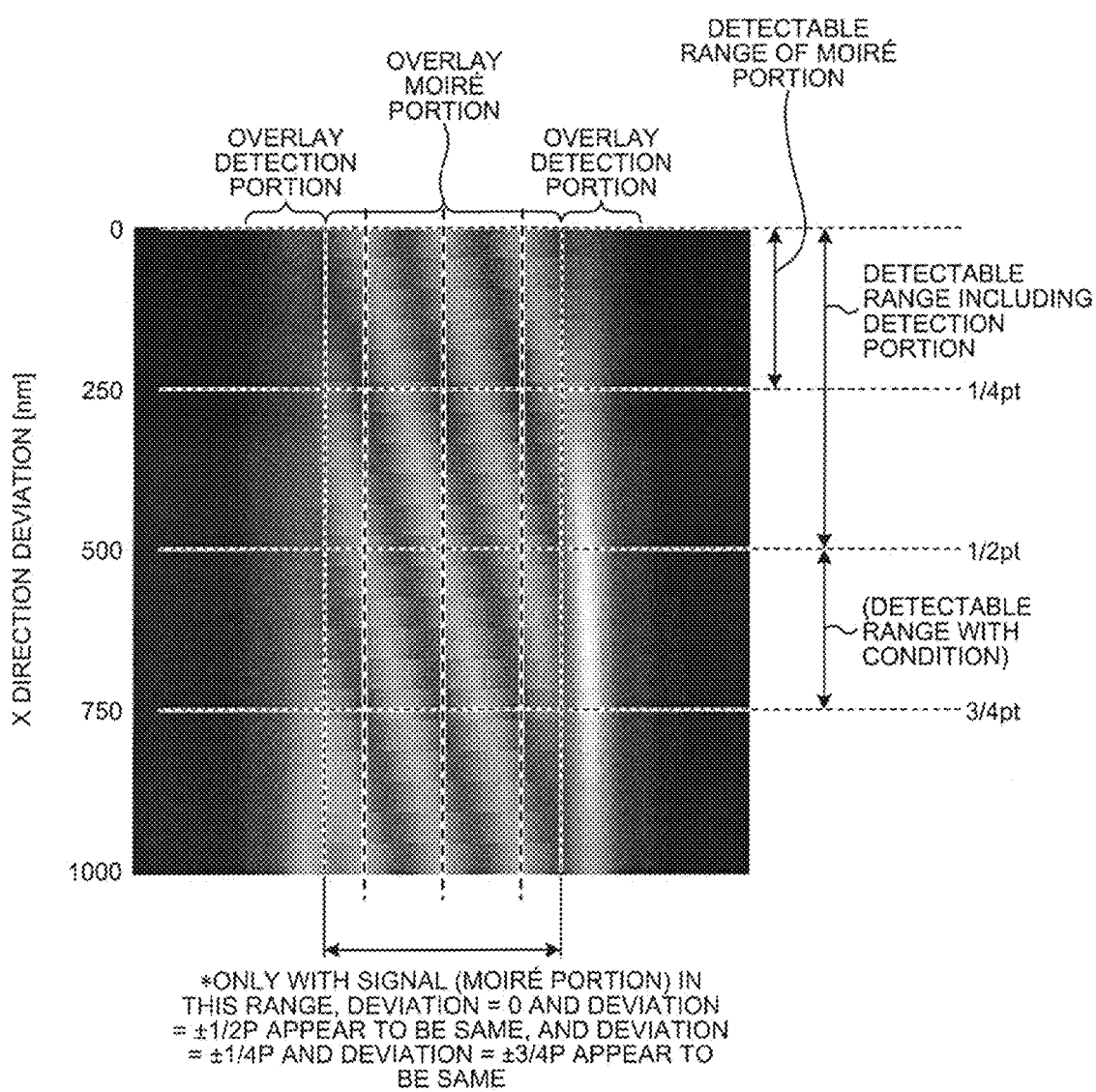
FIG. 32 is a view in which an observation image in an X direction of the overlay mark according to Example 2 is simulated and visualized for each displacement amount.

FIG. 32 is a view in which an observation image in the X direction of the overlay mark 36Xb according to Example 2 is simulated and visualized for each displacement amount.

In the examples of FIGS. 31A to 31D, and 32, a dipole illumination in the ±Y direction is used as a light source. However, the X marks 16Xb and 26Xb respectively have the noise-canceling patterns NCP in both the X direction and the Y direction as described above, and thus, can also function with a quadrupole illumination.

As illustrated in FIGS. 31A to 31D, and 32, the overlay detection portion 36Xpb on the same side as the displacement direction of the wafer is observed as a bright portion in the detection portions 16Xpb and 26Xpb attached to the moiré portions 16Xmb and 26Xmb, which is different from Example 1. Except for this point, the X marks 16Xb and 26Xb of Example 2 have the same functions as the X marks 16Xa and 26Xa of Example 1.

Figure 33:
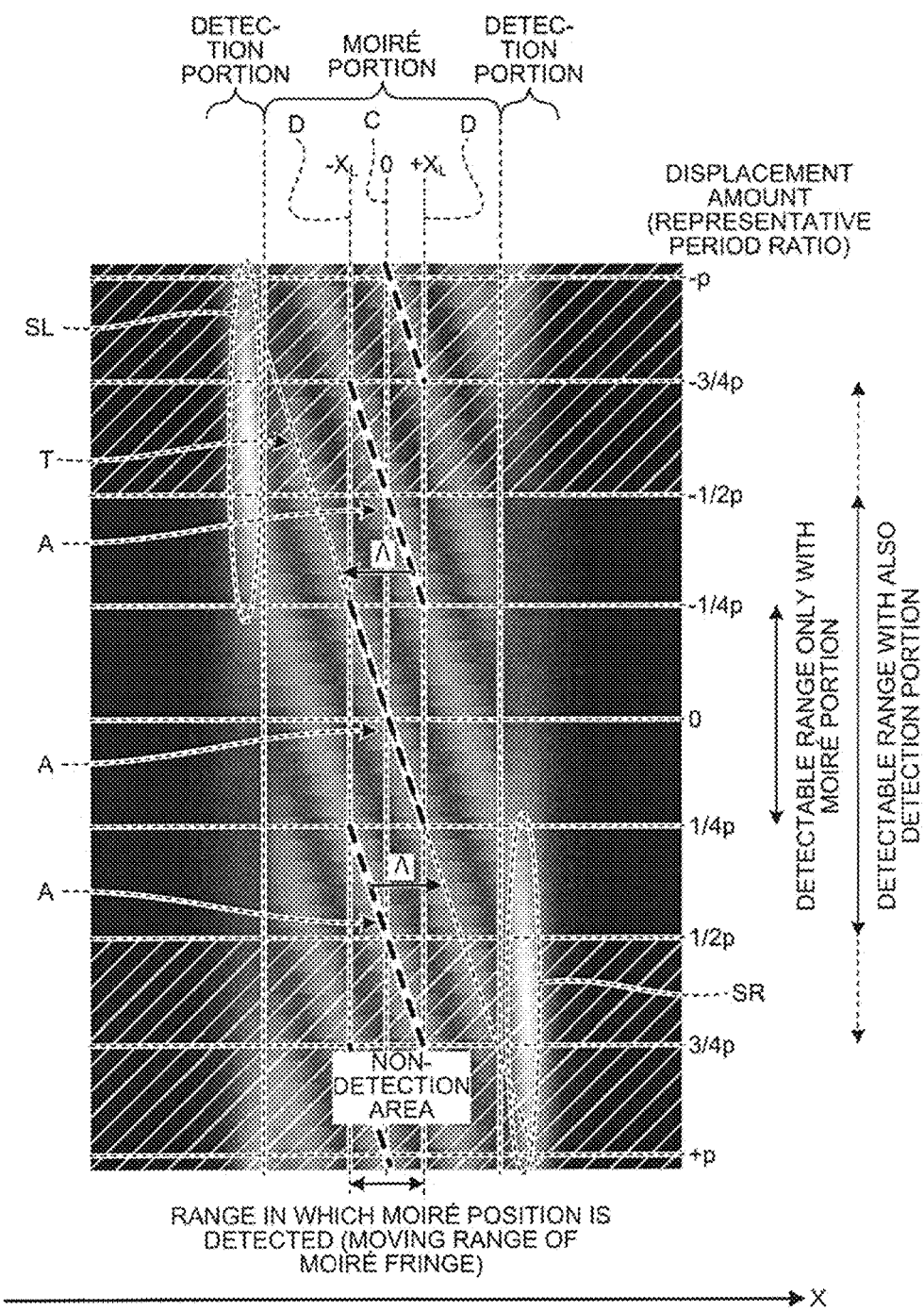
FIG. 33 is a view illustrating a relationship between an alignment signal and a displacement amount acquired in a position detection process using the X mark according to Example 2.

FIG. 33 is a view illustrating a relationship between an alignment signal and a displacement amount acquired in a position detection process using the X marks 16Xb and 26Xb according to Example 2.

In FIG. 33, the displacement amount is normalized using the representative period $P_M$ of the overlay moiré portion 36Xmb. Left and right signals SL and SR in FIG. 33 indicate that the left and right overlay detection portions 36Xpb are observed as bright portions.

A broken line C in FIG. 33 represents a center position of a moving range of a moiré fringe. A broken line D in FIG. 33 represents a range in which a displacement amount is detected using a moiré image, and this range is approximately $\pm X_L$ when $X_L = \frac{1}{4}P_M$. When the displacement amount based on the moiré image is out of this range, a moiré fringe closer to the center is detected.

A broken line A in FIG. 33 represents a displacement amount of a moiré image that is actually detected. A center position of a range of the broken line A can be extracted from a positional relationship of the center of gravity between two moiré marks when the two moiré marks are arranged to detect a differential, and can be known by referring to the position of the broken line C when being detected using a single moiré mark. If position accuracy of the field of view of an alignment scope is sufficiently high, the center position may be determined by coordinates in the field of view of the alignment scope.

A broken line T in FIG. 33 represents a true displacement obtained from a moiré image. If the displacement amount based on the corrected moiré image matches the broken line T, this means that the correct displacement has been detected. Incidentally, a range of the overlay detection portions 36Xpb on both sides of the overlay moiré portion 36Xmb can be known based on a relative position from the center position of the moving range of the moiré fringe or the coordinates in the alignment scope.

Figure 34:
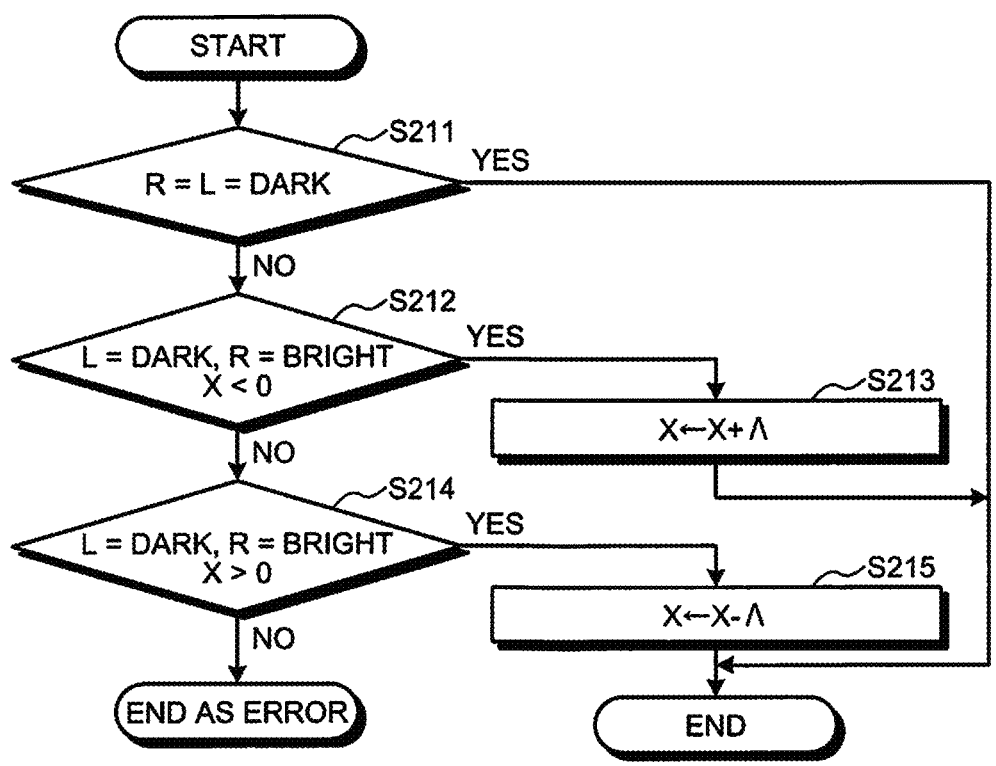
FIG. 34 is a flowchart illustrating an example of a procedure of the position detection process using the X mark according to Example 2.

FIG. 34 is a flowchart illustrating an example of a procedure of the position detection process using the X marks 16Xb and 26Xb according to Example 2.

In FIG. 34, if it is assumed that a displacement amount X based on the moiré image has already been extracted and both the left and right overlay detection portions 36Xpb are observed as dark portions (Step S211: Yes), it is considered that the displacement between the template and the wafer is within the range of ±½ P, and the process ends without correction. If the overlay detection portion 36Xpb on the right side is observed as a bright portion (Step S212: Yes), +Λ is added to the displacement amount X (Step S213) to perform correction. If the overlay detection portion 36Xpb on the left side is observed as a bright portion (Step S214: Yes), −Λ is added to the displacement amount X (Step S215) to perform correction. Then, the process ends. When both the left and right overlay detection portions 36Xpb are observed as bright portions (Steps S211, S212, and S214: No), a displacement amount between the template and the wafer is regarded to deviate from a detectable range, and the process is ended as an error.

However, it is necessary to take caution in setting of a threshold in brightness and darkness of the overlay detection portion 36Xpb. For example, it is assumed that the overlay detection portion 36Xpb is observed as a bright portion if a signal intensity of the overlay detection portion 36Xpb exceeds a signal intensity of the overlay moiré portion 36Xmb.

Here, the displacement amount can be detected in a wider range by further dividing a signal of a bright portion into a strong signal and a weak signal according to the brightness instead of using the signal of the overlay detection portion 36Xpb to simply determine the bright portion or the dark portion.

Figure 35:
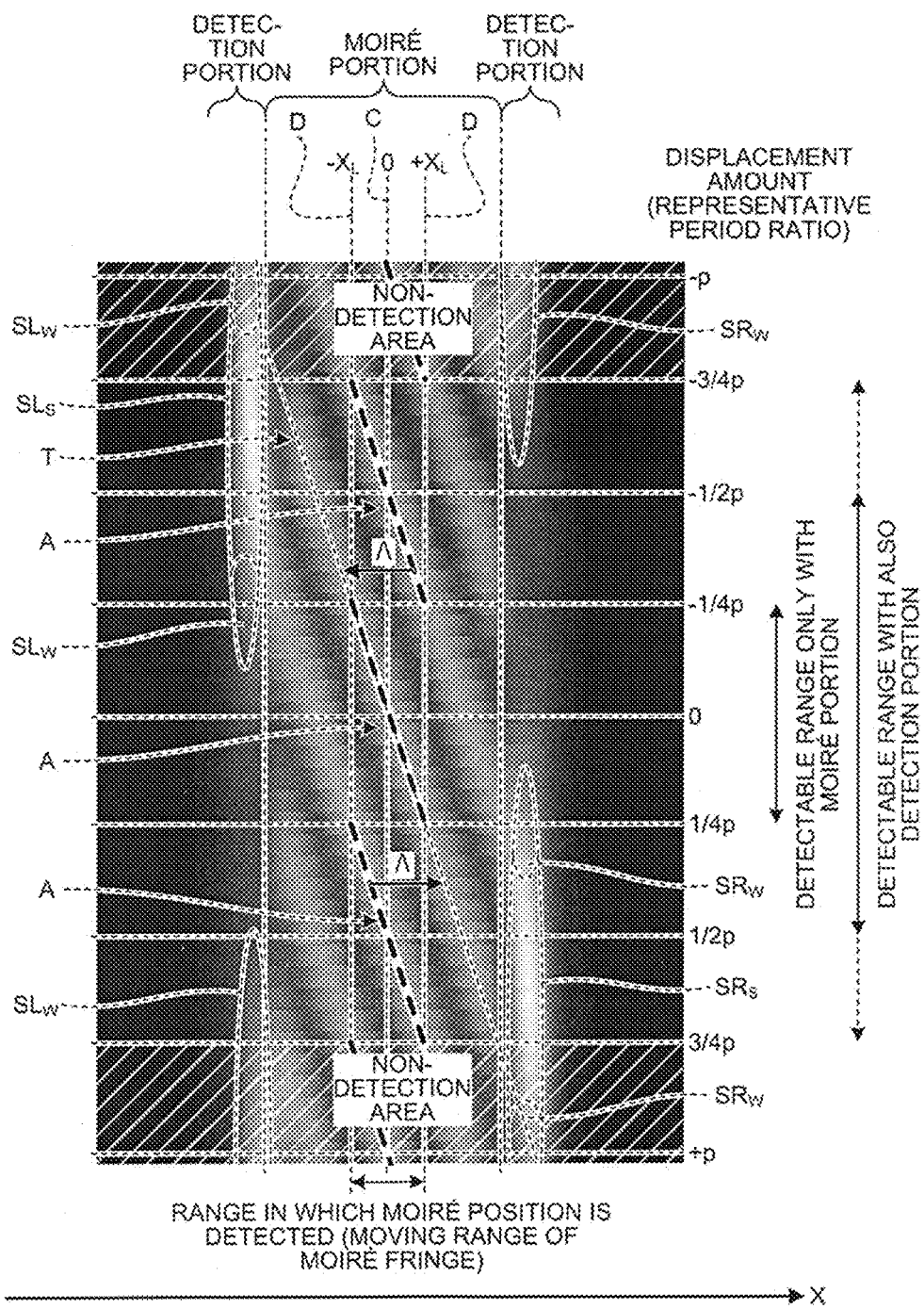
FIG. 35 is a view illustrating another relationship between an alignment signal and a displacement amount acquired in the position detection process using the X mark according to Example 2.

FIG. 35 is a view illustrating another relationship between the alignment signal and the displacement amount acquired in the position detection process using the X marks 16Xb and 26Xb according to Example 2.

Left and right signals SLs and SRs in FIG. 35 indicate that the left and right overlay detection portions 36Xpb are observed as bright portions with a high signal intensity. Left and right signals SLw and SRw in FIG. 35 indicate that the left and right overlay detection portions 36Xpb are observed as bright portions with a low signal intensity.

As illustrated in FIG. 35, one of the left and right overlay detection portions 36Xpb is observed as a dark portion in the range of −½P to +½P, but the brightness thereof gradually increases outside the range of −½P to +½P. That is, the left and right overlay detection portions 36Xpb are observed as the bright portions with the low signal intensity in an area of a transition state between the bright portion and the dark portion. This is distinguished from a normal bright portion, that is, a bright portion with a high signal intensity if necessary.

Figure 36:
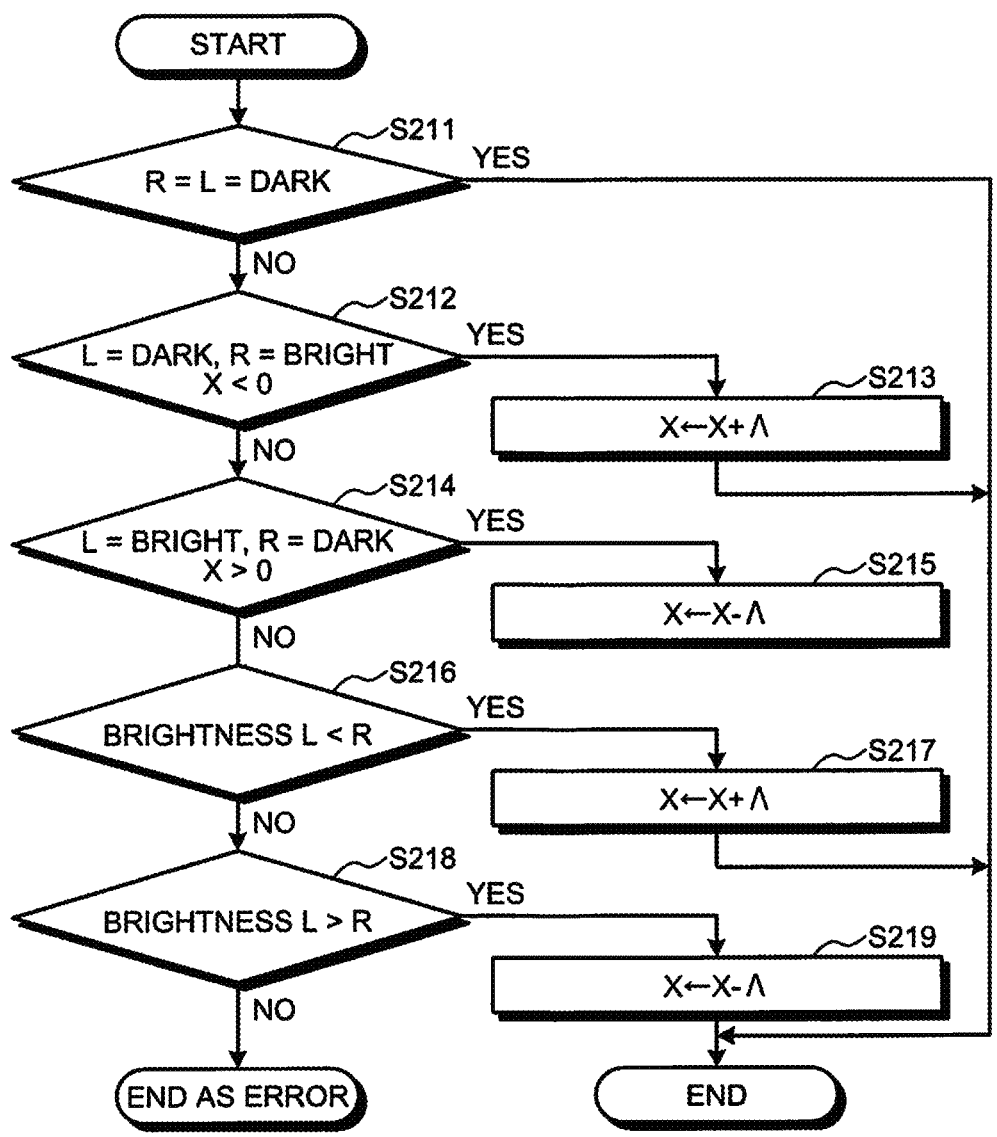
FIG. 36 is a flowchart illustrating another example of the procedure of the position detection process using the X mark according to Example 2.

FIG. 36 is a flowchart illustrating another example of the procedure of the position detection process using the X marks 16Xb and 26Xb according to Example 2.

As illustrated in FIG. 36, Steps S211 to S215 are the same as the flow of FIG. 34 described above. When both the left and right overlay detection portions 36Xpb are observed as bright portions (Steps S211, S212, and S214: No), each brightness, that is, signal intensities of the left and right overlay detection portions 36Xpb are compared. If the signal intensity of the right overlay detection portion 36Xpb is higher than, for example, 50% and higher than the signal intensity of the left overlay detection portion 36Xpb (Step S216: Yes), +Λ is added to the displacement amount X (Step S217) to perform correction. If the signal intensity of the left overlay detection portion 36Xpb is higher than, for example, 50% and higher than the signal intensity of the right overlay detection portion 36Xpb (Step S218: Yes), −Λ is added to the displacement amount X (Step S219) to perform correction. Then, the process ends. If the signal intensities of the left and right overlay detection portions 36Xpb are lower than, for example, 50% (Steps S216 and S218: No), a displacement amount is regarded to deviate from a detectable range, and the process is ended as error.

Incidentally, the states of the left and right overlay detection portion 36Xpb are substantially the same in the vicinity of −P and in the vicinity of +P when the displacement amount is within the range of −1P to +1P, and thus, it is difficult to determine the displacement direction. In the method of FIG. 36, the detectable range of the displacement amount is limited to the range of −¾P to +¾P in order to maintain sufficient accuracy.

Here, a complex processing flow with a large number of conditional branches, such as the flow of FIG. 36 and the like described above, tends to be too complicated. Therefore, a method of simplifying the processing flow by referring to a table is also conceivable.

Figure 37:
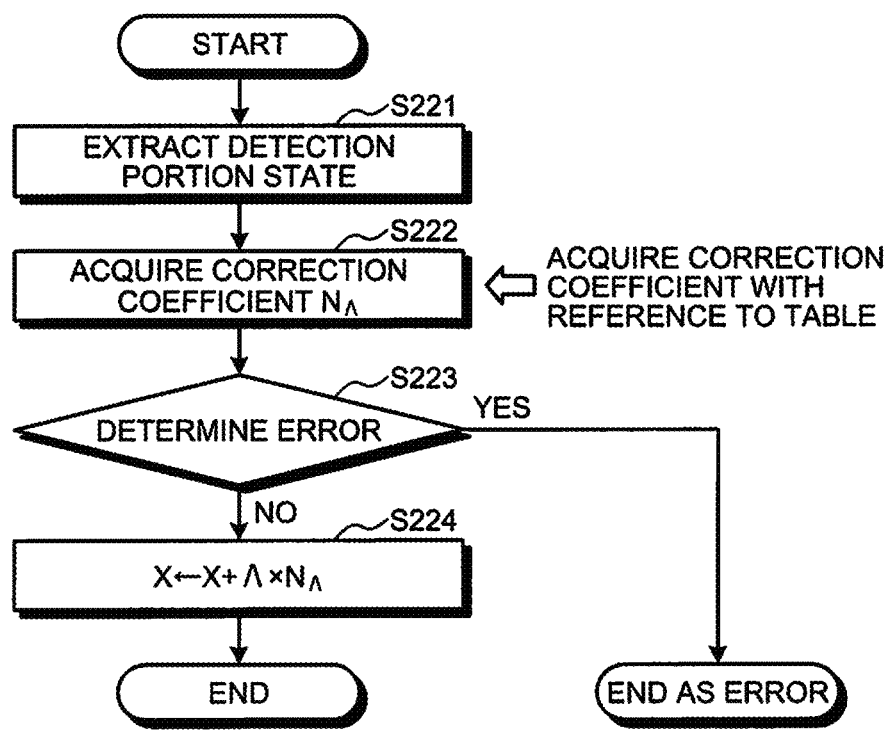
FIG. 37 is a flowchart of an example of the procedure of the position detection process by a table reference method using the X mark according to Example 2.

FIG. 37 is a flowchart of an example of the procedure of the position detection process by a table reference method using the X marks 16Xb and 26Xb according to Example 2.

As illustrated in FIG. 37, states of the left and right overlay detection portions 36Xpb are extracted (Step S221). A correction coefficient $N_A$ is acquired by referring to a table based on a value of the displacement amount X (Step S222). The state of the right overlay detection portion 36Xpb, the state of the left overlay detection portion 36Xpb, and a state of the displacement amount X of a moiré fringe are used as observation values to determine an error (Step S223). If the observation values are not error values (Step S223: No), ($\Lambda \times N_A$) is added to X to perform correction (Step S224), and the process ends. If the observation values are error values (Step S223: Yes), the process is ended as an error.

FIG. 38 is a view illustrating an example of the table used in the position detection process by the table reference method using the X marks 16Xb and 26Xb according to Example 2. In a table of FIG. 38, among the observation values, the state of the right overlay detection portion 36Xpb is "R", the state of the left overlay detection portion 36Xpb is "L", and the state of the displacement amount X of the moiré fringe is "$X_D$".

In the table, 0, 2, or 1 is set if the states "R" and "L" of the left and right overlay detection portions 36Xpb are observed as dark portions, bright portions, or bright portions with a low signal intensity, respectively, as illustrated in FIG. 38. The state "$X_D$" of the displacement amount X of the moiré fringe set to 1 or ±2 if the displacement amount X≈0, for example, |X|<0.2$X_L$ or X≈±$X_L$, for example |X|>0.8$X_L$, respectively. If the displacement amount X is any other value, the state "$X_D$" of the displacement amount X of the moiré fringe is set to −1 when X<0, and the state "$X_D$" of the displacement amount X of the moiré fringe is set to +1 when X>0. The correction coefficient $N_A$ in the right column of the table indicates a value that needs to be corrected, and is normalized by Λ.

When the table is regarded as one function, the correction coefficient $N_A$=f (R, L, $X_D$), the function f has only one solution for each combination of the observation values, that is, a range in which a condition and a range where the number of combinations of the observation values is one or less are correctable, that is, a range in which the displacement amount can be detected, is obtained.

Here, there are a plurality of combinations of the observation values for the same displacement amount X due to the following reasons. For example, when a displacement amount is ¼P, a detected position of a moiré fringe is either +$X_L$ or −$X_L$ due to a slight difference in the displacement amount, and thus, it is necessary to clearly distinguish and correctly correct both the positions. Similarly, even in an area of a transition state where the overlay detection portion 36Xpb turns from a dark portion to a bright portion, that is, in a bright portion with a low signal intensity is low, there is a possibility that a bright portion with a low signal intensity and a bright portion with a high signal intensity or a bright portion with a low signal intensity and a dark portion are erroneously determined one another, and it is necessary to cover both the states.

From the table of FIG. 38, the same set of observation values appears in the vicinity of +P and in the vicinity of −P in the above method so that it is difficult to distinguish both the displacement amounts, but it is understood that there is only one combination of observation values for each of the displacement amounts X in the other range. Even with this point, it is understood that the range of the displacement amount of −¾P to +¾P becomes the detectable range.

Example 3

Figure 39:
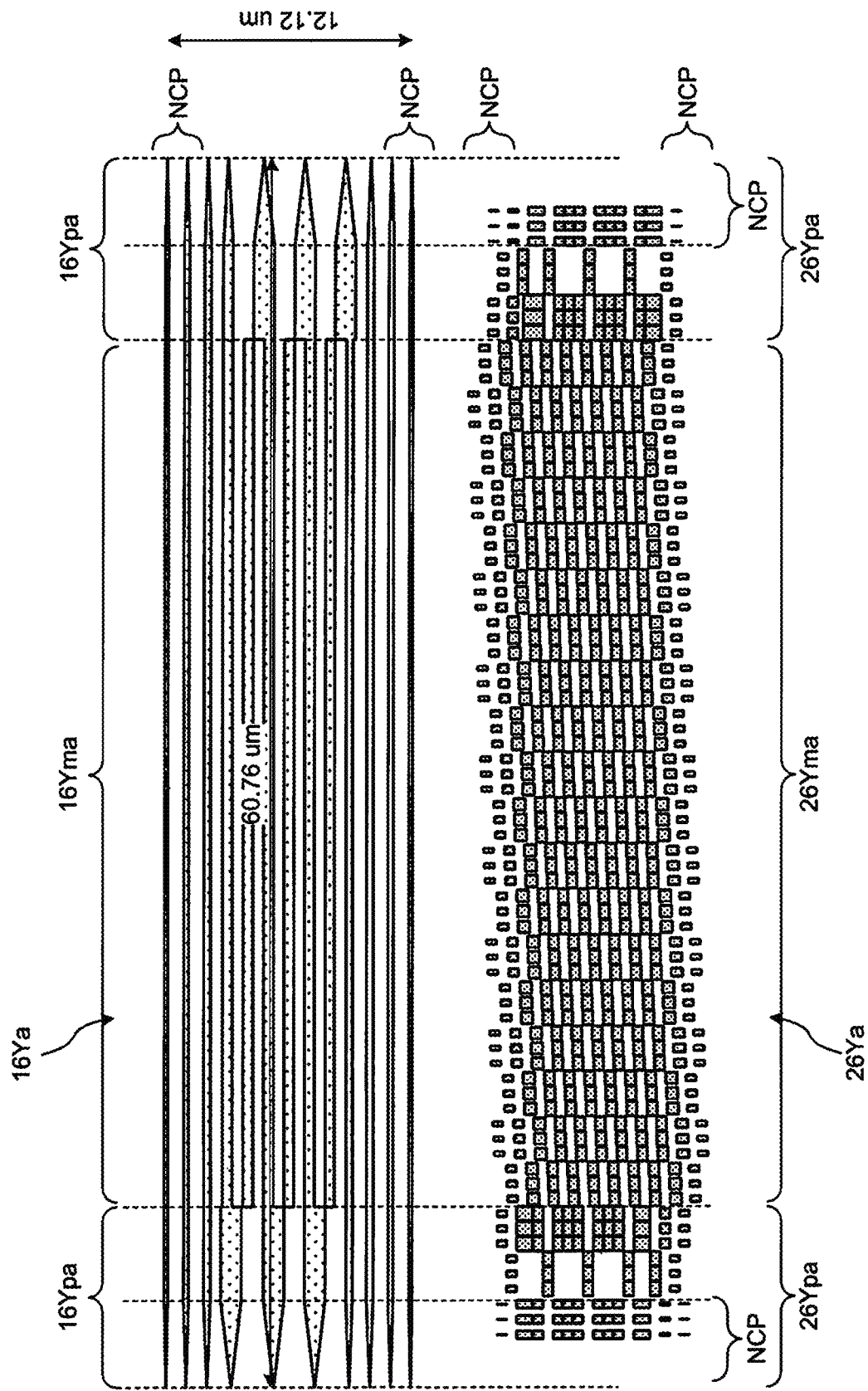
FIG. 39 is a schematic view illustrating an example of configurations of Y marks of a template and a wafer according to Example 3.

FIG. 39 illustrates an example in which the Y marks 16Y and 26Y according to the second embodiment are applied to an example. FIG. 39 is a schematic view illustrating an example of configurations of Y marks 16Ya and 26Ya of a template and a wafer according to Example 3.

As illustrated in FIG. 39, the Y mark 16Ya on the template is configured to have a width of, for example, 60.76 μm in the X direction and a width of, for example, 12.12 μm in the Y direction.

The Y mark 16Ya has a stripe pattern extending in the X direction with a pitch length of a structural period $P_{M,T}$ of 1000 nm in a moiré portion 16Yma. Detection portions 16Ypa on both sides of the moiré portion 16Yma have stripe patterns with a pitch length of a structural period $P_{P,T}$ of 2000 nm.

In addition, the noise-canceling pattern NCP is added at both end portions in the X direction and the Y direction. More specifically, a pattern width is gradually decreased to form a wedge shape at an outer edge portion in the X direction, and further, a pattern width is gradually decreased to form a wedge shape at an outer edge portion in the Y direction, thereby reducing the equivalent scattering area.

The Y mark 26Ya on the wafer has a check pattern having a pitch length of structural period $P_{M,W}$ in the X direction of 1000 nm and an inclination of 150/4500, in a moiré portion 26Yma. Detection portions 26Ypa on both sides of the moiré portion 26Yma have check patterns with a pitch length of each structural periods $P_{P,W}$ of 2000 nm.

In addition, a pitch length of a structural period $P_X$ in the X direction is 4.5 μm in both the moiré portion 26Yma and the detection portion 26Ypa.

In addition, the noise-canceling pattern NCP is added at both end portions in the X direction and the Y direction. More specifically, a rectangle forming the check pattern is divided in the Y direction, and a width of each rectangle in the Y direction at outer edge portions in the X direction and the Y direction is narrowed, thereby reducing the equivalent scattering area. In the detection portion 26Ypa, a width in the X direction including the noise-canceling pattern NCP corresponds to two periods of the pitch length of the structural period $P_X$.

Figure 40:
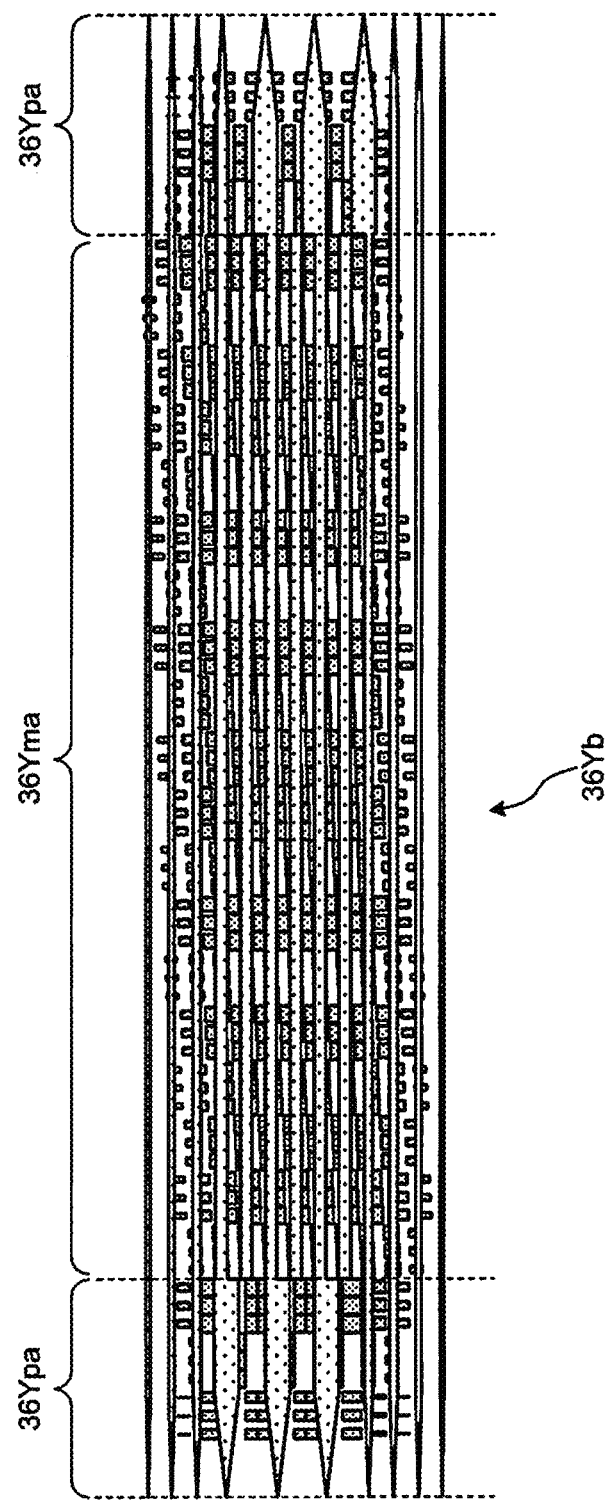
FIG. 40 is a schematic view illustrating an example of a configuration of an overlay mark constituted by the Y marks of the template and the wafer according to Example 3.
Figure 41A:
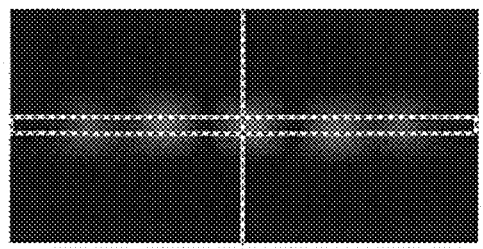
FIGS. 41A to 41D are views illustrating examples of simulation of an image obtained when the overlay mark according to Example 3 is observed.
Figure 41B:
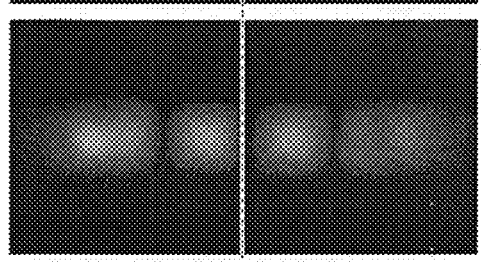
Figure 41C:
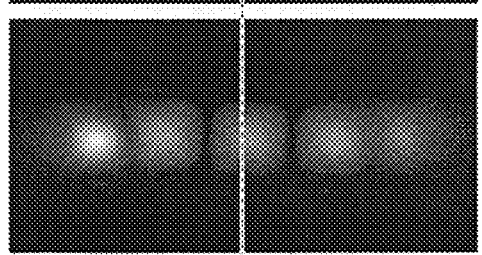
Figure 41D:
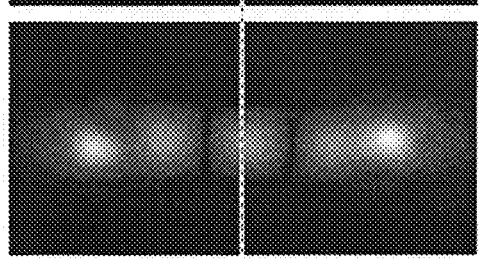

FIG. 40 is a schematic view illustrating an example of a configuration of an overlay mark 36Ya constituted by the Y marks 16Ya and 26Ya of the template and the wafer according to Example 3.

FIG. 40 illustrates a state where the Y mark 26Ya of the wafer is observed from above the template through the Y mark 16Ya of the template with no displacement between the template and the wafer.

In the overlay mark 36Ya configured as the Y marks 16Ya and 26Ya overlap each other, a projection magnification of a displacement amount based on the moiré image of the overlay moiré portion 36Yma is 30 times.

The overlay detection portion 36Ypa constituted by the detection portions 16Ypa and 26Ypa is designed such that the −X side is observed as a bright portion when the wafer is displaced in the +Y direction with respect to the template and the +X side is observed as a bright portion when the wafer is displaced in the −Y direction.

FIGS. 41A to 41D are views illustrating examples of simulation of an image obtained when the overlay mark 36Ya according to Example 3 is observed. FIGS. 41A to 41D illustrate simulation of images obtained when the wafer is displaced by 0 nm, +250 nm, +500 nm, +1000 nm in the Y direction with respect to the template.

Figure 42:
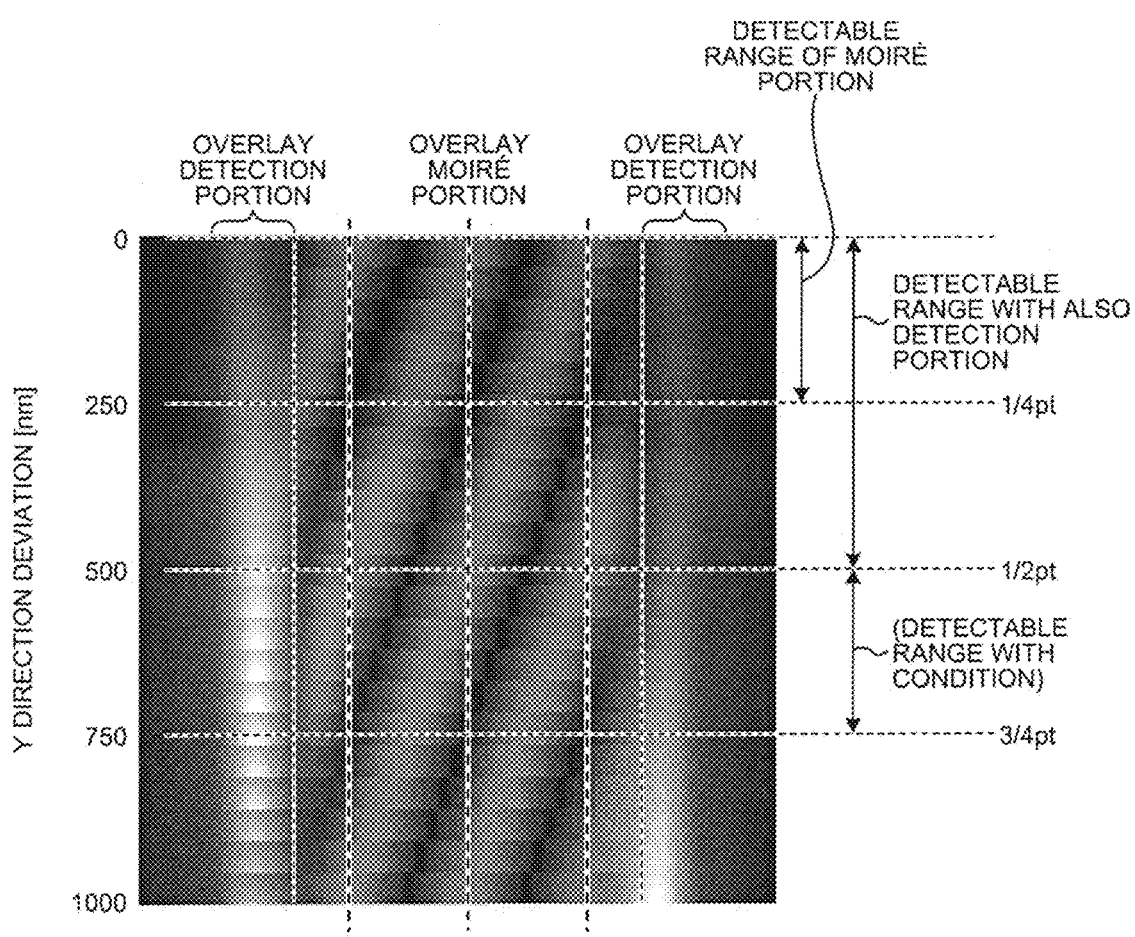
FIG. 42 is a view in which an observation image in an X direction of the overlay mark according to Example 3 is simulated and visualized for each displacement amount.

FIG. 42 is a view in which an observation image in the X direction of the overlay mark 36Ya according to Example 3 is simulated and visualized for each displacement amount.

In the examples of FIGS. 41A to 41D, and 42, a dipole illumination in the ±Y direction is used as a light source. However, the X marks 16Ya and 26Ya respectively have the noise-canceling patterns NCP in both the X direction and the Y direction as described above, and thus, can also function with a quadrupole illumination.

As illustrated in FIGS. 41A to 41D, and 42, a signal from the overlay detection portion 36Ypa on the opposite side of the displacement direction of the wafer changes in the detection portions 16Ypa and 26Ypa attached to the moiré portions 16Yma and 26Yma, whereby it is understood that the displacement amount can be detected clearly and distinguishably at least in the range of −500 nm to +500 nm, that is, −½P to +½P.

In addition, a signal from the overlay detection portion 36Ypa on the same side in the displacement direction of the wafer also starts to change in the displacement amount out of the range of −½P to +½P. At this time, there is a difference in brightness between the left and right detection portions in the range of −750 nm to +750 nm, that is, −¾P to +¾P. Thus, if an image can be acquired in a state where the S/N ratio is sufficiently high, it is possible to distinguish the displacement direction.

Accordingly, these Y marks 16Ya and 26Ya can project displacement in the Y direction as a moiré fringe moving in the X direction, and can detect the displacement between the template and the wafer at least in the range of −500 nm to +500 nm, that is, −½P to +½P, and further in the range of −750 nm to +750 nm, that is, −¾P to +¾P under a predetermined condition.

Example 4

In Example 4, an example in which the X marks 17X and 27Xb according to the second modification of the second embodiment are applied to an example will be considered.

Figure 43:
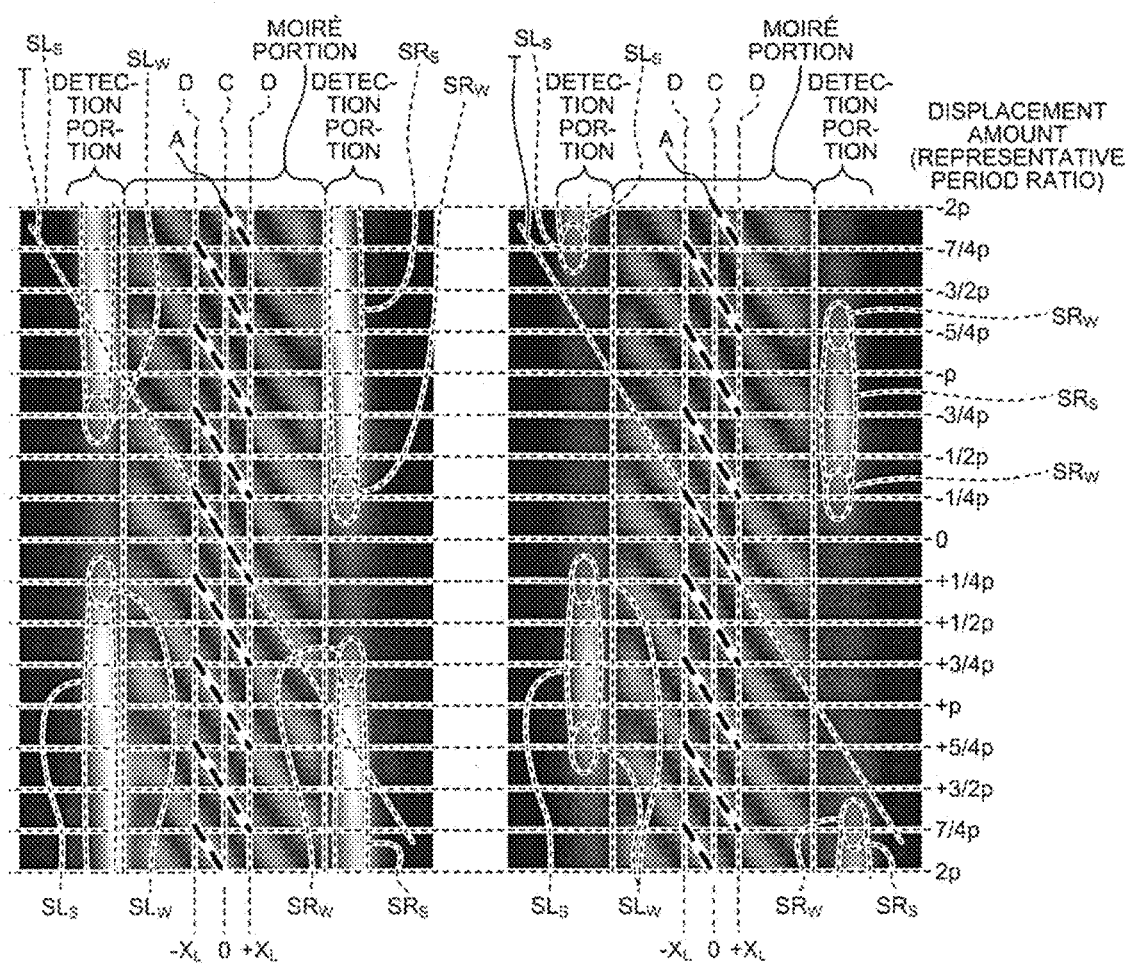
FIG. 43 is a view illustrating a relationship between an alignment signal and a displacement amount acquired in a position detection process using an X mark according to Example 4.

FIG. 43 is a view illustrating a relationship between an alignment signal and a displacement amount acquired in a position detection process using the X mark according to Example 4. In FIG. 43, (a) is an alignment signal acquired from a portion where a detection portion on a wafer side is configured with stripe:check=4:2, and (b) is an alignment signal acquired from a portion where the detection portion on the wafer side is configured with stripe:check=2:4.

Observation values in such a configuration are a state of a right overlay detection portion having stripe:check=4:2, a state of a right overlay detection portion having stripe:check=2:4, a state of a left overlay detection portion having stripe:check=4:2, a state of a left overlay detection portion having stripe:check=2:4, and a state of a displacement amount of a moiré fringe.

Even in such a configuration, it is possible to perform a position detection process by a table reference method using the flow illustrated in FIG. 37 described above. A table used at this time is illustrated in FIG. 44.

FIG. 44 is a view illustrating an example of the table used in the position detection process by the table reference method using the X mark according to Example 4. In the table of FIG. 44, among the observation values, the state of the right overlay detection portion having stripe:check=4:2 is set to "RA", the state of the right overlay detection portion having stripe:check=2:4 is set to "RB", the state of the left overlay detection portion having stripe:check=4:2 is set to "LA", the state of the left overlay detection portion having stripe:check=2:4 is set to "LB", and the state of the displacement amount of the moiré fringe is set to "$X_D$".

The table of FIG. 44 is created based on the same rule as the table of FIG. 38 described above except that a range of the displacement amount X is −2 P to +2 P and that there are four types of the overlay detection portions in combination of left and right and stripe/check ratios.

Similarly to the above, when the table is regarded as one function, the correction coefficient $N_A$=f (RA, RB, LA, LB, $X_D$), the function f has only one solution for each combination of the observation values, that is, a range in which a condition and a range where the number of combinations of the observation values is one or less are correctable, that is, a range in which the displacement amount can be detected, is obtained.

As illustrated in FIG. 44, the combinations of the observation values are equal to each other in ranges of column (a) and column (c), and column (b) and column (d), and thus, it is difficult to correctly correct the displacement amount of the moiré fringe if the displacement amount X corresponds to a value thereof.

On the other hand, it is understood that the same set of observation values does not exist between −P and +P, and at least the displacement amount X in the range of −P to +P is detectable. Furthermore, if the range of column (a) and column (d) is set as a non-detection area, only one set of observation values is obtained even in the range of the columns (b) and (c) so that it becomes possible to correctly correct the displacement amount of the moiré fringe.

Therefore, the displacement amount can be detected in the range of −3⁄2P<X<+3⁄2P according to this configuration. However, there is a risk that −3⁄2P is erroneously determined as +3⁄2P, or −3⁄2P is erroneously determined as +3⁄2P in the vicinity of ±3⁄2P (column (e) and column (f)) due to a slight fluctuation such as the influence of noise. Accordingly, the range of −5⁄4P to +5⁄4P can be defined practically as the detectable range.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An alignment mark comprising a set of a first pattern and a second pattern, one of the patterns being provided on a surface of an original, the other of the patterns being provided on a surface of the substrate, wherein
when XY coordinates common to the surface of the original and the surface of the substrate are set and the original and the substrate face each other such that directions of the first pattern and the second pattern coincide with each other with respect to the XY coordinates,
the first pattern includes a first portion and a second portion,
the second pattern includes a third portion and a fourth portion,
the first portion and the third portion partially overlap each other,
the second portion and the fourth portion partially overlap each other,
a pitch length of each structural periods of the first portion and the third portion are within 1.2 times,
a pitch length of each structural periods of the second portion and the fourth portion are equal within 1.2 times,
a duty ratio of each of the first portion and the third portion is 1:1, the duty ratio being a ratio between a light-shielding portion and a light-transmitting portion, and
a duty ratio of the second portion is D:2,
where D is an integer of two or more.

2. The alignment mark according to claim 1, wherein
the pitch length of each structural periods of the first portion and the third portion are not equal and periodic directions of both the first portion and the third portion are along a first direction,
the second portion includes second portions arranged on both sides of the first portion in the periodic direction, and
the fourth portion includes fourth portions arranged on both sides of the third portion in the periodic direction.

3. The alignment mark according to claim 1, wherein
the pitch length of each structural periods of the first portion and the third portion are equal, and at least one of periodic directions of the first portion and the third portion is oblique to a first direction,
the second portion includes second portions arranged on both sides of the first portion in a direction orthogonal to the first direction, and
the fourth portion includes fourth portions arranged on both sides of the third portion in the direction orthogonal to the first direction.

4. The alignment mark according to claim 1, wherein
the duty ratio of the second portion is 2:2, and
a duty ratio of the fourth portion is 3:1.

5. The alignment mark according to claim 1, wherein
the duty ratio of the second portion is 4:2.

6. An imprinting method comprising:
preparing a substrate to which a resist has been dripped or applied;
performing alignment between an original and the substrate using an alignment mark in a state where the original is brought into proximity on the substrate or a state where the original is brought into contact with the resist;

imprinting the pattern of the original onto the resist on the substrate;
curing the resist; and
releasing the original from the resist on the substrate, wherein
the alignment mark includes a set of a first pattern and a second pattern, one of the patterns being provided on a surface of the original, the other of the patterns being provided on a surface of the substrate, and
when XY coordinates common to the surface of the original and the surface of the substrate are set and the original and the substrate face each other such that directions of the first pattern and the second pattern coincide with each other with respect to the XY coordinates,
the first pattern includes a first portion and a second portion,
the second pattern includes a third portion and a fourth portion,
the first portion and the third portion partially overlap each other,
the second portion and the fourth portion partially overlap each other,
a pitch length of each structural periods of the first portion and the third portion are equal within 1.2 times,
a pitch length of each structural periods of the second portion and the fourth portion are equal within 1.2 times,
a duty ratio of each of the first portion and the third portion is 1:1, the duty ratio being a ratio between a light-shielding portion and a light-transmitting portion, and
a duty ratio of the second portion is D:2, where D is an integer of two or more.

7. The imprinting method according to claim 6, wherein in the alignment mark,
the pitch length of each structural periods of the first portion and the third portion are not equal and periodic directions of both the first portion and the third portion are along a first direction,
the second portion includes second portions arranged on both sides of the first portion in the periodic direction, and
the fourth portion includes fourth portions arranged on both sides of the third portion in the periodic direction.

8. The imprinting method according to claim 6, wherein in the alignment mark,
the pitch length of each structural periods of the first portion and the third portion are equal, and at least one of periodic directions of the first portion and the third portion is oblique to a first direction,
the second portion includes second portions arranged on both sides of the first portion in a direction orthogonal to the first direction, and
the fourth portion includes fourth portions arranged on both sides of the third portion in the direction orthogonal to the first direction.

9. The imprinting method according to claim 6, wherein in the alignment mark,
the duty ratio of the second portion is 2:2, and
a duty ratio of the fourth portion is 3:1.

10. The imprinting method according to claim 6, wherein in the alignment mark,
the duty ratio of the second portion is 4:2.

11. A manufacturing method of a semiconductor device, the method comprising:
forming a to-be-processed film on a semiconductor substrate;
dripping or applying a resist onto the to-be-processed film;
performing alignment between an original and the semiconductor substrate using an alignment mark in a state where the original is brought into proximity on the semiconductor substrate or a state where the original is brought into contact with the resist;
transferring a pattern by imprinting the original onto the resist such that the resist and a surface of the original face each other; and
processing the to-be-processed film by using the resist, wherein
the alignment mark includes a set of a first pattern and a second pattern, one of the patterns being provided on a surface of the original, the other of the patterns being provided on a surface of the semiconductor substrate, and
when XY coordinates common to the surface of the original and the surface of the semiconductor substrate are set and the original and the semiconductor substrate face each other such that directions of the first pattern and the second pattern coincide with each other with respect to the XY coordinates,
the first pattern includes a first portion and a second portion,
the second pattern includes a third portion and a fourth portion,
the first portion and the third portion partially overlap each other,
the second portion and the fourth portion partially overlap each other,
a pitch length of each structural periods of the first portion and the third portion are equal within 1.2 times,
a pitch length of each structural periods of the second portion and the fourth portion are equal within 1.2 times,
a duty ratio of each of the first portion and the third portion is 1:1, the duty ratio being a ratio between a light-shielding portion and a light-transmitting portion, and
a duty ratio of the second portion is D:2, where D is an integer of two or more.

12. The manufacturing method of the semiconductor device according to claim 11, wherein
in the alignment mark,
the pitch length of each structural periods of the first portion and the third portion are not equal and periodic directions of both the first portion and the third portion are along a first direction,
the second portion includes second portions arranged on both sides of the first portion in the periodic direction, and
the fourth portion includes fourth portions arranged on both sides of the third portion in the periodic direction.

13. The manufacturing method of the semiconductor device according to claim 11, wherein
in the alignment mark,
the pitch length of each structural periods of the first portion and the third portion are equal, and at least one of periodic directions of the first portion and the third portion is oblique to a first direction, the second portion includes second portions arranged on both sides of the first portion in a direction orthogonal to the first direction, and the fourth portion includes fourth portions arranged on both sides of the third portion in the direction orthogonal to the first direction.

14. The manufacturing method of the semiconductor device according to claim 11, wherein in the alignment mark, the duty ratio of the second portion is 2:2, and a duty ratio of the fourth portion is 3:1.

15. The manufacturing method of the semiconductor device according to claim 11, wherein in the alignment mark, the duty ratio of the second portion is 4:2.

16. An alignment device comprising:

a first stage that holds a substrate having any one of a first pattern and a second pattern of an alignment mark;

a second stage that holds an original for transferring a pattern to a transfer film on the substrate, the original having the other of the first pattern and the second pattern of the alignment mark;

an alignment unit that performs alignment between the substrate and the original; and a control unit that controls the first stage, the second stage, and the alignment unit, wherein the alignment mark includes a set of the first pattern and the second pattern, one of the patterns being provided on a surface of the original, when XY coordinates common to the surface of the original and the surface of the substrate are set and the original and the substrate face each other such that directions of the first pattern and the second pattern coincide with each other with respect to the XY coordinates, the first pattern includes a first portion and a second portion, the second pattern includes a third portion and a fourth portion, the first portion and the third portion partially overlap each other, the second portion and the fourth portion partially overlap each other, a pitch length of each structural periods of the first portion and the third portion are equal within 1.2 times, a pitch length of each structural periods of the second portion and the fourth portion are equal within 1.2 times, a duty ratio of each of the first portion and the third portion is 1:1, the duty ratio being a ratio between a light-shielding portion and a light-transmitting portion, and a duty ratio of the second portion is D:2, and D is an integer of two or more, and the control unit causes the alignment unit to detect signals of the first portion and the third portion, calculates a displacement amount between the first portion and the third portion, causes the alignment unit to detect signals of the second portion and the fourth portion, detects a displacement amount and a displacement direction between the substrate and the original from the second portion and the fourth portion, and corrects a position of at least one of the first stage and the second stage based on the detected displacement amount and the displacement direction between the substrate and the original.

17. The alignment device according to claim 16, wherein in the alignment mark, the pitch length of each structural periods of the first portion and the third portion are not equal and periodic directions of both the first portion and the third portion are along a first direction, the second portion includes second portions arranged on both sides of the first portion in the periodic direction, and the fourth portion includes fourth portions arranged on both sides of the third portion in the periodic direction.

18. The alignment device according to claim 16, wherein in the alignment mark, the pitch length of each structural periods of the first portion and the third portion are equal, and at least one of periodic directions of the first portion and the third portion is oblique to a first direction, the second portion includes second portions arranged on both sides of the first portion in a direction orthogonal to the first direction, and the fourth portion includes fourth portions arranged on both sides of the third portion in the direction orthogonal to the first direction.

19. The alignment device according to claim 16, wherein in the alignment mark, the duty ratio of the second portion is 2:2, and a duty ratio of the fourth portion is 3:1.

20. The alignment device according to claim 16, wherein in the alignment mark, the duty ratio of the second portion is 4:2.

* * * * *